United States Patent [19]
Vinal

[11] Patent Number: 5,151,759
[45] Date of Patent: * Sep. 29, 1992

[54] FERMI THRESHOLD SILICON-ON-INSULATOR FIELD EFFECT TRANSISTOR

[75] Inventor: Albert W. Vinal, Cary, N.C.

[73] Assignee: Thunderbird Technologies, Inc., Research Triangle Park, N.C.

[*] Notice: The portion of the term of this patent subsequent to Feb. 5, 2008 has been disclaimed.

[21] Appl. No.: 646,829

[22] Filed: Jan. 25, 1991

Related U.S. Application Data

[63] Continuation-in-part of Ser. No. 318,153, Mar. 2, 1989, Pat. No. 4,990,974.

[51] Int. Cl.$^5$ .............................................. H01L 29/78
[52] U.S. Cl. ...................................... 357/23.3; 357/4; 357/23.7; 357/23.12; 357/23.14
[58] Field of Search ................. 357/23.3, 23.7, 23.12, 357/23.14, 4

[56] References Cited

U.S. PATENT DOCUMENTS

| | | | |
|---|---|---|---|
| Re. 32,800 | 12/1988 | Han et al. | 437/27 |
| 3,872,491 | 3/1975 | Hanson et al. | 357/23.14 |
| 4,042,945 | 8/1977 | Lin et al. | 357/23.15 |
| 4,108,686 | 8/1978 | Jacobus, Jr. | 148/1.5 |
| 4,274,105 | 6/1981 | Crowder et al. | 357/23.12 |
| 4,697,198 | 9/1987 | Komori et al. | 357/23.3 |
| 4,737,471 | 4/1988 | Shirato et al. | 357/23.3 |
| 4,831,422 | 5/1989 | Ohno | 357/23.3 |
| 4,841,346 | 6/1989 | Noguchi | 357/23.1 |
| 4,899,202 | 2/1990 | Blake et al. | 357/23.7 |
| 4,907,048 | 3/1990 | Huang | 357/23.9 |
| 4,928,156 | 5/1990 | Alvia et al. | 357/23.4 |
| 4,984,043 | 1/1991 | Vinal | 357/23.12 |
| 4,990,974 | 2/1991 | Vinal | 357/23.3 |
| 4,994,872 | 2/1991 | Nishizawa et al. | 357/23.3 |

FOREIGN PATENT DOCUMENTS

| | | | |
|---|---|---|---|
| 0070744 | 1/1983 | European Pat. Off. | 357/23.12 |
| 0073623 | 3/1988 | European Pat. Off. | 357/23.12 |
| 0274278 | 7/1988 | European Pat. Off. | 357/23.3 |
| 56-91473 | 7/1981 | Japan | 357/23.7 |
| 57-10268 | 1/1982 | Japan | 357/23.7 |
| 59-29460 | 2/1984 | Japan | 357/4 |
| 61-160975 | 7/1986 | Japan | 357/23.3 |
| 62-248255 | 10/1987 | Japan | 357/4 |
| 0053975 | 3/1988 | Japan | 357/23.3 |
| 1097139 | 4/1987 | U.S.S.R. | 357/23.12 |

OTHER PUBLICATIONS

IEEE Transactions on Electron Devices, vol. ED-33, No. 3, Mar. 1986, "A New Half-Micrometer p-Channel MOSFET with Efficient Punchthrough Stops" by Odanaka et al, pp. 317-321.

(List continued on next page.)

*Primary Examiner*—Rolf Hille
*Assistant Examiner*—Steven Loke
*Attorney, Agent, or Firm*—Bell, Seltzer, Park & Gibson

[57] ABSTRACT

A Silicon-on-Insulator (SOI) field effect transistor (FET) operates in the enhancement mode without requiring inversion by setting the device's threshold voltage to twice the Fermi potential of the thin semiconductor layer in which the transistor is fabricated. The FET, referred to as a Fermi Threshold SOI FET or Fermi SOI FET, has a threshold voltage which is independent of oxide thickness, channel length, drain voltage and substrate channel doping. The vertical electric field in the substrate channel becomes zero, thereby maximizing carrier mobility, and minimizing hot electron effects. The thin silicon layer in which the devices are formed is sufficiently thick such that the channel is not fully depleted at pinch-off. A high speed device, substantially independent of device dimensions is thereby provided, which may be manufactured using relaxed groundrules, to provide low cost, high yield devices.

Temperature dependence of threshold voltage may also be eliminated by providing a semiconductor gate contact which neutralizes the effect of substrate contact potential. Multiple gate devices may be provided. An accelerator gate, adjacent the drain, may further improve performance.

39 Claims, 27 Drawing Sheets

OTHER PUBLICATIONS

1981 Symposium on VLSI Technology, Hawaii (Sep., 1981), Dig. Tech. Papers, pp. 22-23, "Submicron MOSFET Structure for Minimizing Channel Hot-Electron Injection" by Takeda et al.

International Search Report for International Application No. PCT/US 9001158.

*Characteristics of P-Channel MOS Field Effect Transistors With Ion-Implanted Channels,* Hswe, M. et al., Solid-State Electronics, vol. 15, pp. 1237-1243, 1972.

*The Junction MOS (JMOS) Transistor—A High Speed Transistor for VLSI,* Sun, E. et al., IEEE, pp. 791-794, 1980.

*Optimization of Sub-Micron P-Channel FET Structure,* Chiang, S. et al., IEEE, pp. 534-535, 1983.

*Gate Material Work Function Considerations for 0.5 Micron CMOS,* Hillenius, S. J. et al., IEEE, pp. 147-150, 1985.

*A Normally-Off Type Buried Channel MOSFET for VLSI Circuits;* By K. Nishiuchi et al. (IEDM Technical Digest, 1979, pp. 26-29).

*Ultra-High Speed CMOS Circuits in Thin SIMOX Films,* A. Kamgar et al., IEDM vol. 89, pp. 829-832, 1989.

*Fabrication of CMOS on Ultrathin SOI Obtained by Epitaxial Lateral Overgrowth and Chemical-Mechanical Polishing,* G. Shahidi, IEDM vol. 90, pp. 587-590, 1990.

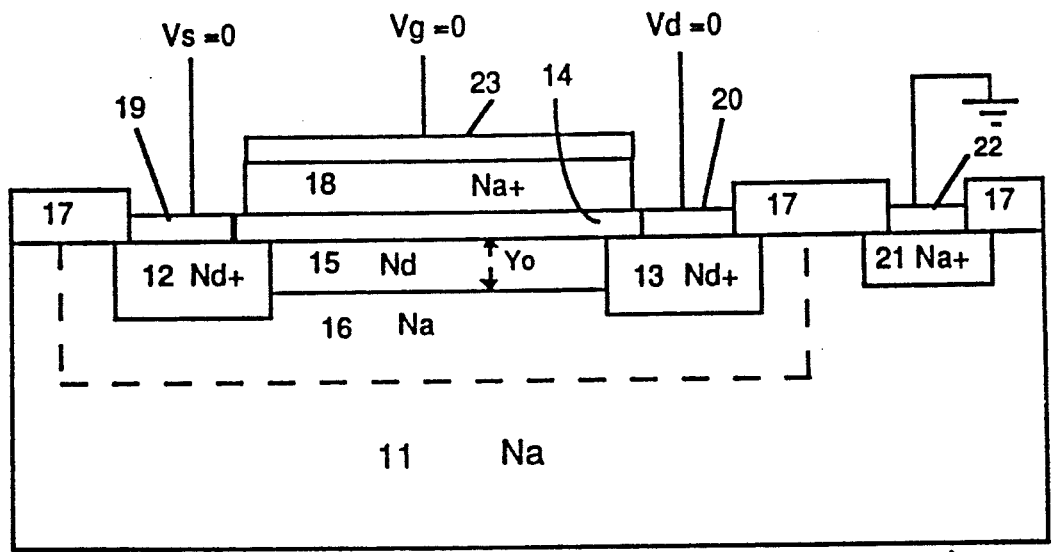
Figure 1A    Empty Channel Condition
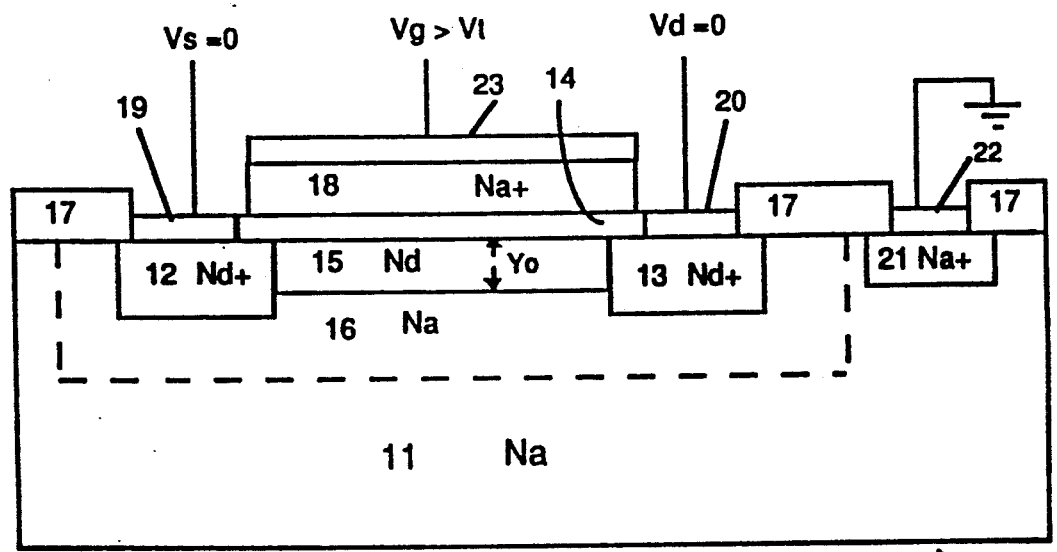
Figure 1B    Half Full Channel Condition

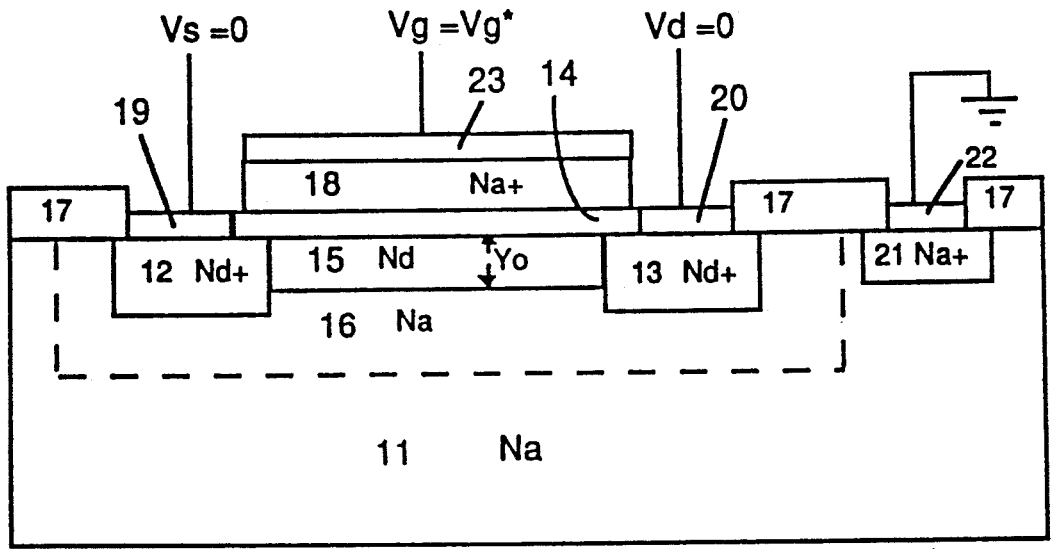
Figure 1C   Full Channel Condition
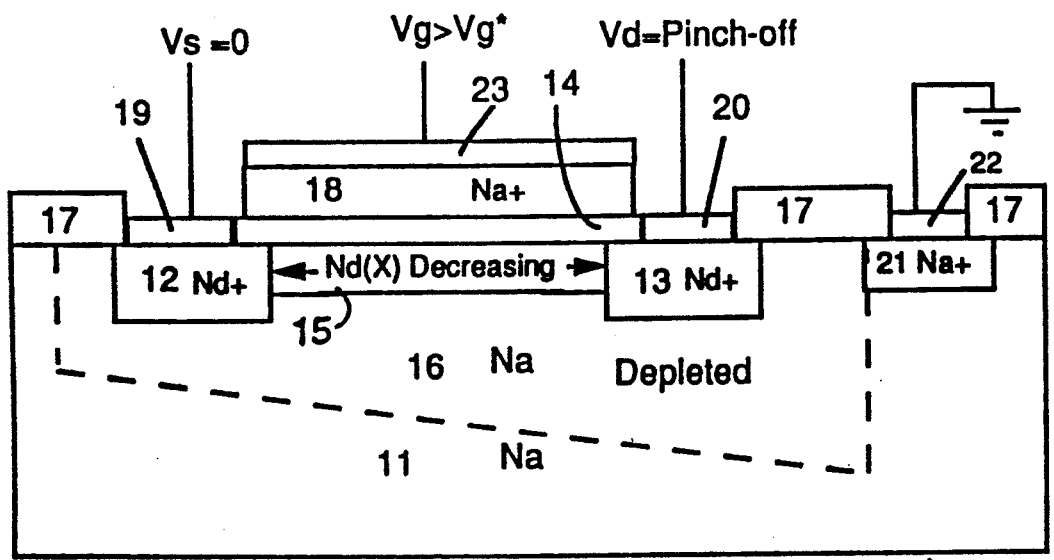
Figure 1D   Fermi-FET at Pinch-off

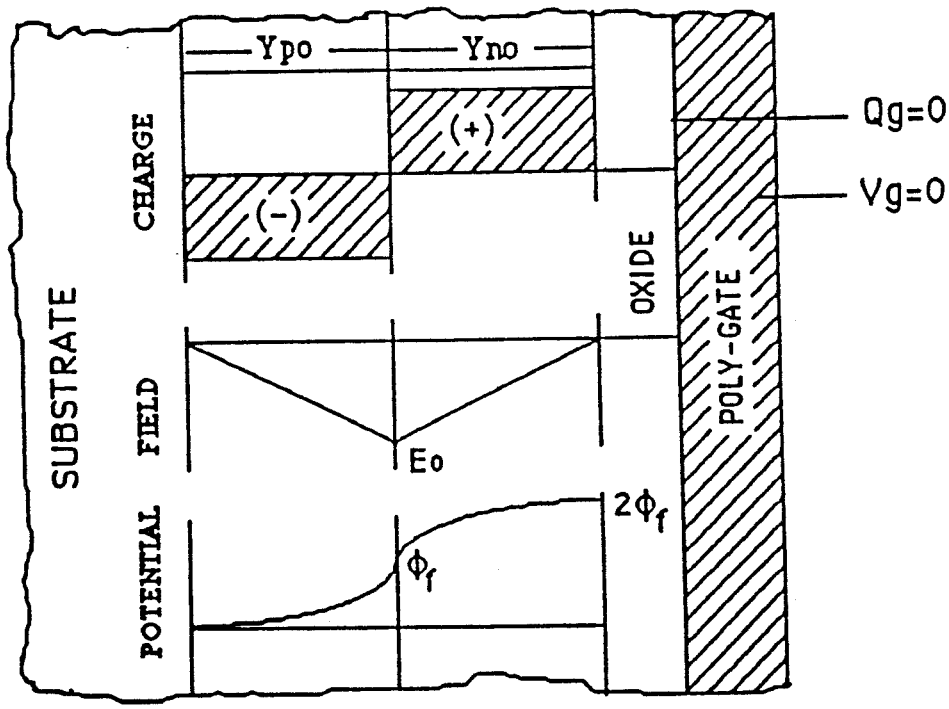
Figure 2-A
EMPTY CHANNEL
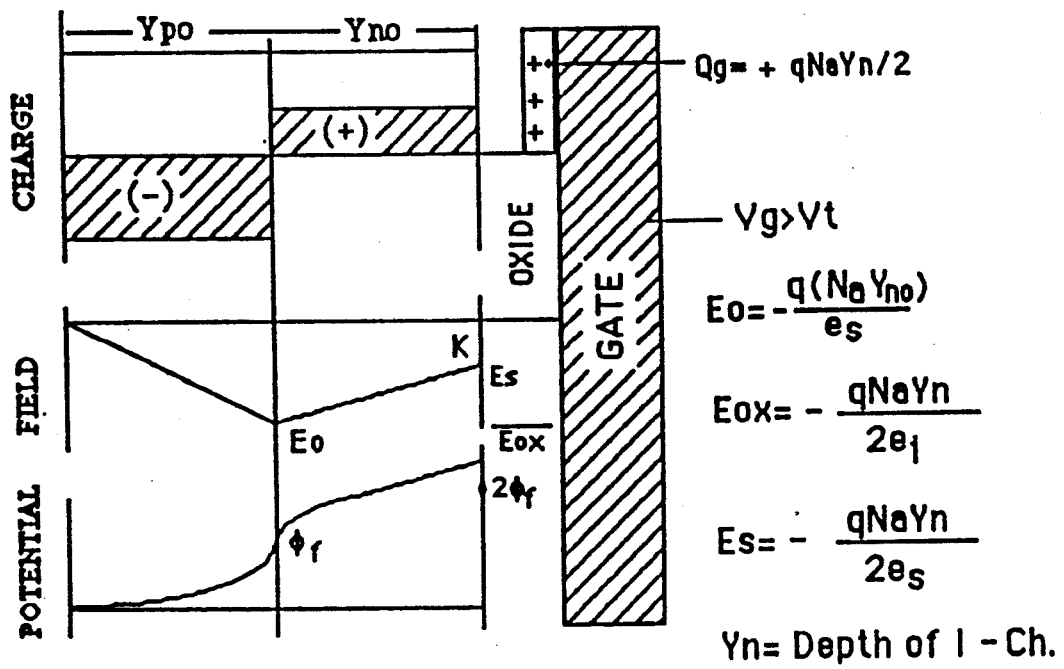
Figure 2-B
HALF FULL CHANNEL

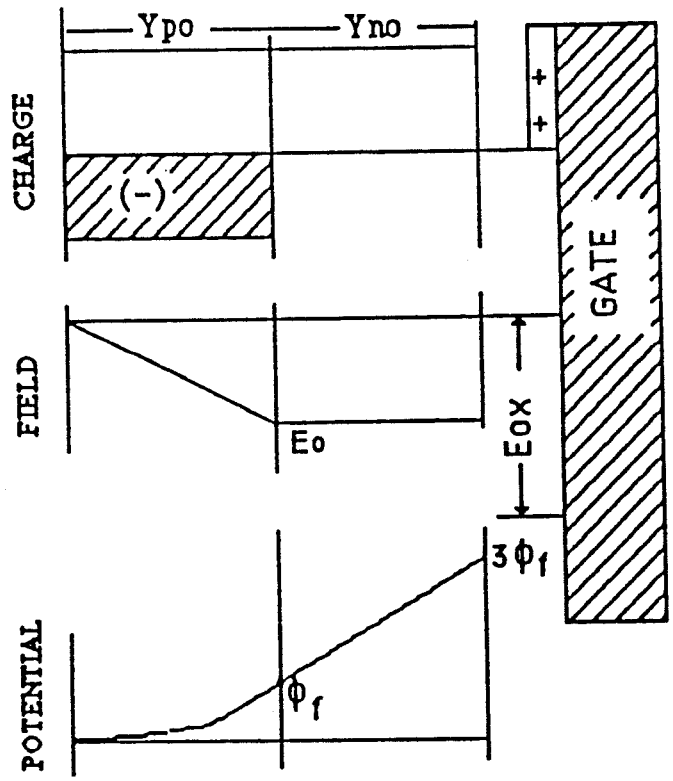
FIG.2-C Full Channel Condition
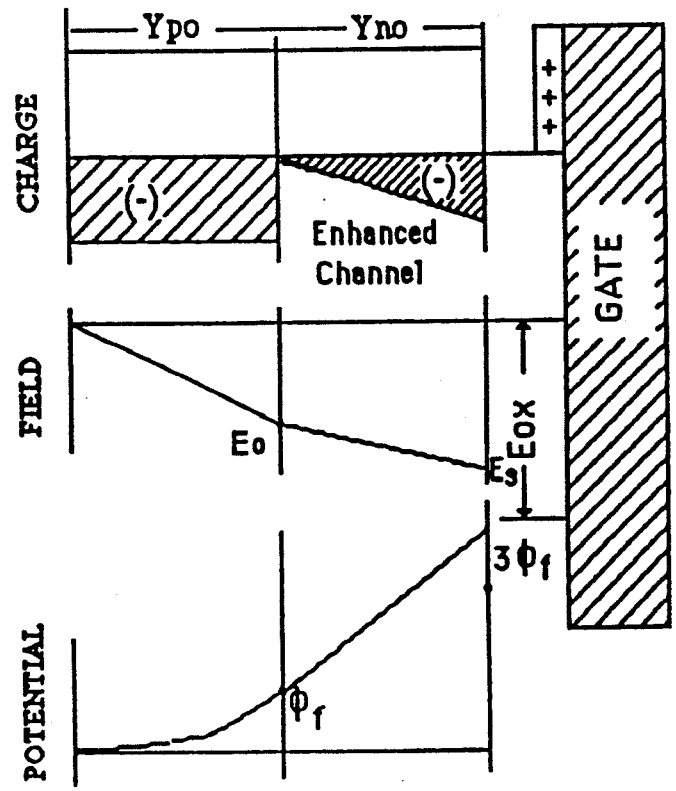
Figure 2-D Enhanced Channel

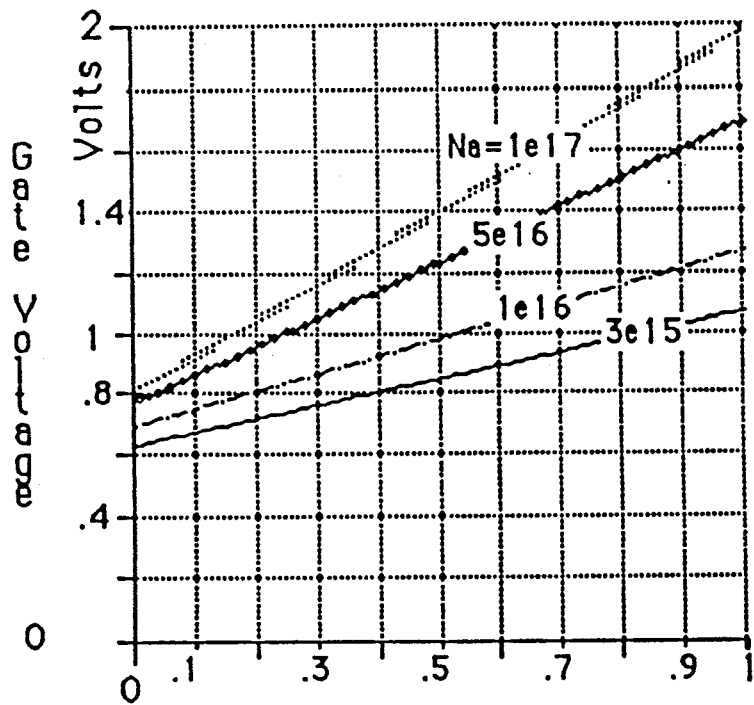
$F = Np*/Na$
Figure 3-A
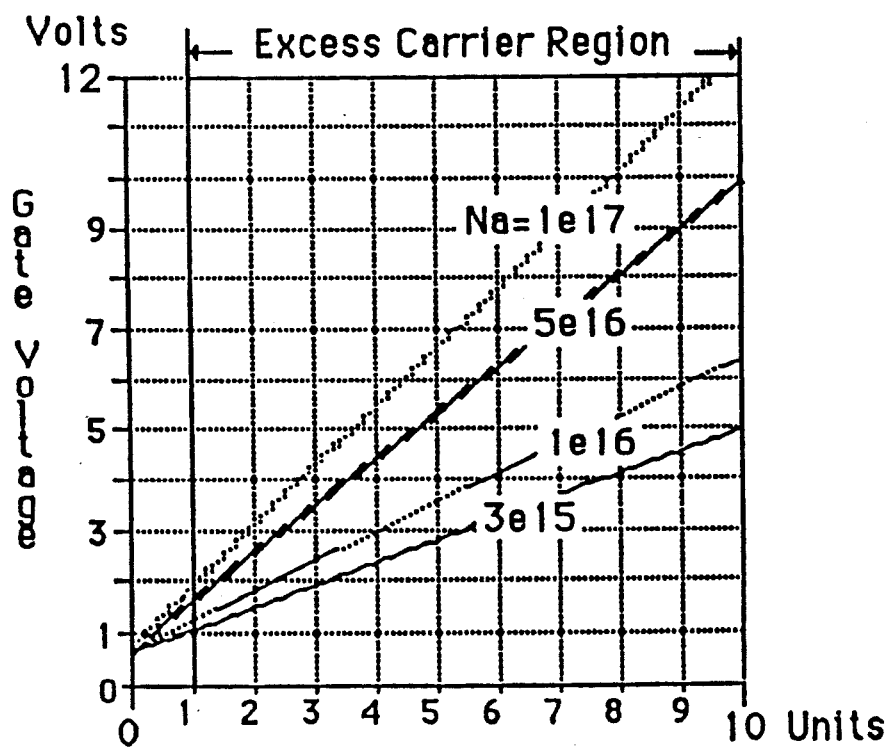
$F = Np*/Na$
Figure 3-B

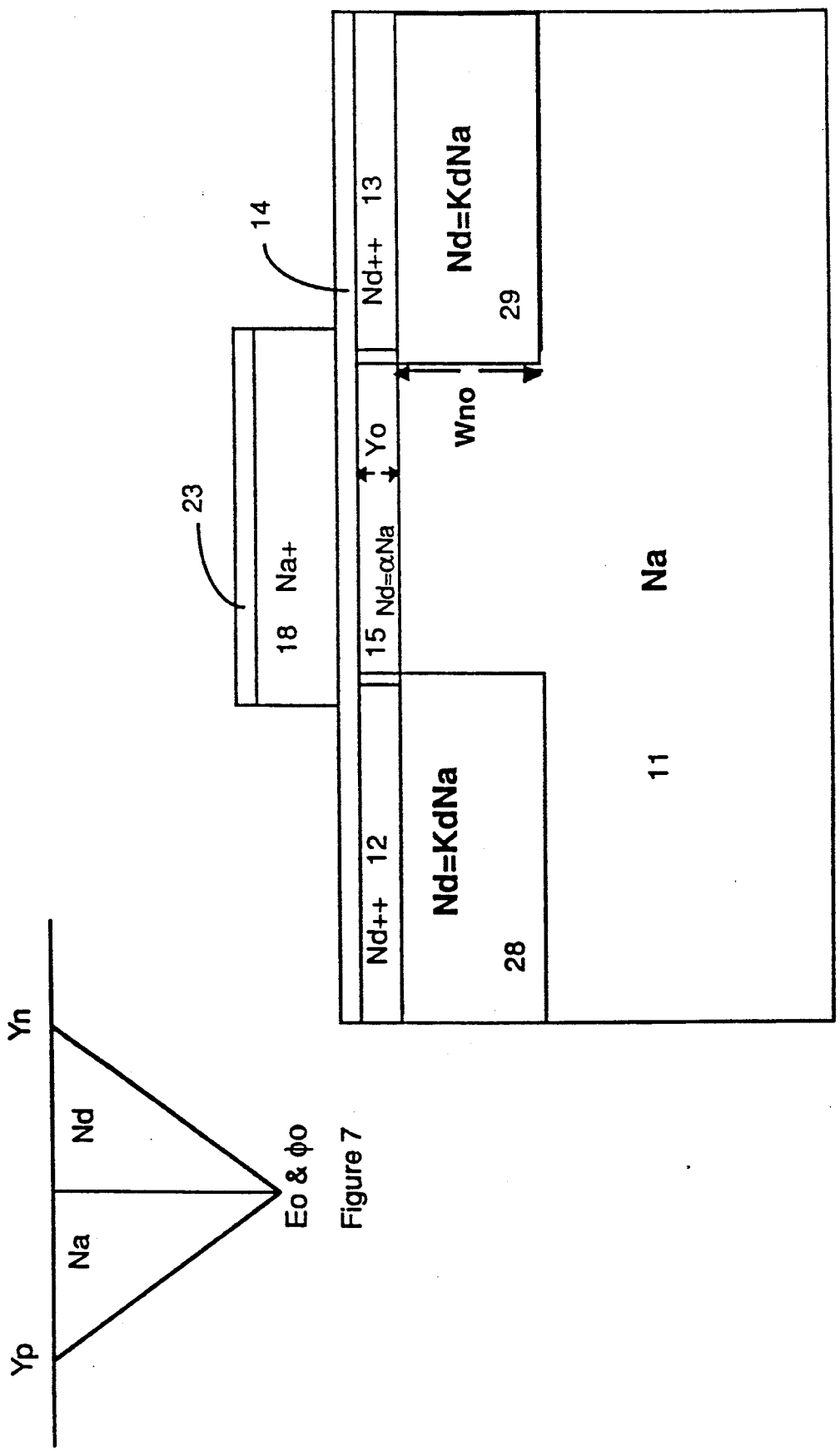

Channel Substrate Concentration $N_a$
vs. Channel Length $L_0$

Depth D of Silicon Layer
vs. Channel Length $L_0$

Critical Depth D
of Fermi Channel Region A
vs. α and Channel Length $L_0$

Electric Field at Drain, $V_d=6V$,
vs. Channel Length $L_0$

N-Channel Fermi FET
α=0.5, $N_a$=5E16, $L_0$=0.6μ, Z=20μ, $T_{ox}$=165A

N-Channel Fermi SOI FET
$N_a$=5E16, α=0.5, $T_{ox}$=165A, Z=20μ, $L_0$=0.6μ, A=1769A N-Channel MOS,
$Z=20\mu$, $L_0=0.6\mu$, $T=27C$, $T_{ox}=165$, $N_a=5E16$ P-Channel Fermi FET
$\alpha=0.5$, $N_d=5E16$, $L_0=0.6\mu$, $Z=20\mu$, $Y_0=1500A$ P-Channel Fermi SOI FET
α=0.5, $N_d$=5E16, $L_o$=0.6μ, Z=20μ, $T_{ox}$=165A, A=1594A P-Channel MOS,
$L_o$=0.6μ, Z=20μ $T_{ox}$=165A, T=27C, $N_d$=5E16

Nominal SOI FET Channel Substrate Depth Dc in Microns vs.
Channel Substrate Doping $N_a$ and Maximum Drain Voltage Vd

FERMI THRESHOLD SILICON-ON-INSULATOR FIELD EFFECT TRANSISTOR

CROSS REFERENCE TO RELATED APPLICATION AND PATENT

This application is a continuation-in-part of copending application Ser. No. 07/318,153 filed Mar. 2, 1989 now U.S. Pat. No. 4,990,974 and is related to U.S. Pat. No. 4,984,043 issued Jan. 8, 1991 which is also a continuation-in-part of application Ser. No. 07/318,153, the disclosures of both of which are hereby incorporated herein by reference.

FIELD OF THE INVENTION

This invention relates to field effect transistor devices fabricated with semiconductor or silicon-on-insulator technology, and more particularly to high speed silicon-on-insulator field effect transistors having operational characteristics which are independent of device dimensions, operating temperature and doping concentrations.

BACKGROUND OF THE INVENTION

Field Effect Transistors (FET's) have become the dominant active device for Very Large Scale Integration (VLSI) and Ultra Large Scale Integration (ULSI) applications, because the integrated circuit FET is by nature a high impedance, high density, low power device. Much research and development activity has focused on improving speed and density of FETs, and on lowering the power consumption thereof.

As is well known to those having skill in the art there are two types of FET devices: the Insulated Gate FET (IGFET) and the Junction FET (JFET). Most present day integrated circuit technology employs the IGFET because of its simplified construction for integrated circuit applications. An IGFET typically comprises source and drain regions in a semiconductor substrate at a first surface thereof, and a gate region therebetween. The gate comprises an insulator on the first substrate surface between the source and drain regions, with a gate electrode or contact on the insulator. A channel is formed in the semiconductor substrate beneath the gate electrode, and the channel current is controlled by a voltage at the gate electrode.

In the most common configuration of an IGFET, an oxide layer is grown or otherwise formed on the first semiconductor surface, between the source and drain regions, and a metal or other gate electrode is formed on the oxide layer. This structure is commonly called a Metal Oxide Semiconductor Field Effect Transistor (MOS or MOSFET). The terms MOS and MOSFET are now used interchangeably with IGFET to include devices in which the insulator is a material other than an oxide (for example a nitride), and the gate electrode is a material other than metal (for example polysilicon). These terms will be used interchangeably herein.

Two types of channels may be provided in MOS devices. The first is referred to as an "induced channel", in which gate voltage induces a field in the substrate under the gate to thereby draw electrons (for a P-type substrate) into the region beneath the gate. As a result, this region changes conductivity type (e.g. P-type to N-type), and an induced channel is formed. The induced change of semiconductor material from one conductivity type to opposite conductivity type is called "inversion". Increasing gate voltage enhances the availability of electrons in the channel, so that an induced channel MOS device is referred to as operating in an "enhancement" mode.

The second type of channel is a "diffused channel" in which a channel having conductivity opposite that of the substrate is formed beneath the gate electrode. In such a device current flows between source and drain even in the absence of gate voltage. Decreasing gate voltage causes current to decrease as the diffused channel is depleted of carriers. Increasing gate voltage causes the gate current to increase as the diffused channel is enhanced. Accordingly, a diffused channel MOS device may operate in "enhancement" or "depletion" modes.

Enhancement mode (induced channel) devices are preferred for digital integrated circuit applications because these devices are off at zero gate voltage. Both enhancement and depletion mode devices have a threshold voltage associated therewith. The threshold voltage is the value of gate voltage needed to initiate device conduction. Threshold voltage is an important MOS characteristic and must be well controlled to provide satisfactory integrated circuit devices.

Unfortunately, the threshold voltage of known MOS devices typically varies as a function of the oxide thickness, the length of the channel, drain voltage, and the substrate doping concentration. Since each of these parameters can vary dramatically from one integrated circuit to another, very strict manufacturing tolerances (often referred to as "groundrules") must be provided to ensure device uniformity. However, strict manufacturing ground rules lower device yields. Moreover, since device dimensions and doping levels become more difficult to control as the devices become smaller, increases in device density and operating speed are difficult to obtain.

The threshold voltage of conventional MOS devices also varies as a function of device temperature. Unfortunately, device operating temperature varies considerably from one integrated circuit to another, depending upon the application. In fact, operating temperatures vary considerably within an integrated circuit, depending upon the duty cycle of the individual devices. MOS devices must be designed to operate properly despite the variation in threshold voltage with temperature. As such, lower performance and lower speed must be specified to ensure proper operation at all operating temperatures.

Many techniques have been proposed in an attempt to control threshold voltage while maintaining acceptable process groundrules; however such techniques cannot fully overcome the inherent variability of threshold voltage in the conventional FET structure. Other attempts have been made to improve the basic structure of the FET to provide improved characteristics. For example, a publication entitled *A Normally-Off Type Buried Channel MOSFET For VLSI Circuits*, by K. Nishiuchi et al. (IEDM Technical Digest, 1979, pages 26–29) discloses a buried channel MOSFET that uses a bulk region as a conducting channel in contrast with the surface channel of a conventional device. Another publication entitled *The Junction MOS (JMOS) Transistor—A High Speed Transistor For VLSI*, by E. Sun et al. (IEDM Digest, 1980, pages 791–794) discloses a MOS device using a layered N-P P-junction structure beneath a MOS gate region. The art has heretofore not exhaustively investigated the origin of threshold voltage in FETs and the reasons for variation of threshold voltage with device characteristics. Accordingly, the art has heretofore not provided an FET design which minimizes variations of threshold voltage by eliminating those characteristics which contribute to this variation.

Miniaturization of MOS devices for VLSI and ULSI designs has also created other problems. For example, short channel devices are increasingly prone to breakdown due to well known punch-through and impact ionization effects. In order to prevent such breakdown, short channel devices have employed scaled down input (supply) voltage, for example, 3 V instead of the standard 5 V supplies heretofore employed. However, as is well known to those having skill in the art, decreasing supply voltage causes threshold voltage to become a greater fraction of the supply voltage, thereby reducing device speed and negating the advantage of short channel devices.

Finally, as device density further increases, it has become more difficult to provide ohmic (i.e. non-rectifying) contacts to these devices. Complex contact metallurgy schemes have been developed in an attempt to provide satisfactory, high density ohmic contacts. Complex contact metallurgy creates manufacturing problems and cannot fully compensate for poor ohmic contacts themselves.

In an effort to improve the performance of FET devices, the art has also focused on Semiconductor-On-Insulator (SOI) technology. In SOI technology, the FET devices are formed in a thin monocrystalline semiconductor layer which is formed on an insulating layer. The insulating layer is typically formed on a substrate which may be silicon. In other words, rather than forming active devices in bulk semiconductor, the active devices are formed in a thin semiconductor on insulator layer. In the present state of the art, silicon is most often used for the monocrystalline semiconductor layer in which devices are formed. However, it will be understood by those having skill in the art that other monocrystalline layers such as germanium or gallium arsenide may be used. Accordingly, any subsequent references to silicon will be understood to encompass any semiconductor.

An SOI FET typically includes a source and drain region of a first conductivity type, typically extending the entire depth of the thin silicon film, and a channel region of opposite conductivity between the source and drain regions, with the channel region typically extending the entire depth of the silicon layer.

The first application of SOI technology was silicon-on-sapphire. More recent efforts have been directed towards growing monocrystalline silicon on top of a silicon dioxide layer grown on a silicon wafer. See for example the publications entitled *Ultra-High Speed CMOS Circuits In Thin SIMOX Films* to Camgar et al. published in Volume 89 of IEDM, pp. 829–832 (1989) and *Fabrication of CMOS on Ultrathin SOI Obtained by Epitaxial Lateral Overgrowth and Chemical-Mechanical Polishing* to Shahidi et al. published in Volume 90 of IEDM, pp. 587–590, 1990. SOI technology has several potential advantages compared to bulk FET devices. For example, MOS fabrication processes in SOI are compatible with and may be simpler than MOS fabrication processes in bulk silicon. In SOI technology, shallow source and drain regions can be easily obtained and source and drain capacity can be reduced below typical bulk values. Moreover, both P- and N- channel devices may be fabricated without requiring a contra doped tub implant which is necessary for bulk substrate devices. Also, because the devices are formed in a thin silicon layer on an insulating layer, latchup conditions are eliminated and isolation between devices is enhanced. Finally, avalanche breakdown is also eliminated below the drain and source diffusions.

Unfortunately, conventional SOI technology does have a number of problems. A major problem is the need to grow a high quality, monocrystalline silicon film on top of an insulator. Moreover, carrier mobility in the channel region of SOI FETs is reduced from its bulk value due to the increase in the channel dopant concentration which is required to prevent punch-through and which is needed to accommodate the depletion effects which are required to control the device pinch off properties. Moreover, the depth of the silicon film grown on the insulator must be shallow (i.e. on the order of a 1,000 Å or less) in order to avoid a "kink" in the drain current versus voltage properties of the FET devices. The need for a thin silicon film requires high doping concentrations (on the order of 1E17 or greater) that results in lowering the effective carrier mobility in the channel region. Finally, threshold voltage of typical SOI devices is low, typically around 200 mV. This low value renders SOI devices susceptible to noise induced errors in VLSI operation.

SUMMARY OF THE INVENTION

It is therefore an object of the invention to provide improved Silicon-on-Insulator (SOI) Field Effect Transistor (FET) devices.

It is another object of the invention to provide improved SOI MOS FET devices.

It is yet another object of the invention to provide high speed SOI MOS devices.

It is still another object of the invention to provide high speed SOI MOS devices having a threshold voltage which is independent of insulator thickness, channel length, drain voltage, substrate doping and temperature.

It is a further object of the invention to provide high density high speed SOI MOS devices which may be manufactured with relaxed ground rules to thereby increase device yields.

It is yet a further object of the invention to provide high density SOI MOS devices which operate at full supply voltage without the risk of breakdown due to punch through or impact ionization.

It is still a further object of the invention to provide high density ohmic contacts for high density SOI MOS devices.

These and other objects are provided by a SOI FET device according to the present invention, which operates in the enhancement mode without requiring inversion, by setting the device's threshold voltage to twice the Fermi potential of the semiconductor material. As is well known to those having skill in the art, Fermi potential is defined as that potential for which a semiconductor material has a probably of one half of being occupied by an electron. Accordingly, the SOI FET device according to the present invention may be referred to as a Fermi Threshold SOI FET or Fermi SOI FET.

It has been found, according to the invention, that when the threshold voltage is set to twice the Fermi potential, the dependance of the threshold voltage on oxide thickness, channel length, drain voltage and substrate channel doping is eliminated. It has also been found, according to the invention, that when the threshold voltage is set to twice the Fermi potential, the vertical electric field at the first surface of the semiconductor substrate in the channel is minimized, and is in fact substantially zero. Carrier mobility in the channel is thereby maximized, leading to a high speed SOI MOS device with greatly reduced hot electron effects.

Stated another way, according to the invention it has been found that dependance of threshold voltage on oxide thickness, channel length, drain voltage and doping level is a result of the voltage developed across the gate oxide layer which is necessary to establish inversion in conventional SOI MOSFET's. According to the invention, by providing a threshold voltage equal to twice the Fermi potential, inversion is prevented, leading to a high speed device substantially independent of device dimensions.

For bulk formed Fermi-FETs it has been found that the above described Fermi-FET criteria may be met by forming a contra doped channel region having a carrier concentration or dopant density $\alpha$ times the dopant density of the substrate and having a channel depth $Y_0$ which is specified as:

$$Y_o = \sqrt{\frac{2e_s \phi_s}{q N_s \alpha (\alpha + 1)}}$$

where $e_s$ is the dielectric constant of the semiconductor material (Farads/cm), q is the electric charge $(1.6 \times 10^{19} C)$, and $N_s$ is the substrate doping density.

According to the present invention, for SOI Fermi-FETs it has been found that the above described Fermi-FET criteria may be met by forming source and drain regions of first conductivity type in the thin silicon layer, preferably extending the depth of the silicon layer. A "channel substrate" of second conductivity type is formed between the source and drain regions. A channel region having the first conductivity type is formed in the channel substrate, with the channel having a carrier concentration or dopant density $\alpha$ times the dopant density of the channel substrate and having a channel depth A which is specified as:

$$A = \sqrt{\frac{2e_s \phi_s}{q N_a \alpha (\alpha + 1)}}$$

where $N_a$ is the channel substrate doping density.

According to another aspect of the present invention, for the Fermi SOI FET it has been found that the thin silicon layer must have a minimum thickness in order to insure proper operation of the Fermi-FET and to insure that punchthrough between source and drain is prevented. In particular, the doping concentration within the channel substrate must be above a certain value, $N_a$, in order to prevent punchthrough. With this value of $N_a$ the minimum thickness of D of the thin silicon layer must equal at least $$\sqrt{\frac{2e_s}{qN_a}} \left[ \sqrt{\frac{\phi_s}{\alpha (1 + \alpha)}} + \sqrt{V_{dd}} \right]$$

where $V_{dd}$ is the power supply voltage for the SOI FET. This minimum thickness ensures that the channel substrate is not fully depleted during carrier conduction when the drain is close to supply voltage $V_{dd}$. The pinch off mechanism thereby remains intact.

A relationship between the channel doping concentration and the minimum depth for the silicon layer of a conventional (non-Fermi) SOI device has also been found to be $$\sqrt{\frac{2e_s V_{dd}}{qN_a}}.$$

This minimum depth for the conventional SOI device also ensures that the channel substrate is not fully depleted, and is contrary to the teachings of the prior art such as the aforementioned Shahidi et al. publication which states that the substrate channel should be fully depleted.

According to another aspect of the invention it has been found that the contact potentials (referred to as a "flat-band voltages") generated by conventional lo FET substrate and gate contacts may adversely effect the threshold voltage of SOI FET devices, in a manner not accounted for in previous FET designs. According to the invention it has been found that the FET gate contact may be selected to be a semiconductor having a conductivity type and dopant density which generates a gate contact potential which is equal and opposite to that of the substrate contact potential, thereby neutralizing the effect of flat-band voltages. Dependence of threshold voltage on temperature is thereby eliminated. In order to neutralize the substrate flat band voltage, the gate electrode is selected to be the same semiconductor as the substrate, having the same conductivity type and similar doping density as the substrate. In a preferred embodiment, when the substrate is monocrystalline silicon, the gate electrode is polysilicon.

Flat-band voltage compensation may be employed to improve the performance of conventional FET's, to make P- and N-channel threshold voltages symmetric and less dependent upon temperature. Moreover, since the threshold voltage of the SOI Fermi-FET is already independent of other device parameters, the use of flat-band voltage compensation further enhances the performance thereof.

The Fermi SOI FET of the present invention particularly lends itself to the use of multiple gate electrodes, for use in complementary MOS (CMOS) or other logic technologies which require connecting of transistors in series to achieve the desired logic function while maintaining essentially zero idle power. When multiple gate Fermi SOI FET devices are employed, it has been found that performance is improved when the gate immediately adjacent the drain is maintained at a full on value. This gate, referred to as an accelerator electrode, reduces the threshold voltage for the remaining gate or gates in the multi-gate Fermi SOI FET device.

BRIEF DESCRIPTION OF THE DRAWINGS

FIGS. 1A–1D illustrate cross-sectional views of the Fermi-FET device of the invention of application Ser. No. 07/318,153 now U.S. Pat. No. 4,990,974 under various operating conditions.

FIGS. 2A–2D are graphical representations of various device parameters of the invention of application Ser. No. 07/318,153 now U.S. Pat. No. 4,990,974, for the operating conditions of FIGS. 1A–1D.

FIGS. 3A–3B graphically illustrate gate voltage as a function of carrier density factor according to the invention of application Ser. No. 07/318,153 now U.S. Pat. No. 4,990,974.

FIG. 7 graphically illustrates junction depletion for Fermi-FET devices of the invention of application Ser. No. 07/318,153 now U.S. Pat. No. 4,990,974.

FIG. 8 illustrates a cross-sectional view of an FET having source and drain subdiffusion regions according to the invention of application Ser. No. 07/318,153 now U.S. Pat. No. 4,990,974.

DETAILED DESCRIPTION OF THE INVENTION

Figure 4A:
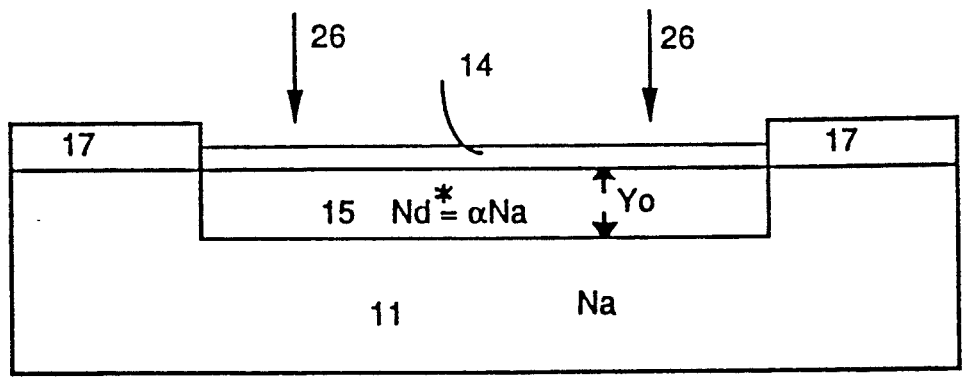
FIG. 4A-4D illustrate cross-sectional views of a process for fabricating Fermi-FET devices according to the invention of application Ser. No. 07/318,153 now U.S. Pat. No. 4,990,974.

The present invention now will be described more fully hereinafter with reference to the accompanying drawings, in which a preferred embodiment of the invention is shown. This invention may, however, be embodied in many different forms and should not be construed as limited to the embodiment set forth herein; rather, applicant provides this embodiment so that this disclosure will be thorough and complete, and will fully convey the scope of the invention to those skilled in the art. For ease of illustration the thickness of layers has been exaggerated. Like numbers refer to like elements throughout. It will be understood by those having skill in the art that the Fermi-FET of the present invention is applicable to both P and N channel devices and to silicon, germanium and other semiconductor materials.

FET Design Analysis

Before describing the Fermi-FET of the invention of application Ser. No. 07/318,153 now U.S. Pat. No. 4,990,974, an analysis of FET design relationships will be developed. Throughout this specification, the terms MOS, FET, MOSFET and IGFET will be employed as synonyms to describe a field effect transistor structure having an insulated gate, wherein the insulation may be, but is not necessarily, an oxide, and wherein the gate may be, but is not necessarily, metal.

An induced channel MOSFET requires a gate voltage to induce an inversion layer of minority carriers that act to conduct current between the source and drain. A gate threshold voltage condition is achieved when the surface potential $\phi_s$ of the semiconductor substrate, below the gate, is elevated sufficiently to bend the intrinsic energy band of the semiconductor material, down below the Fermi level. This rise in substrate surface potential is the result of increasing gate voltage $V_g$ to induce a depletion layer, with depth $W_{do}$, in the substrate below the gate.

Using Poisson's equation, the potential rise across the depletion layer is $\phi_s=(q/2e_s)(N_aW_{do}^2)$, where q is the electron charge in Coulombs, $e_s$ is the dielectric constant of the semiconductor material (Farads/cm), $N_a$ is the substrate acceptor concentration level, and $W_{do}$ is the depletion depth. Depletion depth $W_{do}$ is defined as $W_{do}=\sqrt{(2e_s\phi_s/(qN_a))}$. The electric field at the substrate surface is $E_s=\sqrt{(2\phi_sqN_a/e_s)}$. When the surface potential $\phi_s$ reaches twice the Feri potential $2\phi_f$, the ionization concentration $N_p$, within a p- substrate, becomes equal to the substrate acceptor concentration $N_a$. Surface potential $\phi_s$ need only be increased slightly above threshold voltage $2\phi_f$ in order to achieve inversion.

Unfortunately, charge is accumulated on the gate as a result of creating the inversion layer. The density of this gate charge is $qN_aW_{do}$ Coulombs per cm². Gate threshold voltage $V_t$ is the sum of the voltage developed across the gate oxide layer and the rise in substrate potential $2\phi_f$. The gate oxide field is $qN_aW_{do}/e_i$ and the voltage $V_{ox}$ is $qN_aW_{do}/C_i$ where $C_i=e_i/T_{ox}$ and $T_{ox}$ is the oxide thickness. Therefore, $$V_t = \frac{L^*}{L} \frac{\sqrt{2e_s q N_a \phi_s}}{C_1} + \phi_s - V_{cs} + V_{cg} \tag{1}$$

Where;
$\phi_s = 2\phi_f$;
$L^*$ = Effective channel length, as described in detail below,
$V_{cs}$ = substrate contact potential, and
$V_{cg}$ = gate contact potential.

When voltage is applied to the drain and source regions, a potential $V(X)$ is introduced at position X along the channel between the drain and source. This potential is described in detail below. The oxide threshold voltage term in Equation 1 increases with voltage $V(X)$ in accordance with Equation 2:

$$V_t(X) = \frac{L^*}{L} \frac{\sqrt{2e_s q N_a \phi_s \left(1 + \frac{V(X)}{V_0}\right)}}{C_i} + \phi_s\left(1 + \frac{V(X)}{V_0}\right) - V_{cs} + V_{cg} \tag{2}$$

Thus, the threshold voltage contribution due to gate charge Equation 2 is complex and causes difficulties in both digital and analog circuit design and device fabrication. In particular, high speed short channel C-MOS logic design is severely compromised by this threshold voltage term. Threshold voltage sensitivity to substrate surface doping also hinders corrective measures needed to eliminate drain-source punch-through in conventional short channel MOSFET devices.

The Fermi-FET Concept

According to the invention of application Ser. No. 318,153 Fermi-FET design is achieved by a grounded source FET device devoid of the complex threshold voltage term shown in Equation 1 above. The basic N-Channel Fermi-FET is illustrated by FIG. 1A. A P-channel Fermi-FET is fabricated the same way but with opposite conductivity materials.

Referring now to FIG. 1A a Fermi-FET 10 according to the invention of application Ser. No. 07/318,153 is fabricated in a semiconductor substrate 11 having an acceptor concentration $N_a$. It will be understood by those having skill in the art that semiconductor substrate 11 may be silicon, gallium arsenide or other semiconductors, and may be an epitaxial or "tub" region formed in a semiconductor substrate. Source region 12 and drain region 13 are formed in the semiconductor substrate. Source and drain regions 12 and 13 are of opposite conductivity from substrate region 11 and have a higher donor concentration (i.e. they are doped $N_d^+$). Source electrode 19 and drain electrode 20 form external contacts for these regions. A thin gate oxide layer 14 is formed on the surface of substrate 11. A gate contact is formed on the gate oxide 14. In the embodiment illustrated gate contact comprises a polysilicon gate contact 18 and a metal gate electrode 23 for reasons described more fully below. A substrate contact region 21 is formed within the semiconductor substrate 11. Contact 21 is typically of the same conductivity as substrate 11 but more highly doped (e.g. it is doped $N_a^+$). Finally, field oxide regions 17 isolate devices from one another.

According to the invention of application Ser. No. 07/318,153 now U.S. Pat. No. 4,990,974, a channel having the same conductivity type as the source and drain regions and opposite conductivity to the substrate is formed for example by implanting through thin gate oxide layer 14. The channel has a depth $Y_o$ and a donor doping level $N_d$. The depth and doping and channel are critical for forming the Fermi-FET device of the present invention. In one embodiment, the substrate is a P-type substrate while source drain and channel regions are N-type.

It will be shown according to the invention of application Ser. No. 07/318,153 now U.S. Pat. No. 4,990,974, that when channel 15 has the proper doping level and depth that a depletion region 16 is formed in substrate 11 and the channel 15 is completely self-depleted as shown in FIG. 1A.

Still referring to FIG. 1A, the basic criteria for an N-channel Fermi-FET will now be described. The criteria for P-channel devices are the same except donor and acceptor ion types are interchanged. The nominal implant depth $Y_o$ of the channel is governed by Equation 3A and the effective donor concentration $N_d^+$ is defined by Equation 3C.

$$Y_0 = \sqrt{\frac{2e_s V_0}{q N_d^*} \left(\frac{N_a}{N_a + N_d^*}\right)} = \sqrt{\frac{2 e_s \phi_s}{q N_s \alpha(\alpha + 1)}} \tag{3A}$$

$$V_0 = \phi_s = 2\phi_f + \frac{KT}{q} \ln\left(\frac{N_d^*}{N_a}\right) \tag{3B}$$

$$N_d^* = \frac{1}{d} \int_o^d N_d(y) dy = \alpha N_s \tag{3C}$$

Given proper dose and depth, the implanted result of electron and hole diffusion across the junction between the channel 15 and the substrate 11. This carrier diffusion process is required to establish a constant Fermi potential across that P-N junction region. There are critical conditions for the implant depth and dose. The entire implanted channel with depth $Y_o$, (Equation 3A), must be depleted of mobile electrons when the electric field $E_o$ at the channel-substrate junction reaches the value needed to terminate carrier diffusion across that junction. The total voltage $V_o$ developed across the depleted substrate 16 and channel region 15 (Equation 3B) raises the substrate surface potential $\phi_s$ to twice the Fermi potential $2\phi_f$, if and only if $N_p^* = N_a$. In general, $N_s$ defines the substrate doping density and $N_o$, the channel doping density. This threshold voltage condition $2\phi_f$ is achieved without introducing charge on the gate. This condition is true since the normal component of electric field, due to depletion effects, is zero at the surface of the semiconductor below the gate. The total threshold voltage expression for the Fermi-FET is therefore;

$$V_t = \phi_s \left( \frac{\alpha}{\alpha+1} \left(1 + \frac{V_s}{\phi_s}\right) \pm \right.$$

$$\left. \frac{2}{\alpha+1} \sqrt{1 + \frac{V_s}{\phi_s}} - \frac{1}{\alpha+1} \right) +$$

$$\frac{1}{C_i} \sqrt{2 q N_a e_s \left(\frac{\alpha}{\alpha+1}\right) \phi_s} \left[ \sqrt{1 + \frac{V_s}{\phi_s}} - 1 \right] \quad (4)$$

Where
$V_s$ = Source voltage, $$\phi_s = 2\phi_f + \frac{KT}{q} \ln(\alpha), \text{ and}$$

$\alpha = N_p^*/N_a$

Given the special condition $N_p^* = N_a$, i.e. $\alpha = 1$, the correct implant depth (Equation 3A) becomes $$Y_o = \sqrt{\frac{2\phi_f e_s}{q N_a}} \quad (5)$$

Where:

$$\phi_f = \frac{KT}{q} \ln\left(\frac{N_a}{N_i}\right).$$

$e_s$ = dielectric constant of silicon,
$N_s$ = Acceptor concentration of substrate (N-channel), and
$N_i$ = Intrinsic carrier concentration.

Table 1 lists nominal values for implant depth $Y_o$ in silicon as a function of substrate doping for $\alpha = 1$. The correct implant depth is subject to the condition $N_d^* = N_{as}$ for an N-channel device or $N_a^* = N_{ds}$ for a P-channel device. Subscript s denotes substrate.

TABLE 1

| $N_{as}$ or $N_{ds}$ (cm$^{-3}$) | Critical Implant Depth, $Y_0$ (Angstroms) |
|---|---|
| 1 × 10$^{17}$ | 714 |
| 5 × 10$^{16}$ | 988 |
| 2 × 10$^{16}$ | 1523 |
| 1 × 10$^{16}$ | 2087 |
| 8 × 10$^{15}$ | 2314 |
| 5 × 10$^{15}$ | 2875 |
| 1 × 10$^{15}$ | 6008 |

The Fermi-FET design of the invention of application Ser. No. 07/318,153 achieves the objective of eliminating the complex oxide threshold voltage first term (Equation 1) typical of conventional enhancement MOSFET's. It will be shown subsequently that fabrication of the Fermi-FET is relatively simple and is applicable to long, medium, and short P- and N-channel devices. The benefits of the Fermi-FET are: high manufacturing yield, high speed circuit capabilities (low giga-hertz range), control of punch-through and avalanche breakdown, minimization of hot electron effects, and greatly simplified user design groundrules for both analog and digital circuits.

Fermi-FET Operation

Referring again to FIGS. 1A through FIG. 1C, as gate voltage $V_g$ is increased above threshold voltage $V_t$, electric field and potential increase at the substrate surface directly below the gate. This rise in surface electric field and potential occurs as mobile electrons fill the holes in the depleted implant channel region 15. The holes in the depleted channel 15 are uniformly filled as gate voltage is increased above threshold. The half full and full channel conditions are illustrated by FIG. 1B and FIG. 1C respectively. For each hole filled in the depleted channel 15, a unit of positive charge (1.6 × 10$^{-19}$ Coulombs) appears on the gate electrode in order to conserve charge. Filling the empty donor sites of the implanted channel with electrons allows conduction current to flow between the source and drain. The channel is totally charge neutral when all of the empty holes are filled with electrons. When charge neutrality occurs, the volume density of conduction carriers corresponds to the donor concentration $N_d$. Increasing gate voltage to induce the full channel value, $V_g^*$, fills the entire depleted channel region with electrons.

The full channel condition is illustrated by FIG. 1C. When "full" channel conditions are achieved, positive charge density on the gate electrode is uniform and has the value $qN_aY_o$ Coulombs/cm$^2$ for $\alpha = 1$. The electric field developed across the oxide layer is, $E_{ox} = (qN_aY_o)/e_i$ and the electric field at the surface of the semiconductor and across the "full" implanted region is $(qN_aY_o)/e_s$ since $\nabla \cdot D = 0$ there and in the oxide layer. The oxide potential is $V_{ox} = (qN_sY_oT_{ox})/e_i$. Gate voltage $V_g^*$, at "full" channel conditions, is the sum of the oxide potential $V_{ox}$ and potential $\phi_s$ developed across the channel 15 and the ionized region of the substrate below the channel.

Referring now to FIG. 1D, when gate voltage $V_g$ exceeds the "full" channel value $V_g^*$, excess charge (mobile carriers) becomes available in the implanted channel region 15. These excess carriers account for the increase in channel current in proportion to gate overdrive voltage, $V_g > V_g^*$. A unit of positive charge also appears on the gate electrode for each excess electron created in the channel.

FIGS. 2A-2D illustrate the charge distribution, electric field, and potential for the "empty", "half-full", "full", and "enhanced" channel conditions illustrated in FIGS. 1A-1D respectively, for the case $N_d^* = N_a$. These conditions depend on gate voltage $V_g$.

Referring to the "full" channel condition, (FIG. 2C) gate to substrate voltage $V_g^*$, is given by:

$$V_g^* = V_{ox} + V_{ch} + V_j \quad (6)$$

Where in general:

$$Y_{ex} = \frac{qN_d^* Y_o}{C_i} \quad \text{Voltage Across Oxide Layer} \quad (7A)$$

$$E_i = \frac{qN_d^* Y_o}{\epsilon_i} \quad \text{Electric Field Across Gate Insulator} \quad (7B)$$

$$Y_{ch} = E_{yo} Y_o = \frac{qN_d^* Y_o^2}{e_s} \quad \text{Voltage Across Channel} \quad (7C)$$

$$E_{yo} = \frac{qN_d^* Y_o}{e_s} \quad \text{Field Across Channel} \quad (7D)$$

$$V_j = \phi_s \frac{N_d^*}{N_d^* + N_a} \quad \text{Voltage At Substrate-Channel Junction} \tag{7E}$$

$$\phi_s = \frac{KT}{q} \ln\left(\frac{N_a N_d^*}{N_i^2}\right) \tag{7F}$$

$$Y_{no} = \sqrt{\frac{2e_s \phi_s}{qN_d^*}\left(\frac{N_a}{N_a + N_d^*}\right)} = \sqrt{\frac{2 e_s \phi_s}{qN_a \alpha(\alpha + 1)}} \tag{7G}$$

$$Y_{po} = \sqrt{\frac{2e_s \phi_s}{qN_a}\left(\frac{N_d^*}{N_a + N_d^*}\right)} \tag{7H}$$

$$N_d^* = \frac{1}{d}\int_o^d N_d(Y)\,dY = \alpha N_a \tag{7I}$$

For the special case, $N_d^* = N_a$, the following relations apply:

$$V_{ox} = \frac{qN_a Y_o}{C_i} \tag{8A}$$

$$V_{ch} = EY_o = 2\phi_f \tag{8B}$$

$$E_{yo} = \frac{qN_a Y_o}{e_s} \tag{8C}$$

$$V_j = \phi_f \tag{8D}$$

$$\phi_s = 2\phi_f \tag{8E}$$

$$Y_{ne} = Y_o \tag{8F}$$

$$Y_{po} = Y_o \tag{8G}$$

$$Y_o = \sqrt{\frac{2\phi_f e_s}{qN_a}} \tag{8H}$$

Substituting the appropriate Equation 8A–8H into Equation 6, the following relationship is obtained:

$$V_g^* = \frac{1}{C_i}\sqrt{2\phi_f e_s qN_a} + 2\phi_f + \phi_f \tag{9}$$

Accordingly, for the depleted (empty) channel conditions, (FIG. 2A), the potential rise $\phi_s$ at the first semiconductor surface, under the gate, is $\phi_s = 2\phi_f$ volts given $N_d^* = N_a$ and no source voltage. Therefore the potential applied to the gate electrode must exceed the surface potential ($\phi_s = 2\phi_f$) in order to start filling the depleted channel with conduction electrons. The gate threshold voltage is $\phi_s$ in general (Equation 7F) and $2\phi_f$ in particular when $N_d^* = N_a$. This is a very simple criterion for threshold voltage when compared to the threshold criteria for a conventional MOSFET. The nominal grounded source Fermi-FET configuration completely eliminates the oxide voltage term (Equation 10) characteristic of conventional MOS device threshold voltage. (Note that the origin of $L^*$ will be described in detail below):

$$V_t = \frac{L^*}{L}\frac{\sqrt{2e_s qN_a \phi_s}}{C_i} \tag{10}$$

The nominal Fermi-FET has a threshold voltage expression given by Equation 4 that includes effects of source voltage $V_s$. Elimination of the conventional MOSFET oxide threshold voltage component significantly enhances Fermi-FET performance. This is a result of eliminating threshold voltage dependance on channel length, oxide thickness, drain voltage, and the doping level of the semiconductor surface.

One method of preventing punch-through in short channel devices is to simply increase substrate doping. Threshold voltage for the Fermi-FET does not include the complex term Equation 10 and therefore low threshold voltage can be maintained virtually independent of substrate doping. Substrate doping affects threshold voltage in the Fermi-FET only slightly due to the logarithmic dependence of the Fermi potential term $\phi_f$. A method for further enhancing the resistance to punch-through will be described below.

Referring to Equation 9, the net gate voltage $V_g^* - V_t$ required to fill the I-channel with conduction electrons may be obtained. Since threshold voltage is $2\phi_f$, it follows that:

$$V_g^* - V_t = \frac{\sqrt{2e_s qN_a \phi_f}}{C_i} + \phi_f \tag{11}$$

When drain voltage $V_d$ is increased, (source at ground potential), a critical drain ("pinch-off") saturation condition is attained (described in detail below) for a given gate voltage $V_g$. Carrier concentration within the conduction channel diminishes to a minimum value at the drain. When "pinch-off" is achieved, drain current saturates. The saturation condition is illustrated by FIG. 1D.

The effects in the channel when gate voltage $V_g$ exceeds the "full" channel value $V_g^*$ will now be described. This analysis assumes an N-channel Fermi-FET device with source and substrate voltage at ground potential. When gate voltage $V_g > V_g^*$, channel conduction capability is enhanced by increasing the volume density of conduction electrons $N_p^*$ in the channel 15 above the donor value $N_d^* = N_a$. See FIG. 2D. Gate oxide potential $V_{ox}$ is proportional to the total channel charge where $qN_p^*Y_o$ where $N_p^*$ is the total volume concentration of conduction carriers in the enhanced channel. Since the implanted channel is N-type, the Fermi level is already close to the conduction band. The conduction energy band need not be bent down very far to increase the number of conduction carriers in the implanted channel region. The increase in surface potential $\phi_s$ needed to realize a carrier concentration $N_p^*$ greater than $N_a$ is $\phi_s = KT/q \ln(N_p^*/N_a)$. An increase in surface potential of 18 mv is required for the case where $N_p^* = 2N_a$.

In view of the Fermi-FET structure, it follows that most of the enhanced carrier concentration $(N_p^* - N_a)$ will be confined to a maximum depth prescribed by depth $Y_o$ of the implanted channel, because the ionized P-substrate region 16, located below the channel implant region 15, has a maximum potential $\phi_f$ at the junction between the implanted channel and the substrate when $N_d^* = N_a$. The remote location of the ionized substrate region from the surface and the junction potential $\phi_f$ results in a carrier concentration near the intrinsic value $N_1 = 1.5 \times 10^{10}$ cm$^{-3}$ for silicon. Thus a majority of the gate enhanced excess carrier concentration $(N_p^* - N_a)$ is located below the surface of the substrate and residues within the critical implant depth $Y_o$. If gate voltage $V_g$ is less than $V_g^*$, the implanted channel is only partially filled, a factor $F \leq 1$ applies. For enhanced channel conditions, $F > 1$. For the general condition $0 < F$:

$$V_g = F \frac{\sqrt{2 e_s q N_a \phi_f}}{C_1} + \phi_f (2 + F) \quad (12)$$

where
$F = N_p^*/N_a$, $$V_{ox} = \frac{1}{C_1} \sqrt{2 \phi_f e_s q F N_a},$$

$V_{ch} = \phi_f (1 + F)$, and
$V_j = \phi_f$.

From Equation 12 1 it may be seen that $V_g = V_t = 2\phi_f$ when the channel filling factor $F = N_p^*/N_a = 0$. Evaluating Equation 12 for the full channel condition, $F = 1$, under the following conditions.
Na $= 5 \times 10^{16}$ cm$^{-3}$
$\phi_f = 0.39$ volts
$e_s = 1 \times 10^{-12}$ Farads/cm
$q = 1.6 \times 10^{-19}$ Coulombs
$C_1 = 1.5 \times 10^{-7}$ Farads/cm$^2$
$Y_o = 9.87 \times 10^{-6}$ cm
$F = 1.0$
the following results are obtained:
$V_g^* = 1.69$ Volts $= 4.34 \; \phi_f$
$V_g^* - V_t = 0.916$ Volts $= 2.43 \; \phi_f$
$V_t = 2\phi_f = 0.78$ Volts
FIG. 3A is a plot of Equation 12 as a function $0 \leq F \leq 1$ for different values for acceptor concentration $N_a$. FIG. 3B is a plot of gate voltage $V_g$ as a function of F in the range $0 \leq F \leq 10$ and different substrate acceptor concentration $N_a$. When $F > 1$, excess carriers exist in the implanted channel and account for increased channel current. The linear behavior of $V_g$ with $F > 1$ should be noted. This linear relationship is a distinct and useful advantage of the Fermi-FET.

Equations 13A-13D present a comparison of threshold voltage for a conventional MOSFET with the ideal Fermi-FET and the deep and shallow versions resulting from errors introduced during channel implant.

$$V_{t-} = 2\phi_f + \frac{\sqrt{2}}{C_1} \sqrt{2 e_s q N_a \phi_f} \quad \text{Standard MOSFET} \quad (13A)$$

$$V_t = 2\phi_f \quad \text{Nominal Fermi-FET} \quad (13B)$$

$$V_t = 2\phi_f + \frac{F\sqrt{2}}{C_1} \sqrt{2 e_s q N_a \phi_f} \quad \begin{array}{l}\text{Shallow fermi-FET} \\ Y = Y_o(1 - F)\end{array} \quad (13C)$$

$$V_{t+} = 2\phi_f - \left(\frac{F}{C_1} \sqrt{2 e_s q N_a \phi_f} + \phi_f F^2\right) \begin{array}{l}\text{Deep Fermi-FET} \\ Y + Y_o(1 + F)\end{array} \quad (13D)$$

Method of Fabricating the Fermi-FET

Referring now to FIG. 4, a method of fabricating a Fermi-FET according to the invention of application Ser. No. 07/318,153 will now be described. In the method illustrated herein, a P-type polysilicon gate is provided for an N-channel Fermi-FET. Conversely, an N-type polysilicon gate is provided for a P-channel Fermi-FET. As described in detail below metal-semiconductor contact potentials may significantly influence threshold voltage of any FET including the Fermi-FET. To avoid this extraneous variation in threshold voltage, a polysilicon gate is provided.

Referring now to FIG. 4A. A portion of p-substrate region 11 having acceptor concentration $N_a$ is illustrated. This substrate region may be formed by implanting and driving in a dopant in an unmasked area of an intrinsic 4 $\mu$ silicon epitaxial layer grown on a silicon, sapphire or other substrate. Thick and thin oxide layers 17 and 14 respectively are also shown. All P-channel devices are covered with photo-resist material (not shown) while low energy N-type ions (phosphorous or arsenic for example) are implanted in the direction shown by arrows 26 through the thin oxide layer 14, into the surface of the P-doped substrate. This implant provides an N-type channel region 15 with proper depth $Y_o$. The implant dose must also be controlled such that the average doping value achieves the condition; $N_d^* = \alpha N_a$, where $N_d^*$ is defined by Equation 3C. P-channel implant follows similar procedures except opposite ions are implanted. This implant step is critical for both the P- and N-channel devices. Care must be exercised to achieve the proper implant energy and dose.

Figure 4B:
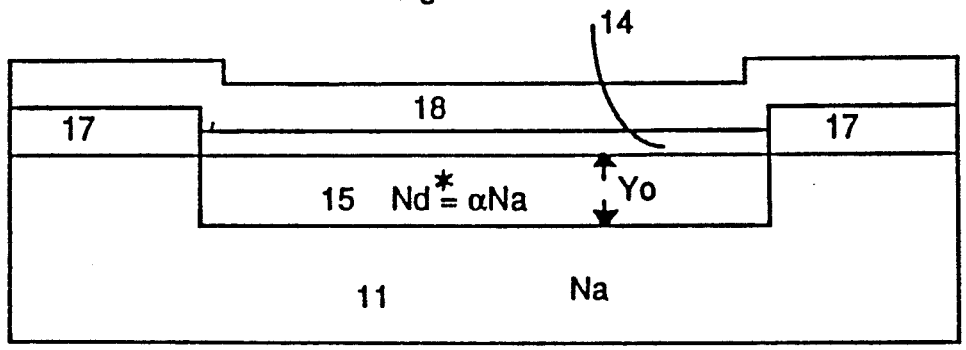

Referring to FIG. 4B, after appropriate masking and implanting both P- and N-channels 15 through the thin oxide region 14, all photoresist material is removed and intrinsic polysilicon 18 is deposited over the entire surface of the wafer.

It will be understood that the wafer may contain both P- and N-channel areas. While these figures show only N-channel areas, the P-channel areas may be formed as follows: Regions of the wafer containing intended P-channel devices, for example, may be masked with photoresist material leaving polysilicon exposed that overlays the N-channel devices. P-type ions (e.g. Boron) may then be implanted into the exposed polysilicon layer converting intrinsic polysilicon to P++ type. Then the photoresist masking material, covering the P-channel devices, may be removed and a new masking layer of photoresist material may be deposited over all N-channel devices. N-type ions are then implanted into the exposed polysilicon overlaying the P-channel devices, converting those polysilicon regions to N++ type. The energy of both doping implants must be low enough for the given thickness of the polysilicon layer, not to penetrate the full depth of that layer. The next step in the process is to remove the photoresist material. This step is then followed by covering the entire exposed polysilicon surface with photoresist material. The depth must be thick enough to block subsequent implantation from penetrating non-etched regions of this barrier layer.

Figure 4C:
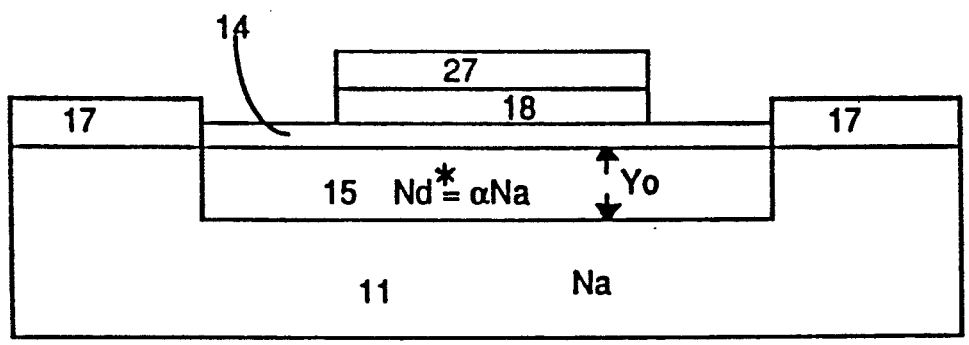

Referring now to FIG. 4C, a self-aligned poly gate mask 27 is applied next. This gate mask is aligned to lie in the center region of the implanted P- and N-channel devices, and provides the definition for the polysilicon gate. Next all of the exposed barrier and polysilicon layers are etched away leaving the appropriately doped polysilicon gate region with an overlaying photoresist layer as shown in FIG. 4C.

Figure 4D:
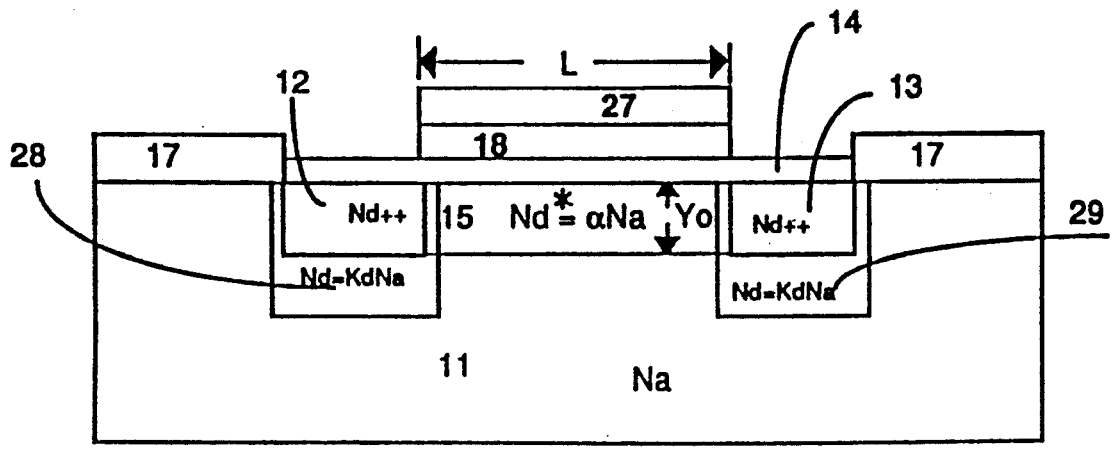

Referring now to FIG. 4D, photoresist material is then applied to mask the P-channel devices while drain and source contact regions 12 and 13 respectively and optional field reducing regions 28 and 29 are implanted in the N-channel devices. The functions of field reducing regions 28 and 29 will be described below. Then this photoresist material is removed from the P-channel devices and new material applied over the N-channel devices. The P-type source and drain regions of the P-channel devices are then implanted. The photoresist used to mask the N-channel devices is then removed and the source and drain regions of the P-channel devices are formed. An oxidation step may then form oxide on the side-walls of the polysilicon gates previously defined and to anneal the implants. This oxidation also thickens the oxide layer over the source and drain regions. The remaining steps in the process need not be described here since they comprise well known and conventional steps for fabricating FET devices. These process steps include removal of oxide over the source, drain, gate, and substrate contact regions, and the application of surface passivation and contact metal to these exposed regions.

An alternative method of fabricating Fermi-FETs according to the invention of application Ser. No. 07/318,153, using in-situ poly-gate doping will now be described. According to this method, after appropriate masking and implanting both P- and N- channels through the thin oxide region, all photoresist material is removed and in-situ P+ doped polysilicon layer is deposited over the entire surface of the wafer as shown in FIG. 4B. The dopant density of the P+ polysilicon should be high enough to permit Ohmic-metal contact to its surface. P-channel areas may be formed in these same processes as follows. Regions of the wafer containing intended N-channel devices are masked with photo-resist material leaving polysilicon exposed that overlays the P-channel devices. N-type ions such as phosphorous or arsenic are then implanted into the exposed polysilicon layer converting the in-situ doped P+ poly-silicon to N type. The dopant density of the N-polysilicon should be high enough to permit Ohmic-metal contact to its surface.

Then the photo-resist masking material, covering the N-channel devices, is removed. The energy of the doping implant must be low enough for the given thickness of the polysilicon layer, not to penetrate the full depth of that layer. A subsequent anneal activates and homogenizes this implant concentration. The next step in the process is to remove the photo-resist material. This step is then followed by covering the entire exposed polysilicon surface with photoresist material. The depth of this barrier must be thick enough to block subsequent implantation from penetrating non-etched regions. The self-aligning poly gate mask is applied next. The remaining steps are the same as previously described.

Fermi-FET Channel Doping Considerations

The effects of channel implant concentration $N_c = \alpha N_s$ has a significant effect on drain current properties of the Fermi-FET device. Pinch-off voltage has already been described for the special case where $\alpha = 1$. This restricted the implant concentration (Equation 3C) to equal the substrate concentration with a critical depth characteristic of that condition. Below, the general expression for pinch-off Voltage $V_p$ for $\alpha$ in the range $1 > \alpha 1$ is provided (FIG. 6). Computer plots of n-channel devices are also presented for $N_a = 1e^{17}$ and $\alpha = 0.2, 1.0,$ and $5.0$ (FIG. 5). Referring to these figures, it will be seen that Fermi-FET devices with low pinch-off voltage are attained when $\alpha > 1$. A preferred value is $\alpha = 2$. This value for $\alpha$ leads to high transconductance and low saturation drain conductance for sub-micron channel length devices.

The general expression for pinch-off voltage is as follows:

$$V_p = \frac{V_g - V_t}{\eta}\left(1 - \frac{1}{M_s^3}\right) + \frac{2K_1}{\eta}\left(1 + \frac{K_1}{\eta \phi_s}\right) - \frac{2K_1}{\eta^2 \phi_s}\sqrt{\eta \phi_s (V_g - V_t)\left(1 - \frac{1}{M_s^3}\right) + (K_1 + \eta \phi_s)^2} \quad (14)$$

where $$\eta = \frac{\alpha}{\alpha + 1}$$

$$\phi_s = 2\phi_f + \frac{KT}{q} \text{LN } \alpha$$

$$A = A_1 = \frac{1}{C_i}\sqrt{2qN_s \phi_s \left(\frac{\alpha}{\alpha + 1}\right)e_s}$$

$$K_1 = \frac{A}{2} + \frac{\phi_s}{\alpha + 1}$$

$$M = \left(\frac{\mu_0 E_i}{V_{sat}}\right)^{3/2}$$

$$V_t = \phi_s$$

Figure 5A:
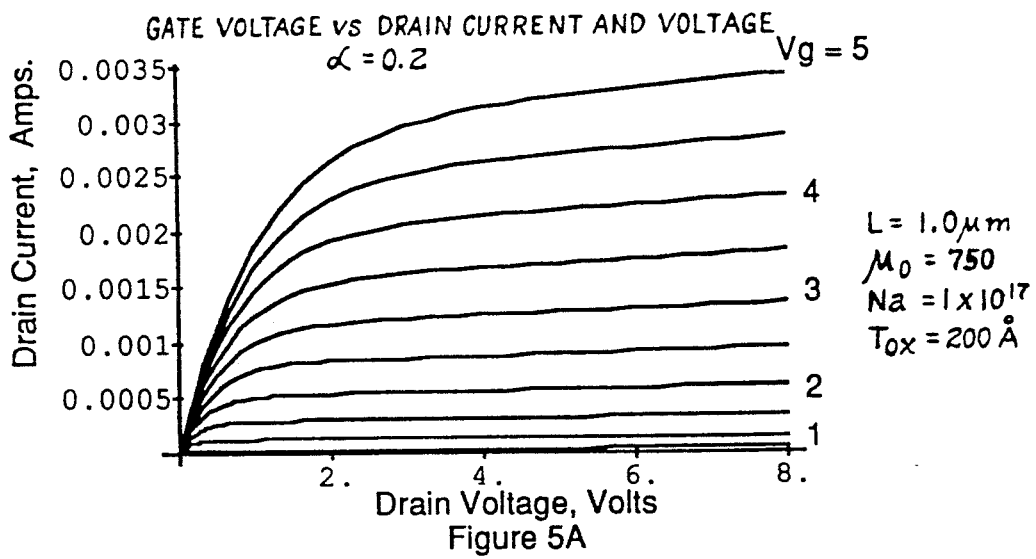
FIGS. 5A-5C graphically illustrate drain current versus drain voltage for various values of gate voltage according to the invention of application Ser. No. 07/318,153 now U.S. Pat. No. 4,990,974.
Figure 5B:
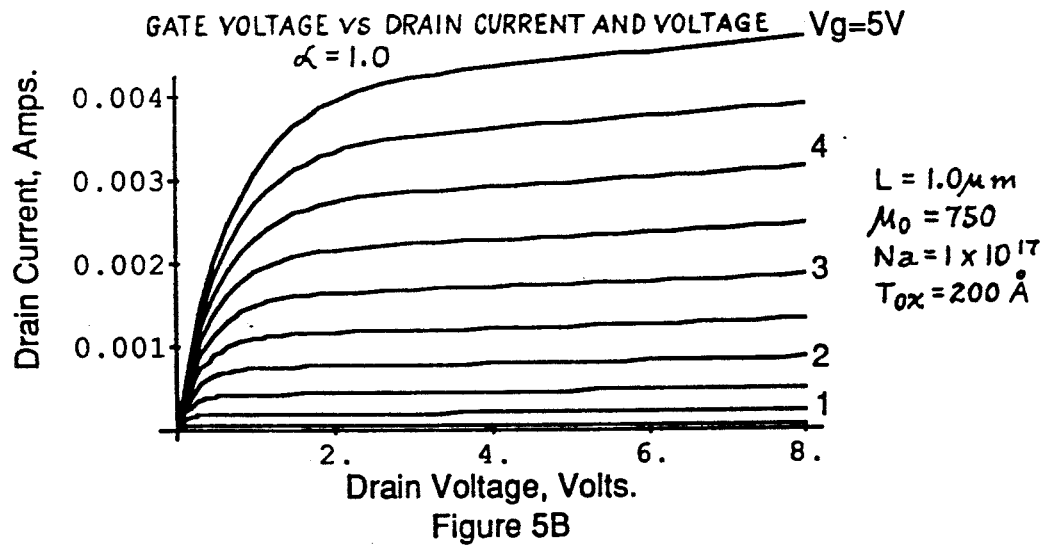
Figure 5C:
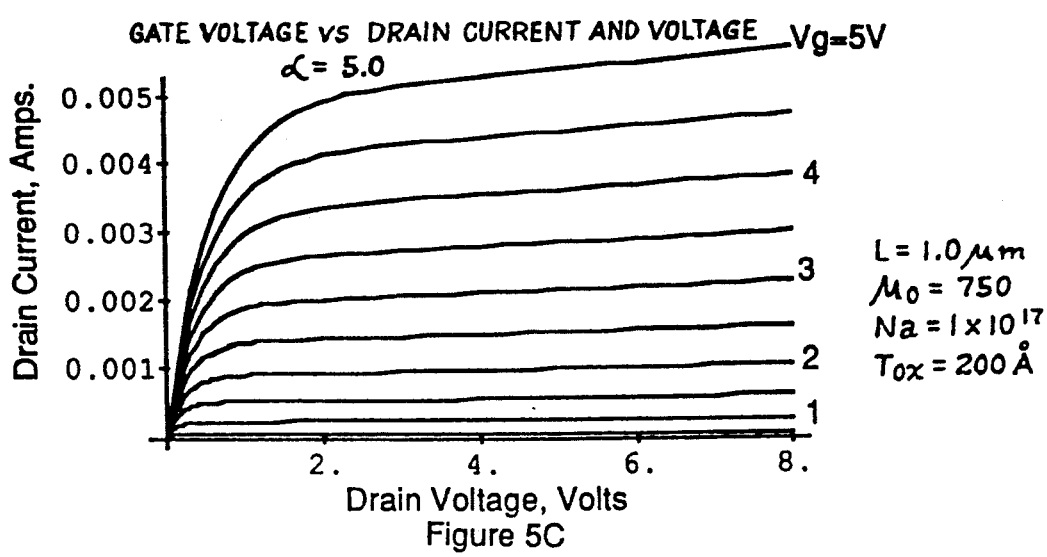

Referring now to FIG. 5A, a plot of gate voltage as a function of drain current and drain voltage for channel length of 1 μm, $\mu_o = 750$, $N_a = 1 \times 10^{17}$, $T_{ox} = 200$ Å, and $\alpha = 0.2$ is provided. Gate voltage is shown in steps of 0.5 V, starting at 0 V. FIG. 5B presents the same series of plots under the same conditions except that $\alpha = 1.0$. FIG. 5C presents the same series of plots for $\alpha = 5.0$.

Figure 6A:
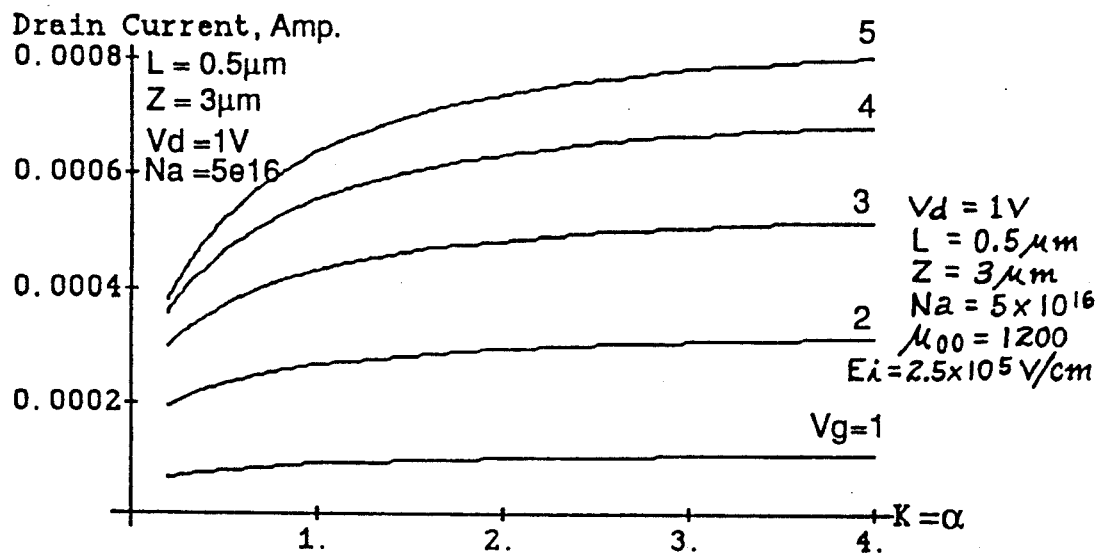
FIGS. 6A-6B graphically illustrate drain current as a function of the channel implant factor for various values of gate voltage according to the invention of application Ser. No. 07/318,153 now U.S. Pat. No. 4,990,974.
Figure 6B:
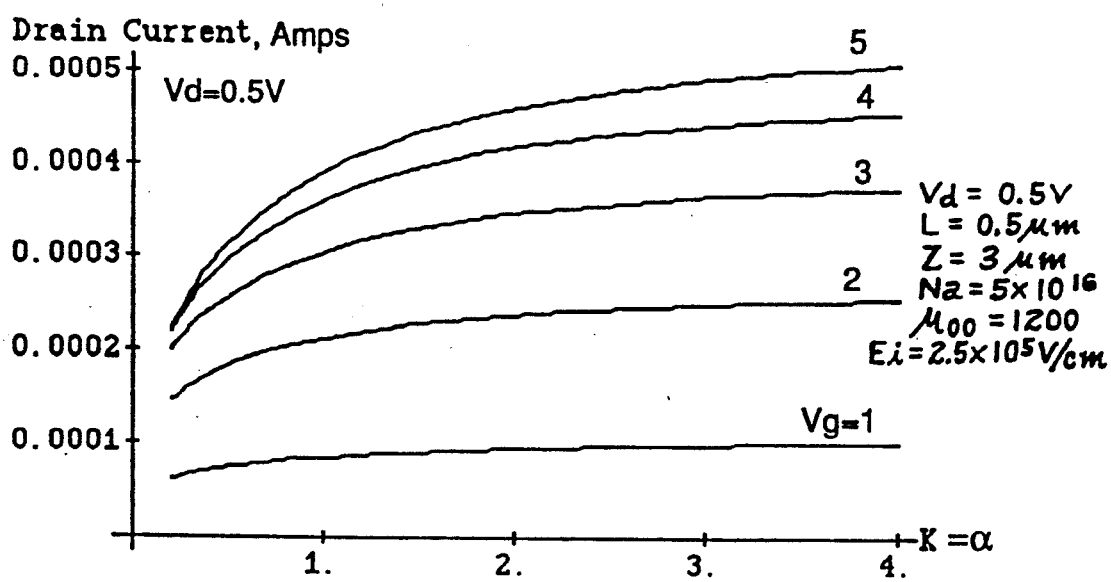

The computer generated plots of FIG. 6 illustrate the influence of channel implant factor $\alpha$ on the rising current (low drain voltage) property of the Fermi-FET device. FIG. 6A illustrates drain current as a function of channel implant factor $\alpha$ with $V_d = 1$ V, $L = 0.5$ μ, $Z = 3$ μ and 1 Volt per step for gate voltage, $N_a = 5 \times 10^{16}$, $\mu_{pp} = 1200$, $E_i = 2.5 \times 10^5$ V/cm. FIG. 6B shows drain current as a function of channel implant factor o with $V_d = 0.5$ V, $L = 0.5$ μ, $Z = 3$ μ, 1 Volt per step for gate voltage, $N_a = 5 \times 10^{16}$, $\mu_{oo} = 1200$, $E_i = 2.5 \times 10^5$ V/cm. It is apparent that most of the change occurs when $\alpha = N_c/N_s < 2$. i.e., Drain resistance decreases with increasing $\alpha$. $N_c$ is the implanted channel impurity concentration and $N_s$ represents the substrate impurity concentration, Ions/cm$^3$. Accordingly, in designing Fermi-FET devices, one should strive to use a channel implant factor $\alpha$ of about 2.0.

FIG. 7 illustrates the junction between the implanted channel 15 and the substrate 11 of FIG. 1A. The peak electric field $E_o$ and potential $\phi_o$ are shown at the stochastic junction between the implant and the substrate.

The depletion depth developed in the substrate is $Y_p$ and the depleted implant depth is defined as $Y_n$. Since $$E_o = \frac{qN_a}{e_s} Y_p \text{ and} \tag{15}$$

$$\phi_o = \frac{qN_a}{2e_s} Y_p^2. \tag{16}$$

therefore $$Y_p = \sqrt{\frac{2e_s}{qN_a} \phi_o}. \tag{17}$$

$\phi_o$ may be expressed In terms of surface potential $\phi_s$. From FIG. 7 the following is obtained:

$$\phi_s = \phi_o + 1/2 \, Y_n E_o \tag{18}$$

Substituting for $E_o$:

$$\phi_s = \phi_0 + \frac{1}{2} Y_n \frac{N_a}{N_d} \left(\frac{qN_a}{e_s}\right) Y_p. \tag{19}$$

Based on the definition of $\phi_o$ the following is obtained:

$$\phi_0 = \phi_s \frac{N_d}{N_d + N_a} \text{ and} \tag{20}$$

$$Y_p = \sqrt{\frac{2e_s}{qN_a}\left(\frac{N_d}{N_d + N_a}\right)\phi_s} \tag{21}$$

Similarly $$Y_n = \sqrt{\frac{2e_s}{qN_d}\left(\frac{N_a}{N_d + N_a}\right)\phi_s} \tag{22}$$

Now, if the implant concentration varies in depth $N_d(Y)$, then:

$$E(y) = -\frac{q}{e_s} \int_0^Y N(y)dy, \text{ and} \tag{23}$$

$$\phi_0 = \frac{q}{e_s} \int_0^{Y_n} dy \int_0^{Y_n} N(y)dy. \tag{24}$$

Multiplying Equation 24 top and bottom by $Y_n$ $$\phi_0 = \frac{q}{e_s} \int_0^{Y_n} Y_n dy \frac{1}{Y_n} \int_0^{Y_n} N(y)dy \tag{25}$$

The last integral in Equation 25 represents an average value. Thus, $$\phi_0 = \frac{q}{2e_s} Y_n^2 N_d^* \tag{26}$$

$$Y_n = \sqrt{\frac{2e_s}{qN_d^*} \phi_0} \tag{27}$$

Accordingly, the necessary conditions for the channel implant at depth $Y_n$ are;

$$\frac{1}{Y_n} \int_0^{Y_n} N_d(y)dy = N_d^* = \alpha N_a \tag{28}$$

After an anneal process depth spreading may be expected, so that $$\frac{1}{Y_n'} \int_0^{Y_n'} N_d(y)dy = N_d^{*'} \tag{29}$$

The integrals of Equations 28 and 29 must be the same since charge is conserved. Therefore, $$Y_n N_a = Y_n' N_d^{*'} \tag{30}$$

$$Y_n' = \frac{N_a}{N_d^{*'}} Y_n \tag{31A}$$

$$N_d^{*'} = \frac{Y_n}{Y_n'} N_a \tag{31B}$$

The depth of the depletion region in the substrate, $Y_p$ remains the same, before and after the anneal, since the total implant charge is unaltered.

$$q \int_0^{Y_n} N(y)dy = q \int_0^{Y} N'(y)dy \tag{32}$$

Tables 2 and 3 illustrate values of implant channel depth $Y_o$ in cm for various values of $\alpha$ and $N_s$.

TABLE 2

| $\alpha = N_c/N_s$ | $Y_o @ N_a = 1 \times 10^{16}$ | $Y_o @ N_a = 1 \times 10^{17}$ |
|---|---|---|
| 1.0000000 | 2.0876457e-05 | 7.1460513e-06 |
| 1.2500000 | 1.7677658e-05 | 6.0474366e-06 |
| 1.5000000 | 1.5360821e-05 | 5.2522975e-06 |
| 1.7500000 | 1.3597864e-05 | 4.6475990e-06 |
| 2.0000000 | 1.2207786e-05 | 4.1710276e-06 |
| 2.2500000 | 1.1081721e-05 | 3.7851283e-06 |
| 2.5000000 | 1.0149919e-05 | 3.4659164e-06 |
| 2.7500000 | 9.3654684e-06 | 3.1972686e-06 |
| 3.0000000 | 8.6955825e-06 | 2.9679200e-06 |
| 3.2500000 | 8.1166127e-06 | 2.7697490e-06 |
| 3.5000000 | 7.6110519e-06 | 2.5967449e-06 |
| 3.7500000 | 7.1656491e-06 | 2.4443597e-06 |
| 4.0000000 | 6.7701829e-06 | 2.3090859e-06 |
| 4.2500000 | 6.4166374e-06 | 2.1881738e-06 |
| 4.5000000 | 6.0986353e-06 | 2.0794361e-06 |
| 4.7500000 | 5.8110371e-06 | 1.9811105e-06 |
| 5.0000000 | 5.5496537e-06 | 1.8917608e-06 |
| 5.2500000 | 5.3110354e-06 | 1.8102046e-06 |
| 5.5000000 | 5.0923150e-06 | 1.7354593e-06 |
| 5.7500000 | 4.8910894e-06 | 1.6667014e-06 |

TABLE 3

| $\alpha = N_c/N_s$ | $Y_o @ N_a = 3 \times 10^{16}$ | $Y_o @ N_a = 6 \times 10^{16}$ |
|---|---|---|
| 0.50000000 | 2.0226885e-05 | 1.4648398e-05 |
| 0.75000000 | 1.5399139e-05 | 1.1148451e-05 |
| 1.0000000 | 1.2537030e-05 | 9.0743104e-06 |
| 1.2500000 | 1.0612724e-05 | 7.6801600e-06 |
| 1.5000000 | 9.2194980e-06 | 6.6709817e-06 |
| 1.7500000 | 8.1596633e-06 | 5.9034214e-06 |
| 2.0000000 | 7.3241990e-06 | 5.2984395e-06 |
| 2.2500000 | 6.6475555e-06 | 4.8085218e-06 |
| 2.5000000 | 6.0877463e-06 | 4.4032386e-06 |
| 2.7500000 | 5.6165406e-06 | 4.0621323e-06 |
| 3.0000000 | 5.2142104e-06 | 3.7709088e-06 |
| 3.2500000 | 4.8665300e-06 | 3.5192616e-06 |
| 3.5000000 | 4.5629693e-06 | 3.2995624e-06 |
| 3.7500000 | 4.2955597e-06 | 3.1060392e-06 |
| 4.0000000 | 4.0581550e-06 | 2.9342402e-06 |

TABLE 3-continued

| $a = N_c/N_s$ | $Y_o @ N_a = 3 \times 10^{16}$ | $Y_o @ N_a = 6 \times 10^{16}$ |
|---|---|---|
| 4.2500000 | 3.8459362e-06 | 2.7806752e-06 |
| 4.5000000 | 3.6550694e-06 | 2.6425677e-06 |
| 4.7500000 | 3.4824655e-06 | 2.5176806e-06 |
| 5.0000000 | 3.3256069e-06 | 2.4041908e-06 |
| 5.2500000 | 3.1824202e-06 | 2.3005973e-06 |

Controlling Punch-through and Avalanche Breakdown Voltage

There are two voltage breakdown phenomenon that plague the success of short channel FET technology. Punch-through occurs when the depletion boundary surrounding the drain touches the depletion boundary surrounding a grounded source. This condition causes injection to occur at the source-substrate junction. Impact ionization occurs when drain voltage reaches a value that stimulates the generation of electron-hole pairs at the junction between the drain diffusion and substrate. Electron-hole pair generation gives rise to an avalanche break-down mechanism that produces a rapid increase in drain current. Substrate current flows when avalanche breakdown occurs in support of the increase in drain current.

According to the invention of application Ser. No. 07/318,153 now U.S. Pat. No. 4,990,974, substrate dopant level and the subdiffusion-drain implant doping factor $K_d$, may be used simultaneously to control both voltage breakdown mechanisms.

Referring now to FIG. 8 an FET structure having subdiffusion regions to minimize punch-through and avalanche breakdown is shown. P-doped substrate 11 has an acceptor concentration $N_a$. Source and drain regions 12 and 13 respectively are heavily doped N-type regions. N-doped channel 15 has doping concentration $N_d$. In a preferred embodiment channel 15 meets the requirements of a Fermi-FET Equation 3A, although a conventional FET may also be employed. Associated with source 12 and drain 13 are source and drain subdiffusion regions 28 and 29 respectively, having donor doping concentrations $N_d = K_d N_a$. It will be understood by those having skill in the art that punch-through and avalanche breakdown are more likely to occur at the drain rather than the source, so that a drain subdiffusion 29 alone may be employed.

The value of the subdiffusion implant doping factor $K_d$ will now be described. Increasing punch-through break-down requires raising substrate doping $N_a$. On the other hand, break down voltage due to impact ionization is inversely dependant on substrate doping. The solution to this dilemma is to control the dopant concentration $K_d$ of the subdiffusion region, FIG. 8, in the vicinity of the substrate such that the peak field crossing the substrate to subdiffusion junction is minimized for a given drain voltage. The ionization field of approximately $3 \times 10^5$ Volts per cm is eventually reached for some drain voltage. The object is to operate Fermi-FET devices below this field value with as high a drain voltage as possible. Equation 33 below describes avalanche break-down as a function of the ionizing field $E_i$, substrate doping $N_a$, and Diffusion dopant factor $K_d$.

$$V_A = \frac{E_i^2 e_s}{2 q N_a} \left( \frac{K_d + 1}{K_d} \right) \tag{33}$$

$$V_P = V_0 \left[ \left( \frac{L}{\sqrt{\frac{2 e_s V_0}{q N_a} \left( \frac{K_d}{K_d + 1} \right)}} - 1 \right)^2 - 1 \right] \tag{34}$$

$$K_d = \frac{N_d}{N_a} \tag{35}$$

$$W_{no} = \sqrt{\frac{2 e_s (V_0 + V_P)}{q N_a K_d (K_d + 1)}} \quad \text{Minimum Depth For Subdiffusion} \tag{36}$$

$$V_0 = \frac{KT}{q} \ln\left( \frac{K_d N_a^2}{N_i^2} \right) \quad \text{Contact Potential} \tag{37}$$

Figure 9A:
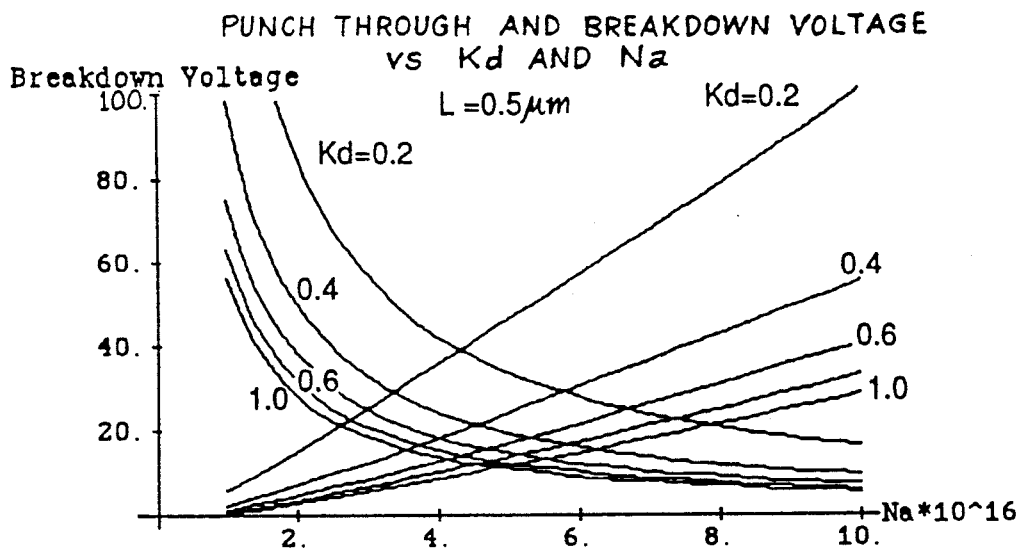
FIGS. 9A-9F graphically illustrate maximizing avalanche and punch-through breakdown voltages according to the invention of application Ser. No. 07/318,153 now U.S. Pat. No. 4,990,974.

Equation (34) describes breakdown voltage $V_p$ due to the punch-through mechanism. The dependance of these breakdown mechanisms on substrate doping have opposite effects. One voltage increases while the other decreases. Maximum substrate doping occurs when Equations 34 and 35 are equal for a given subdiffusion concentration factor $K_d$. The drain sub-diffusion concentration factor $K_d$, for dopant concentration below the depth of the implanted channel region of the Fermi-FET, has a pronounced effect on drain breakdown voltage. This effect is illustrated in FIG. 9A. Breakdown is illustrated for several values for the concentration factor $K_d$. The nominal value $E_i$ for silicon is $2.5 \times 10^5$ V/cm at room temperature for the computed range of substrate doping $N_a$. Channel length L was 0.5 $\mu$. The minimum value for the subdiffusion implant depth $W_{no}$, (FIG. 8), was computed assuming complete depletion at a drain voltage $V_d = 10$ V and 6 V and is defined in FIG. 9D and 9E respectively as a function of $N_a$ and $K_d$.

Referring to FIG. 9A, both punch-through (rising curve) and avalanche breakdown voltage (falling curve) are shown as a function of $K_d$ and $N_a$. Their intersection specifies the maximum substrate doping level $N_a$ that simultaneously maximizes both breakdown voltages. Factor $K_d$ is shown in the range $0.2 < K_d < 1$. Higher breakdown voltage occurs when $K_d = 0.2$. The channel is 0.5 $\mu$ long. It is apparent that a breakdown of 20 Volts is quite possible for this channel length. Ionization field $E_i = 2.5 \times 10^5$ V/cm.

Figure 9B:
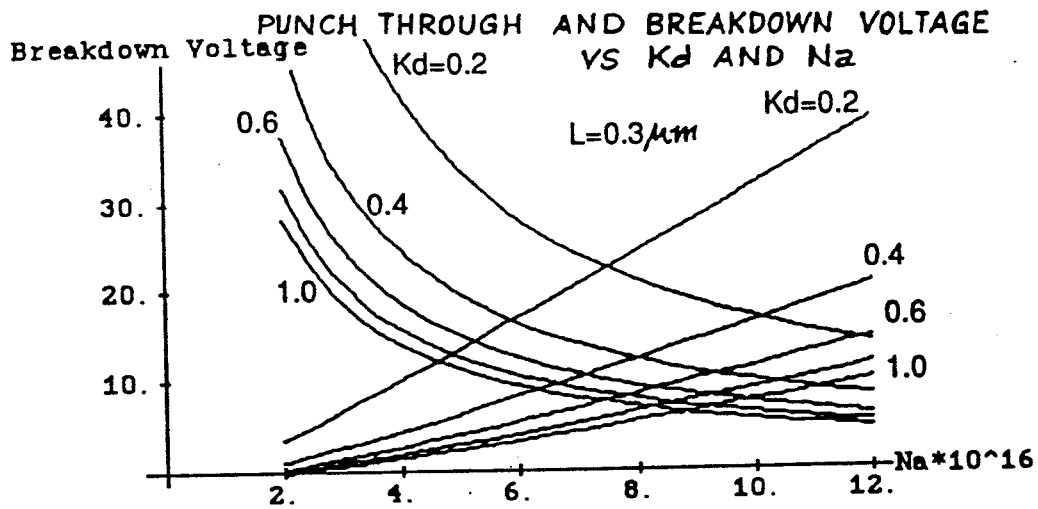

Referring to FIG. 9B both punch-through (rising curve) and avalanche breakdown voltage (falling curve) is shown. Their intersection specifies the maximum substrate doping level $N_a$ that maximizes both breakdown voltages. $K_d$ is shown in the range $0.2 < K_d < 1$. The highest breakdown voltage occurs when $K_d = 0.2$. The channel is 0.3 $\mu$ long. It is apparent that a breakdown of 20 Volts is quite possible for this channel length.

Figure 9C:
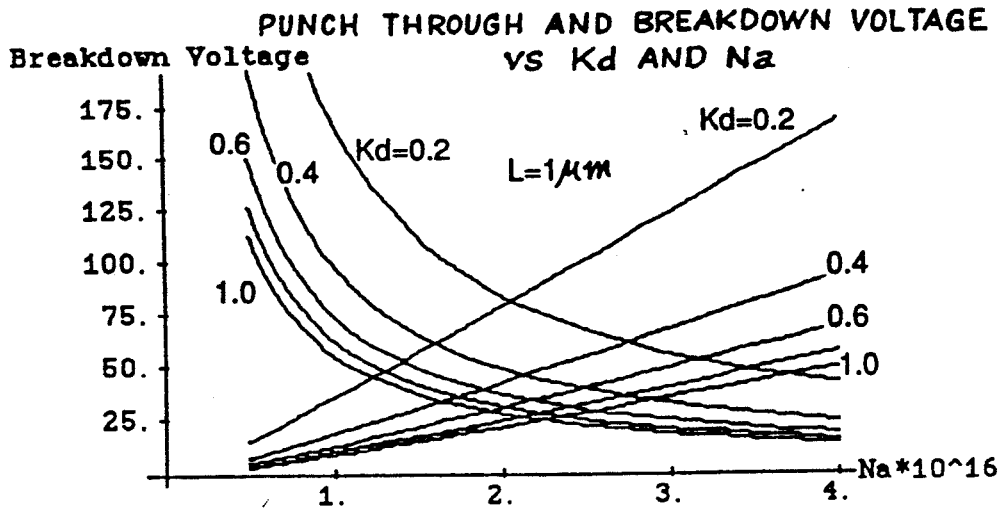
Figure 9D:
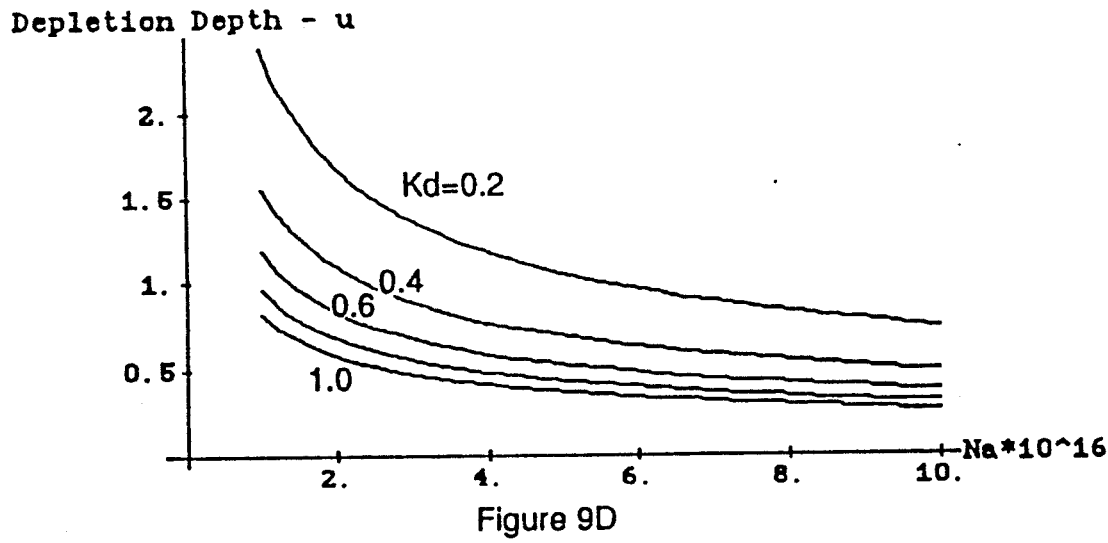
Figure 9E:
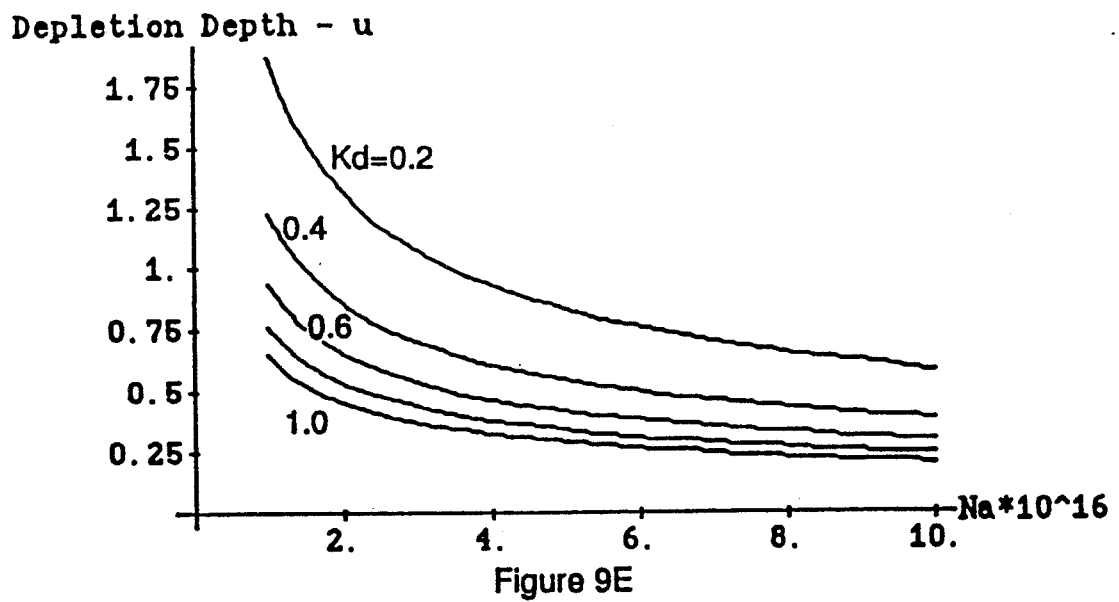

Referring now to FIG. 9C both punch-through (rising curve) and avalanche breakdown voltage (falling curve) are shown for a channel $L = 1$ $\mu$m. FIGS. 9D and 9E illustrate the minimum depth $W_{no}$ of the sub-diffusion region given 10 and 6 Volts on the drain for full depletion respectively. The highest running parameter is $K_d = 0.2$. The lowest $K_d = 1.0$.

Subdiffusion concentration factor $K_d$ should correspond approximately to twice the channel length L in number value. For example, if $L = 0.5$ $\mu$ then $K_d = 1$. Under these circumstances, break-down voltage is about 10 V for $E_i = 2.5 \times 10^5$ V/cm. The nominal substrate dopant concentration $N_a$ is about $4.6 \times 10^{16}$ cm$^{-3}$ for a channel length, $L = 0.5$ μ, $N_a = 8 \times 10^{16}$ for $L = 0.3$ μ, and $N_a = 2 \times 10^{16}$ for a channel length of 1 μm.

The channel implant factor α for the Fermi-FET is based on substrate concentration $N_s$ and the desired channel depth $Y_o$. The nominal value for α is about 2.0. The heavily doped drain and source contact diffusions, FIG. 8, should have the same depth as the channel, and have resistance less than 200 Ω per square. Some latitude in this depth is provided by the choice of the channel implant factor α. For example, the source and drain contact diffusions may be up to twice as deep as the channel depth $Y_o$.

Figure 9F:
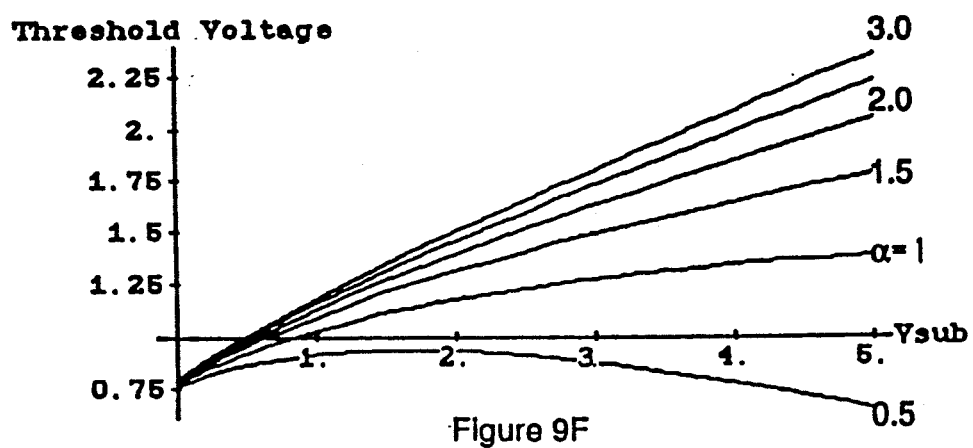

The Fermi-FET body effect, threshold voltage variation with substrate voltage, is dramatically influenced by the channel implant factor α. This effect with factor α is unique to the Fermi-FET and is illustrated in FIG. 9F for $N_s = N_a = 5 \times 10^{16}$/cm$^3$. FIG. 9F illustrates threshold voltage as a function of substrate voltage given $N_a = 5 \times 10^{16}$ and channel factor α as the running parameter; $\alpha = a^*n$, $a = 0.5$. Note that threshold is fairly flat if $\alpha = 0.7$, $T_{ox} = 120$ A.

Ohmic Contact Junction Potential Compensation

Figure 10A:
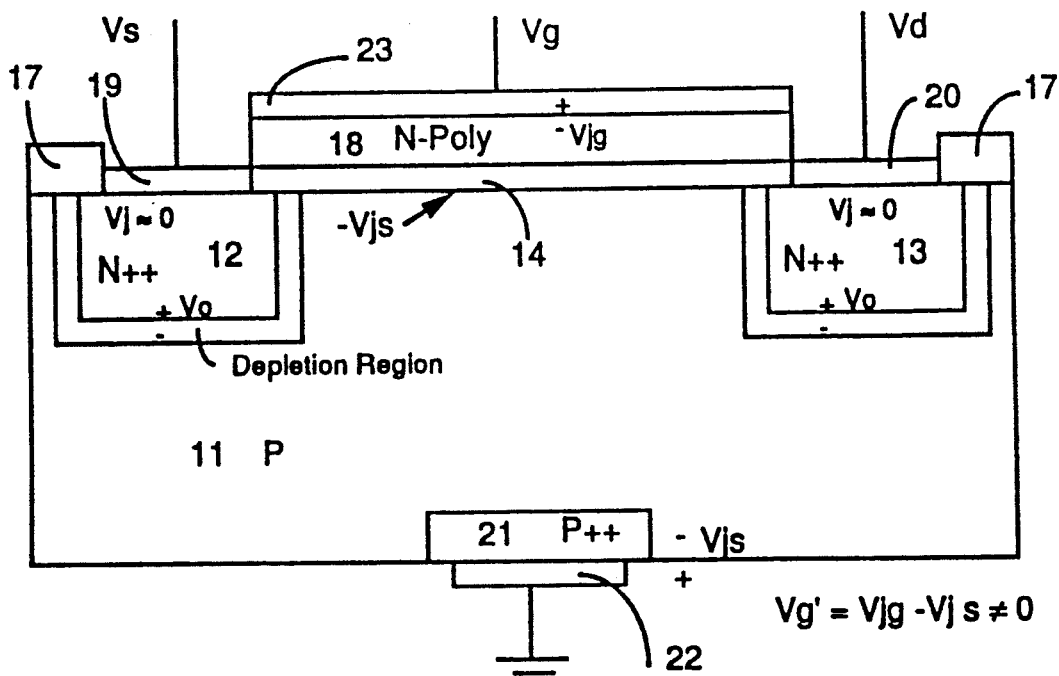
FIGS. 10A-10D illustrate cross-sectional views of flat-band voltage compensation according to the invention of application Ser. No. 07/318,153 now U.S. Pat. No. 4,990,974.
Figure 10B:
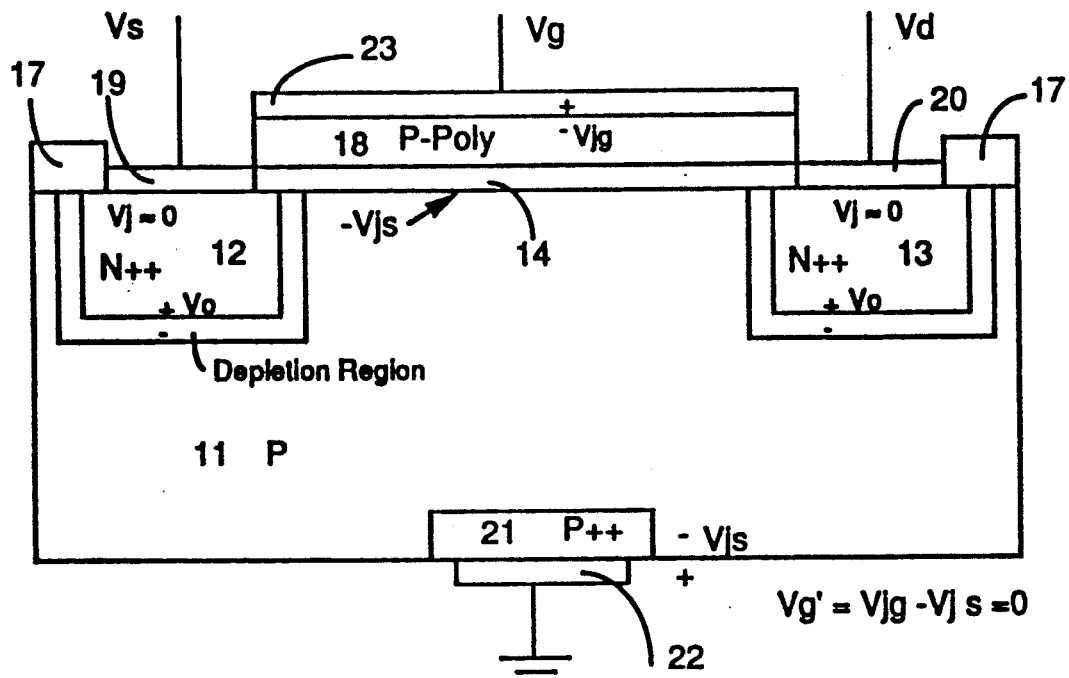
Figure 10C:
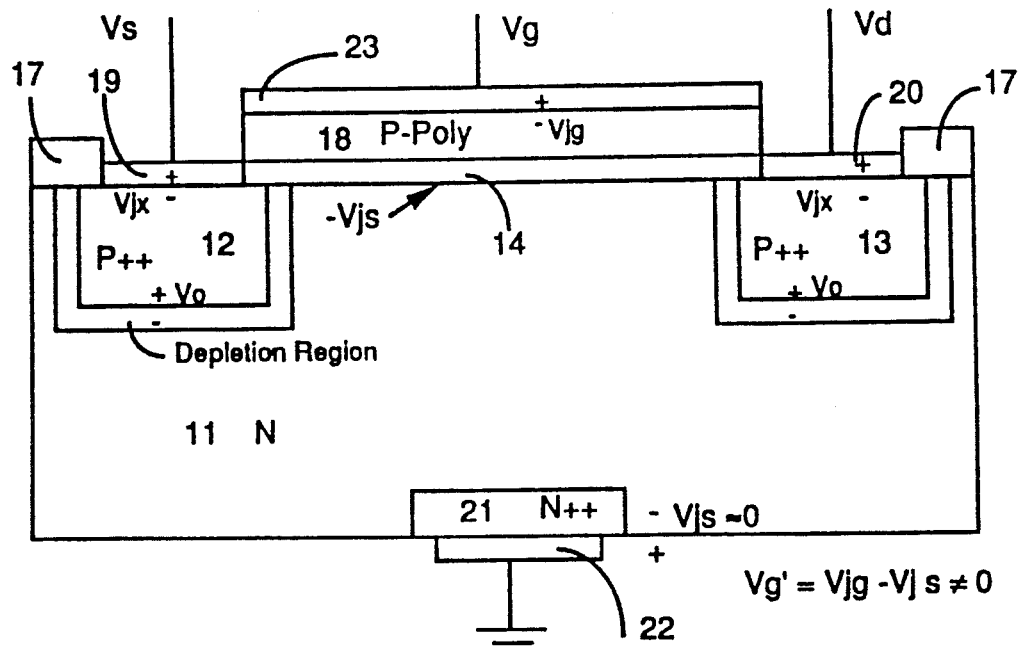
Figure 10D:
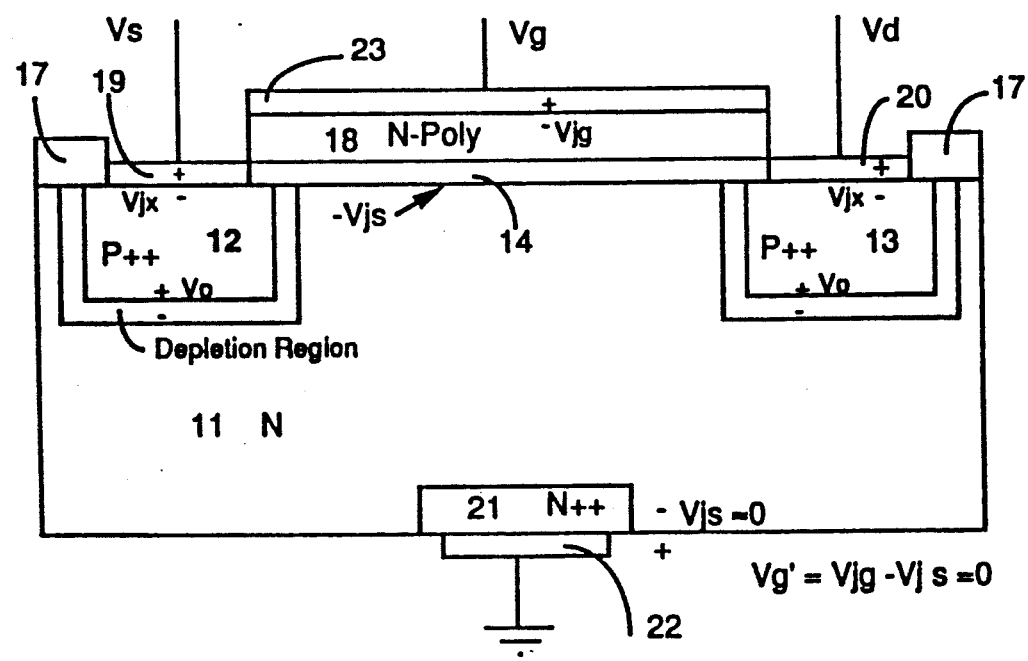

The effect of junction potentials of ohmic metal semiconductor contacts on threshold voltage and FET design will now be described. FIGS. 10A-10D illustrate various contact potentials that occur at the substrate-metal, diffusion-metal, and polysilicon gate-metal junctions. FIGS. 10A-10B illustrate N-channel devices and FIGS. 10C-10D illustrate P-channel devices.

The analysis presented heretofore assumes that drain, source, and gate voltages are referenced to the substrate potential. No provisions were made to include effects of metal contact potentials. It will become apparent from the following analysis that metal-polygate contact potential may be employed to compensate for metal-substrate flat-band voltage for both conventional and Fermi-FET devices. It will be shown that the doping polarity and concentration of the polysilicon gates, for both P- and N-channel devices may be chosen to compensate for substrate contact potential, thus eliminating this undesired source of threshold voltage.

Referring to the N-channel technology, FIGS. 10A and 10B, contact to the substrate 11 is made by depositing metal 22 on a heavily doped p++ region 21 provided at the surface of the substrate 11. A potential is developed across this P++ metal junction. The potential $V_{jx}$ is given below for metal to P- and N-type diffusions.

$$V_{jxp} = \frac{KT}{q} \ln\left(\frac{N_d^* N_a}{N_i^2}\right) \quad (38A)$$

$$V_{jxn} = \frac{KT}{q} \ln\left(\frac{N_d^*}{N_d}\right) \quad (38B)$$

$N_a$ is the acceptor concentration of the P++ pocket, $N_d$ is the donor concentration, and N is the effective density of conduction electrons in the contacting metal. The depletion depth within the P++ pocket region, resulting from metal contact, must be shallow by design to allow electron tunneling to occur in order to achieve Ohmic-contact properties of the metal-semiconductor junction. Depletion depth within the P++ pocket region is approximated by:

$$X_d = \sqrt{\frac{2 e_s V_j}{q N_a}\left(\frac{N_d^*}{N_d^* + N_a}\right)} \quad (39)$$

This depletion depth needs to be less than about $1.5 \times 10^{-6}$ cm in order to support the tunneling mechanism. Assuming $N_d = 10^{21}$ cm$^{-3}$ and $N_a = 10^{19}$ cm$^{-3}$, then $V_{jx} = 1.17$ Volts, $X_d = 1.17 \times 10^{-6}$ cm, and the electric field at the junction is $qN_a X_d/e_s = 1.87 \times 10^6$ V/cm. A significant result is realized when the aluminum-substrate contact is grounded. This ground connection places the substrate potential below true ground potential. i.e. $-V_{js}$.

Accordingly, to assess true MOSFET threshold voltage one of the quiescent substrate to gate voltage must be considered. Referring to FIG. 10A, the N-polysilicon gate-metal contact potential, $KT/q \ln(N/N_d)$, is negligible, 150 mv, and assumed to be small compared to $V_{js}$. Therefore grounding the gate yields a net positive gate to substrate voltage $V_{js} = 1.02$ Volts. Therefore the total MOSFET threshold voltage is reduced by the difference in contact potential $V_{js} - V_{jg}$. Given a grounded source N-channel Fermi-FET provided with a N-poly gate, threshold voltage $V_t$ would be $V_t = 2\phi_f - V_{js}$ and quite likely, threshold voltage will have a net negative value.

Referring now to FIG. 10B, it is shown that the poly-gate 18 is doped P++. If the doping density of the polysilicon gate body region is identical to the substrate doping, and aluminum is used in both cases for contacts 22 and 23, the polysilicon-aluminum contact potential will match the metal-substrate junction voltage $V_{jx}$. For this case, when the gate electrode 23 is grounded, the net contact induced threshold potential is $V_{jg} - V_{js} = 0$. Thus, no extraneous threshold potential exists, due to contacts, for any N-channel MOSFET configured with a P-polysilicon gate. The grounded source Fermi-FET device will simply have a threshold voltage $V_t = 2\phi_f$. Thus, an N-channel Fermi-FET structure needs a P-polysilicon gate to eliminate contact potentials from affecting threshold voltage.

The unconnected source and drain diffusion potential $V_j$ of the N-channel device is $V_j = V_o - V_{js}$ where $V_o$ is the source or drain diffusion-substrate junction potential. The potential contour integral through the substrate, from contact 19 to contact 22 is zero if the same metal is used for both contacts. Grounding the diffusion -aluminum contact and -substrate contact slightly reverse biases the diffusion substrate junction.

Referring now to FIGS. 10C and 10D, a P-channel device is illustrated. Substrate contact is made by depositing aluminum 22 on an N++ pocket 21 implanted at the surface of an N-type substrate 11. The junction potential $V_j$ of this Ohmic contact is given by Equation 38B since both materials are majority N-type. Therefore, grounding the aluminum contact 22, places the substrate surface, under the gate, slightly below ground potential.

Referring to FIG. 10C an aluminum contact 23 is made to a P-polysilicon gate. A junction potential $V_{jg}$ is developed across this contact that is similar in value to $V_{js}$ developed at the P-substrate-aluminum contact FIG. 10B. Therefore, grounding the P-channel gate places the gate potential, $-V_{jg}$ below the surface potential of the substrate. The effect is to lower threshold voltage of the P-channel device by this junction potential. This offset in threshold voltage is eliminated by the structure shown in FIG. 10D. In that structure an N-poly gate is used with a P-channel device. Any junction potential $V_{jp}$ developed across the aluminum-N-polysilicon junction can be made to be identical to the aluminum-substrate junction potential $V_{js}$. Grounding the aluminum contact on the N-poly gate eliminates gate to substrate potential and therefore no extraneous threshold voltage term exists due to metal contacts.

In conclusion, a significant contact potential exists between aluminum and P++ semiconductor material. In order to avoid introducing this contact potential as part of the threshold voltage, the following FET conditions must be met: N-channel FET's require a P-polysilicon gate, while P-channel FET's require a N-polysilicon gate.

The above described matching of implant doping eliminates extraneous threshold voltage as well as thermally introduced variations. It will be understood by those having skill in the art that the prior art has ignored or not totally understood the full implications of metal-semiconductor contact potentials (flat-band voltage).

Threshold Voltage Sources-Summary

Equations (40) and (46) reveal all important sources of threshold voltage for N- and P-channel FET devices.

N-Channel Technology $$V_t = \phi_s + \frac{1}{C_i} \sqrt{2 e_s q N_a \phi_s} - V_{cs} + V_{cg} \tag{40}$$

$$V_{cs} = \frac{KT}{q} \ln\left(\frac{N^* N_a}{N_i^2}\right) \tag{41}$$

$$\phi_s = \frac{KT}{q} \ln\left(\frac{N_a}{N_i}\right)^2 = 2\phi_f \tag{42}$$

$$V_{cg} = 0 \quad \text{if metal gate} \tag{43}$$

$$V_{cg} = \frac{KT}{q} \ln\left(\frac{N^*}{N_d}\right) \quad \text{if N-Poly} \tag{44}$$

$$V_{cg} = \frac{KT}{q} \ln\left(\frac{N^* N_a}{N_i^2}\right) \quad \text{if P-Poly} \tag{45}$$

P-Channel Technology $$V_t = -\phi_s - \frac{1}{C_i} \sqrt{2 e_s q N_d \phi_s} - V_{cs} + V_{cg} \tag{46}$$

$$\phi_s = \frac{KT}{q} \ln\left(\frac{N_a}{N_i}\right)^2 = 2\phi_f \tag{47}$$

$$V_{cs} = \frac{KT}{q} \ln\left(\frac{N^*}{N_d}\right) \tag{48}$$

$$V_{cg} = 0 \quad \text{if metal gate} \tag{49}$$

$$V_{cg} = \frac{KT}{q} \ln\left(\frac{N^*}{N_d}\right) \quad \text{if N-Poly} \tag{50}$$

-continued $$V_{cg} = \frac{KT}{q} \ln\left(\frac{N^* N_a}{N_i^2}\right) \quad \text{if P-Poly} \tag{51}$$

For the conventional grounded source enhancement FET, there are four separate threshold voltage terms. From left to right they are; surface potential $\phi_s$, oxide potential $V_{ox}$, flat-band voltage at the substrate-metal Ohmic contact $V_{cs}$, and flat-band voltage at the polysilicon gate Ohmio contact $V_{cg}$. Comparing Equation 40 with Equation 46, for N- and P-channel devices, it is evident that the polarity of both flat-band voltage terms is unaltered. Their magnitudes however are different.

Fermi-FET device design according to the invention of U.S. Pat. No. 4,990,974 completely eliminates oxide potential $V_{ox}$, the second term in Equations 40 and 46. However if the channel of the Fermi-FET is implanted with a dose greater than the nominal value, a fraction of the oxide potential term reappears but with a polarity opposite that indicated in Equation 40 and 46, as will be described below in connection with modifying Fermi-FET threshold voltage.

By examining Equations 40 and 46 it may be seen that threshold voltage for the Fermi-FET reduces to surface potential $\phi_s$ if both substrate and poly-gate flat-band voltages cancel one another. Equations 43 through 45 give expressions for poly-gate flat-band voltage $V_{cg}$ for N-channel devices given; a metal gate, and N+ or P+ polysilicon gates. Equations 48 through 51 give the appropriate expressions for p-channel devices. The net flat-band voltage, $V_{fb} = V_{cs} - V_{cg}$, approaches zero if the N-channel device is provided with a P-poly gate and the P- channel device is provided with an N-poly gate. Note that the dopant concentration at the surface of the poly gates must be high enough to achieve ohmic-metal contacts. The intrinsic carrier concentration $N_i^*$ of polysilicon is greater than that in crystalline silicon by about an order of magnitude. It is estimated that the intrinsic carrier concentration $N_i^*$ in polysilicon is about $1.8 \times 10^{11}$ cm$^{-3}$ at 300 degrees Kelvin. This value should be used when calculating flat-band voltage at metal - poly gate junctions.

Finally, it will be understood from the above analysis that conventional N- and P-channel FET devices should avoid use of metal gates. Instead they should be provided with contra-doped poly gates in order to achieve symmetric fabrication and equal threshold voltage. However, only the Fermi-FET device design eliminates oxide voltage from the threshold expression thereby attaining all of the performance advantages previously described.

The above analysis may be applied to specific examples as follows:

Case 1: Metal gate P- and N-channel MOS devices.

Threshold voltage for metal gate N- and P-channel devices becomes;

N-Channel $$V_{tn} = \phi_s + \frac{1}{C_i} \sqrt{2 e_s q N_a \phi_s} - V_{CS}$$

P-Channel $$V_{tn} = -\phi_s - \frac{1}{C_i} \sqrt{2 e_s q N_d \phi_s} - V_{CS}$$

-continued $$C_i = \frac{e_i}{T_{OX}}$$

Flat-band voltage at the N-channel-substrate contact $V_{cs}$ is approximately 1.0 Volt, and depends on substrate acceptor concentration $N_a$. For the P-channel device, $V_{cs}$ is about 0.2 V depending on donor concentration $N_d$, assuming that surface potential $\phi_s = 2\phi_f$ and therefore about 0.7 V. For the N-channel device, threshold voltage becomes;

$$V_{tn} = -0.3 + \frac{1}{C_i} \sqrt{2e_s q N_a \phi_s}$$

Threshold voltage for the P-channel device becomes;

$$V_{tn} = -0.9 - \frac{1}{C_i} \sqrt{2e_s q N_d \phi_s}$$

The oxide potential term is all that remains to control threshold voltage. For the N-channel case, oxide potential needs to be about 1.0 V at inversion. Two options are available to attain this voltage; i.e. use thick oxide, and/or implant additional acceptor ions at the channel surface. This solution for the N-channel threshold voltage yields a device very sensitive to short channel and hot electron effects. The P-channel device has a different problem. Threshold voltage is too high even if oxide potential is zero. The only practical solution for a conventional P-channel device is to use an N-poly-gate to eliminate flat-band voltage effects. The result is;

$$V_{tp} = -0.7 - \frac{1}{C_i} \sqrt{2e_s q N_d \phi_s}$$

Case 2: N-Poly gates used for both P- and N-channel devices

As in Case 1, the net flat-band voltage is zero for the p-channel device. Its threshold voltage expression reduces to the following:

$$V_{tp} = -\phi_s - \frac{1}{C_i} \sqrt{2e_s q N_d \phi_s}$$

To reduce the contribution of the oxide potential term, the surface of the substrate, in the channel region, can be compensated with donor ions to reduce the effects of the oxide potential term.

The N-channel device has a different problem. The net flat-band voltage $(-V_{cs} + V_{cg})$ is about 0.8 volts. Threshold voltage becomes:

$$V_{tn} = -0.1 - \frac{1}{C_i} \sqrt{2e_s q N_a \phi_s}$$

The oxide potential term can be adjusted as in Case 1 by increasing the donor concentration $N_a$ in the channel region. As in Case 1, this is a poor solution since the device is still sensitive to short channel and hot electron effects because of the large oxide potential term.

Case 3: N-channel MS device with P-poly gate and P-channel device with N-poly gate These combinations eliminate flat-band voltage and lead to balanced threshold voltages for the P- and N-channel devices.

$$V_{tn} = \phi_s + \frac{1}{C_i} \sqrt{2e_s q N_a \phi_s}$$

$$V_{tn} = \phi_s - \frac{1}{C_i} \sqrt{2e_s q N_d \phi_s}$$

Increasing substrate doping $N_a$ for the N-channel device and $N_d$ for the P-channel device, is one method to control punch-through voltage for short channel devices. Unfortunately this technique, when used for conventional FET devices, increases oxide potential thus requiring channel surface compensation to be used to minimize the effect.

Case 4: Fermi-FET with contra doped polysilicon gates

The threshold voltage for the N- and P-channel devices are;

$$V_{tn} = +\phi_s = 2\phi_f$$

$$V_{tp} = -\phi_s = -2\phi_f$$

This simplicity comes about since oxide potential is zero by design and all flat-band voltages are canceled. Under these ideal circumstances, both P- and N-channel Fermi-FET's can be optimized for punch-through and avalanche breakdown and maximized for transconductance without affecting threshold voltage. Of great importance is the insensitivity to short channel effects including hot electron trapping. Finally, Fermi-FET devices fabricated with channel length's as short as 0.3 μ should not require scaling down the standard power supply voltage of 5 volts.

Modifying Fermi-FET Threshold Voltage

For some circuit designs, it is desirable to fabricate depletion mode Fermi-FET devices. A depletion mode device is fabricated like an enhancement Fermi-FET device except the channel implant dose is increased by factor $G_i$ while maintaining the same implant energy needed to achieve the critical implant depth prescribed by Equation 3A. By using Poisson's Equation to calculate surface potential at X=0 when excess dose factor $G_i$ is present, and given the nominal implant depth $Y_o$, we conclude that the threshold voltage $V_{td}$ for a depletion mode or low threshold device may be defined in terms of the excess implant factor $G_i$ as follows:

$$V_{td} = \phi_s \left[ 1 - \frac{G_i}{\alpha + 1} \right] - \frac{G_i}{C_i} \sqrt{2qNaE_s \left( \frac{\alpha}{\alpha + 1} \right) \phi_s} \quad (52)$$

Where $$\phi_s = 2\phi_f + \frac{KT}{q} \ln(\alpha)$$

$$\phi_f = \frac{KT}{q} \ln\left( \frac{Na}{Ni} \right)$$

Figure 11A:
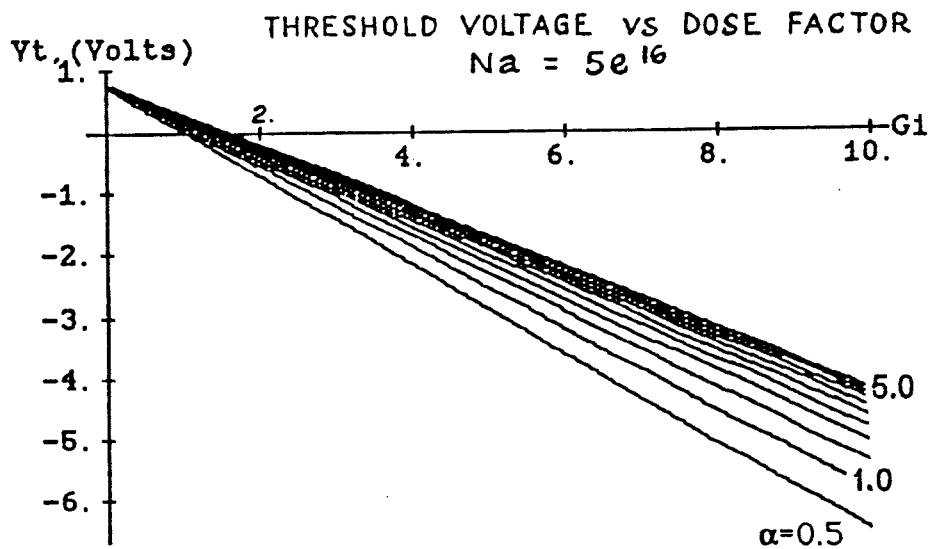
FIGS. 11A-11C graphically illustrate the use of a dose factor to vary the threshold voltage of the Feri-FET of the invention of application Ser. No. 07/318,153 now U.S. Pat. No. 4,990,974.

Equation 52 is plotted in FIG. 11A as a function of $G_i$ for different values of channel implant factor $\alpha$ and a silicon substrate doped with $5e^{16}$ acceptor ions per cm$^3$ and oxide thickness of 120 Å. All threshold voltage values that are negative, correspond to an equivalent imaginary gate voltage responsible for conduction of the undepleted portion of the implant channel. For N-channel devices, a negative voltage is required to shut-off the channel. For example, given a substrate impurity concentration of $5e^{16}$ cm$^{-3}$ and $G_i=4$, and $\alpha=2$, the channel conducts as though it were an enhancement device supplied with an effective gate voltage 1.3 volts above threshold. A gate voltage of $-1.3$ Volts is required to terminate N-channel conduction. Accordingly, FIG. 11A defines the additional implant dose factor $G_i$ required to modify a Fermi-FET device to have depletion mode properties or to lower its positive threshold voltage below the Fermi value $\phi_s$.

Figure 11B:
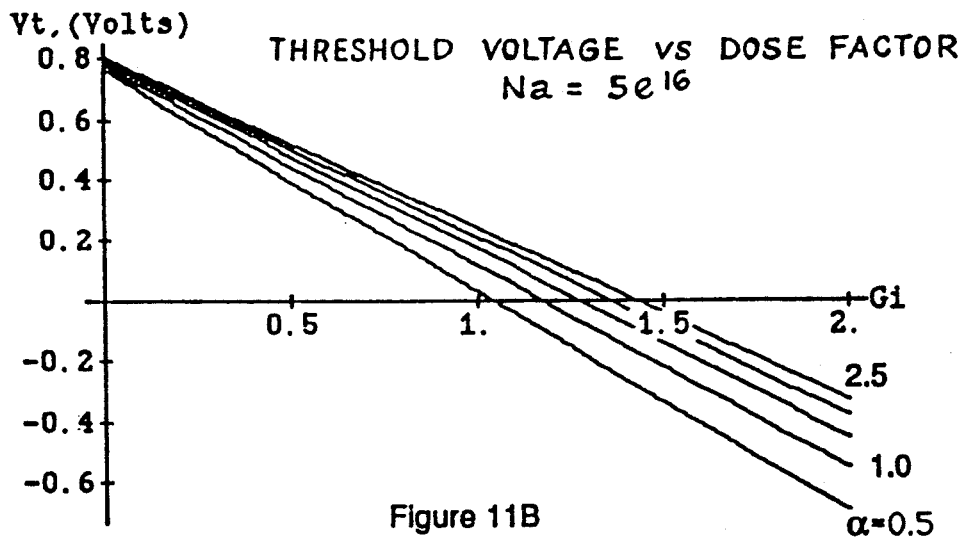
Figure 11C:
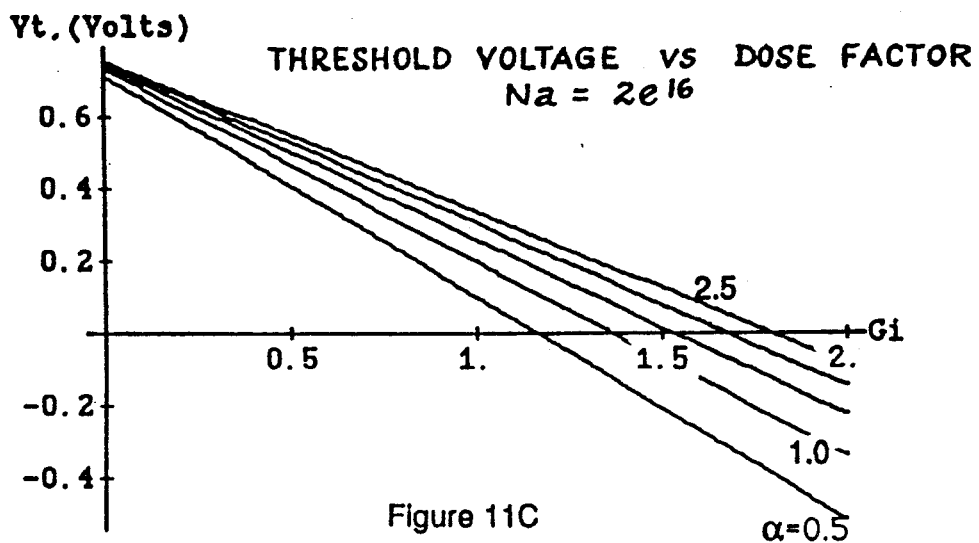

Referring to FIGS. 11B and 11C, it is shown that a positive threshold voltage may be achieved, for an N-channel Fermi-FET device, that is below the Fermi value $\phi_s$. This is accomplished by using an excess implant dose factor $G_i$, restricted to a value less than about 2.0. FIG. 11B uses the same parameters as FIG. 11A, except the $V_t$ and $G_i$ scales are changed. FIG. 11C uses the same parameters as FIGS. 11A and 11B, except that $N_a=2e^{16}$. The same excess dose procedure may be employed to lower threshold voltage of P-channel Fermi-FET devices. Opposite voltage polarities apply for P-channel devices.

Effective Channel Length in FETs

Previous analysis employed an effective channel length $L^*$. The origin of this term will now be described in connection with the formation of a channel by application of gate voltage $V_g$ when the depletion regions already surround the drain and source diffusions.

Figure 12A:
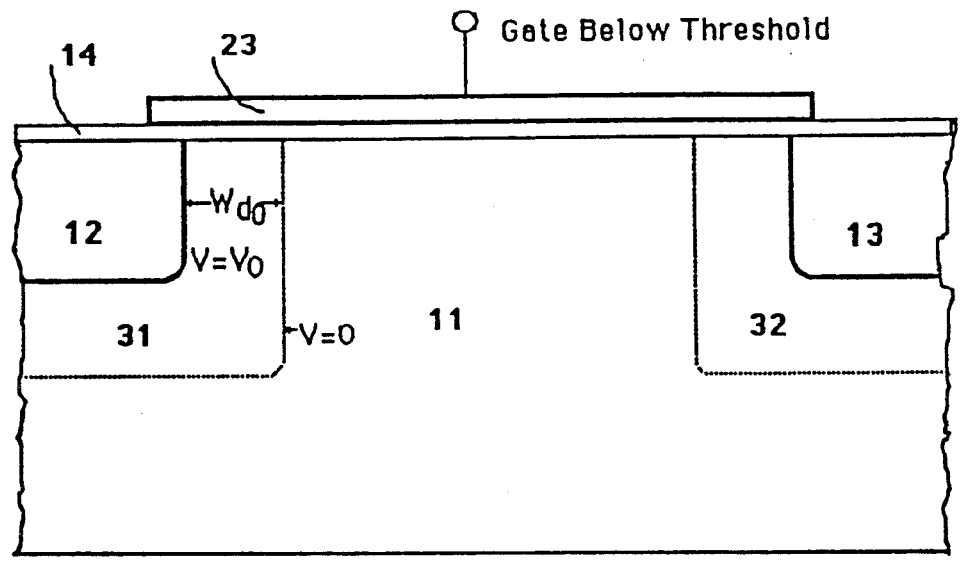
FIGS. 12A-12B illustrate cross-sectional views of effective channel length of FET's according to the invention of application Ser. No. 07/318,153 now U.S. Pat. No. 4,990,974.

Referring now to FIG. 12A, a MOSFET is shown having a depletion configuration without a channel, and with source 12 and drain 13 at ground potential and gate 23 below threshold. FIG. 12A illustrates depletion regions 31 and 32 respectively in the substrate 11 surrounding the source and drain diffusions 12 and 13 respectively, resulting from these P-N junctions. A junction voltage $V_o$ appears on the diffusion at the stochastic junction between the diffusion and the substrate. This voltage is the result of achieving a constant Fermi potential across the junction. Junction voltage $V_o$ is given below for an abrupt junction:

$$V_o = \frac{KT}{q} \operatorname{Ln}\left(\frac{N_a N_d}{N_i^2}\right) \tag{53}$$

The width $W_d$ of the depletion region (31 or 32) extending into the P-substrate from the drain or source diffusions is expressed as follows:

$$W_{dp} = \sqrt{\frac{2e_s V_o}{q}\left[\frac{N_d}{N_a(N_a + N_d)}\right]} \tag{54}$$

If the donor concentration $N_d$ of the drain and source diffusions is much greater than acceptor concentration $N_a$, Equation 53 may be simplified. This simplification has been used above:

$$W_{dp} = \sqrt{\frac{2e_s V_o}{q N_a}} \tag{55}$$

Figure 12B:
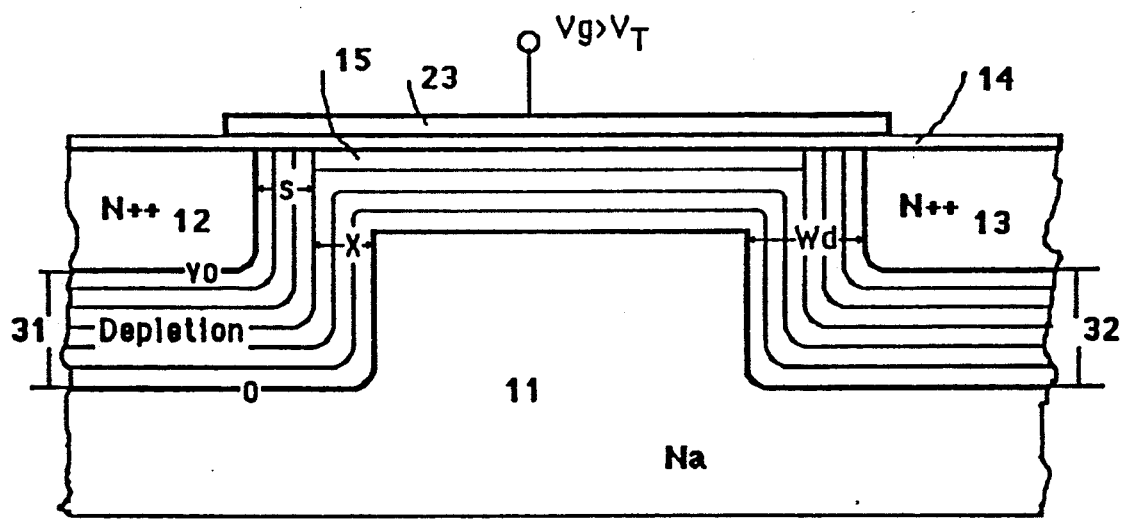

The effect of these depletion regions upon channel formation will now be described. When gate voltage is applied, a uniform equipotential situation must occur that blends the equipotential contours, below the channel, with those contours already surrounding the diffusions. The result is illustrated in FIG. 12B. In order to satisfy the equipotential criteria, the ionized P-region under the gate oxide layer, as a result of gate voltage, does not extend all the way to the diffusions. Neither does the channel 15

Figure 13:
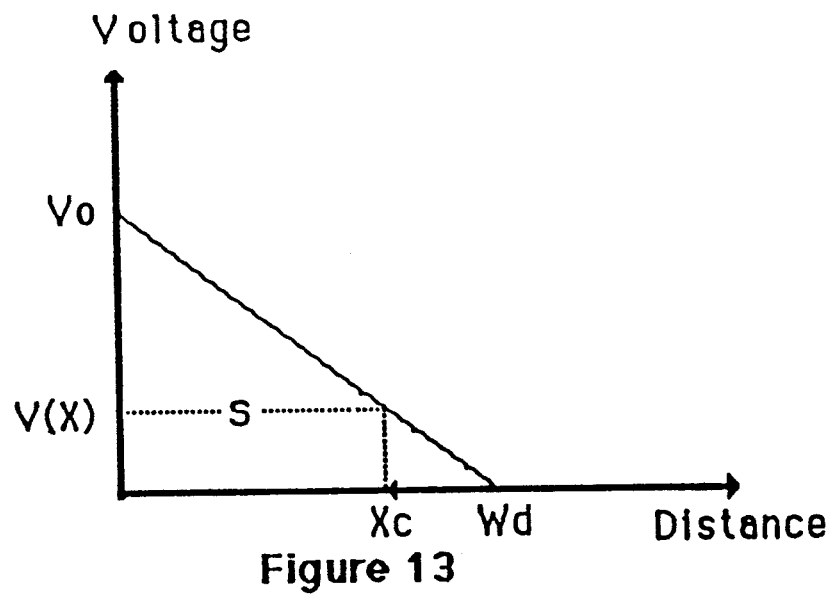
FIG. 13 graphically illustrates channel penetration into the drain depletion region according to the invention of application Ser. No. 07/318,153 now U.S. Pat. No. 4,990,974.

The penetration distance $X_c$ of the channel and its associated depletion region, into the drain and source depletion regions may be calculated as follows: Assuming an abrupt junction, FIG. 13 illustrates the potential versus distance from the stochastic junction of the source or drain depletion regions.

From Poisson's equation the following expression describes junction contact potential $V_o$ and potential $V(X)$ at position X measured from the end of the diffusion depletion region:

$$V_o = \frac{1}{2} q \frac{N_a}{e_s} W_{do}^2 \quad \text{Junction Contact Potential, and} \tag{56}$$

$$V(X) = \frac{1}{2} q \frac{N_a}{e_s} X^2 \quad \text{Voltage At Position } X_c, \tag{57}$$

where $$V_o = KT/q\, L_n(N_a N_d / N_i^2), \tag{58A}$$

$$X = W_d - S, \text{ and} \tag{58B}$$

$$S = \text{Channel to diffusion spacing.} \tag{58C}$$

Solving Equations 56 and 57 for $V(X)$ in terms of $W_d$ and $V_o$:

$$V(X) = \left(\frac{X}{W_d}\right)^2 \tag{59}$$

Using the expression given by Equation 58B, Equation 59 becomes $$V(X) = V_o\left(1 - \frac{S}{W_d}\right)^2. \tag{60}$$

Solving for S, the channel spacing distance S may be described in terms of depletion potential $V(X)$ at position X as follows:

$$S = W_{do}\left(1 - \sqrt{\frac{V(X)}{V_o}}\right) \tag{61}$$

In order to establish the equipotential contours within the depletion region surrounding the drain and source diffusions, FIG. 12B, Voltage $V(X)$ must be equal to the potential $\phi_s(X)$ at the ends of the channel region. The expression for $\phi_s$ has been previously obtained and is repeated below for convenience:

$$\phi_s = \frac{q}{2e_s} N_a W_{dc}^2 \quad (62)$$

where $W_{dc}$ is the depth of the depletion region in the substrate below the oxide layer.

$$W_{dc} = \sqrt{\frac{2e_s}{qN_a} \phi_S} \quad (63)$$

Potential $\phi_s$ must be equal to diffusion potential V(X). THus from Equations 62 and 60:

$$\phi_S = V_0 \left(1 - \frac{S}{W_{do}}\right)^2 \quad (64)$$

Solving Equation 64 for $S/W_d$, the following expression for the ratio of spacing to depletion width is obtained:

$$\frac{S}{W_{do}} = \left(1 - \sqrt{\frac{\phi_S}{V_0}}\right) \quad (65)$$

It will be understood from Equation 65 that channel spacing disappears when $\phi_s = V_o$. This condition requires that $N_p^* = n_d$ and is a situation that never occurs. In fact surface potential $\phi_s$ remains close to twice the Fermi potential, $2\phi_f$, for all practical values of gate voltage. Therefore Equation 65 may be conveniently approximated as:

$$S = W_{do}\left(1 - \sqrt{\frac{2\phi_f}{V_0}}\right) \quad (66)$$

Thus, at threshold, there is a channel-to-diffusion spacing at each end of the channel having the value specified by Equation 66. This channel-diffusion spacing distance S may be minimized by diminishing depletion width $W_d$ by increasing acceptor concentration $N_a$ and or using lightly doped drain and source extension regions.

The analysis presented above assumes that no voltage is applied to the drain or source diffusions. If voltage V is applied, the width of the diffusion depletion region increases. This effect is given by Equation 66.

$$W_d = \sqrt{\frac{2e_S}{qN_a}(V_0 + V)} \quad (67)$$

The above analysis may be repeated for an applied voltage $V_o$. The result is that spacing distance $S_d$, has the same form as Equation 66 except that depletion width $W_d > W_{do}$ due to voltage V.

$$S_d = W_d\left(1 - \sqrt{\frac{2\phi_f}{V_0}}\right) \quad (68)$$

Accordingly, the effective channel length L* may be defined as follows:

$$L^* = L - (S_d + S_s). \quad (69)$$

where $S_s$ is the channel-diffusion spacing at the source, and $S_d$ is the channel-diffusion spacing at the drain.

For long-channel devices, $S_d$ and $S_s$ remain a small fraction of length L. However, for short-channel devices, $(S_s + S_d)$ can be a significant fraction of diffusion spacing length L particularly when drain voltage is applied. The increase in voltage at the drain end of the channel, for example, resulting from drain voltage $V_d \leq V_{dsat}$, is modified by the factor $2\phi_f/V_o$. THus;

$$V(x) = (2\phi_f/V_0)V_d \quad (70)$$

At pinch-off, the following condition applies:

$$(2\phi_f/V_0)V_d = (V_g - V_t) \quad (71)$$

Solving Equation 70 for pinch-off voltage, one obtains a value greater than that reported in the literature:

$$V_p = (V_g - V_t)\frac{V_o}{2\phi_f} \quad (72)$$

When drain voltage exceeds pinch-off voltage, the depletion region around the drain diffusion expands and the end-of-the-channel region must slip back toward the source to maintain potential equilibrium, such that $V(X) = (V_g = V_t)$. This effect is the origin of drain conductance:

$$\frac{dI_d}{dV_d} = \frac{I_{dsat}}{L^*}\left(1 - \sqrt{\frac{2\phi_f}{V_0}}\right)\frac{e_S}{qN_aW_d} \quad (73)$$

Note that if $2\phi_f = V_o$, drain conductance would be zero. If acceptor concentration $N_a$ is too high, in the vicinity of the drain diffusion adjacent the channel, impact ionization break-down will occur at relatively low drain voltage. To summarize the results of effective channel length L*, it appears that in conventional FETs, the inversion channel never touches the drain or source diffusions due to the self depletion regions surrounding these diffusions in the vicinity of the intended channel region. Channel conduction requires injection at the source. It would also appear that the channel L* is shorter than L by the sum of the channel spacing factors $S_s + S_d$. Thus, the channel shrinking effect may be significant in short channel conventional FET devices if substrate doping is not increased to accommodate the effect. L* is the origin of threshold voltage variation with channel length and drain voltage. It will be understood by those having skill in the art that the Fermi-FET totally eliminates this problem. Finally, it would appear that in conventional FET designs that pinch-off voltage is greater than $(V_g - V_t)$ by the factor $V_o/2\phi_f$.

Multiple Gate Fermi-FET

Figure 14:
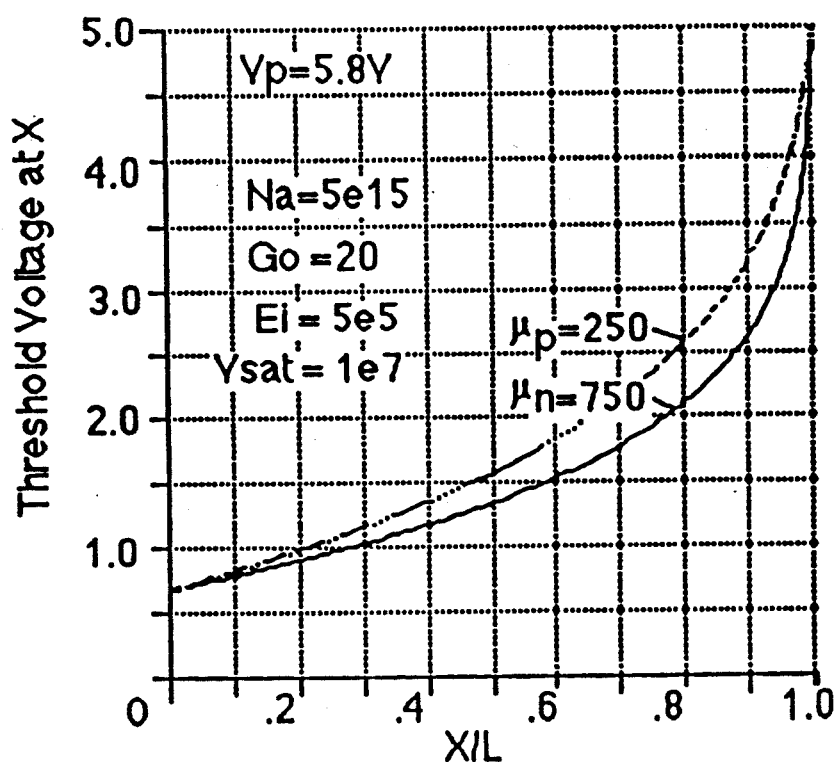
FIG. 14 graphically illustrates variation of threshold voltage with distance according to the invention of application Ser. No. 07/318,153 now U.S. Pat. No. 4,990,974.
Figure 15:
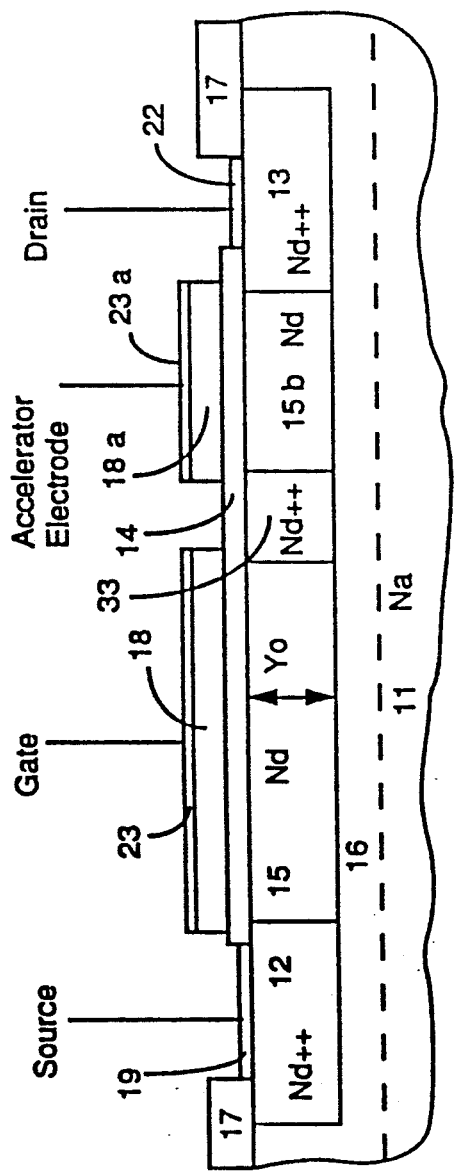
FIG. 15 illustrates a cross-sectional view of a Fermi-FET according to the invention of application Ser. No. 07/318,153 now U.S. Pat. No. 4,990,974, including an accelerator electrode.

It will be understood by those having skill in the art that many applications of FET's require transistors to be connected in series. For example, CMOS (complementary MOS) logic technology requires connecting transistors in series to achieve the desired logic function while maintaining essentially zero idle power. For typical (non-Fermi) FET's, a series arrangement of transistors limits circuit performance in several ways. First, the threshold voltage for each of the series transistors, at best, corresponds to the threshold voltage along the gate of a single transistor whose total channel length is equal to the sum of the channel length's of all series transistors. In contrast, threshold voltage computed for the Fermi-FET is shown in FIG. 14 as a function of position along the channel, for a typical P- and N-Channel device. It is apparent that threshold voltage remains below $V_{dd}/2$ along 80% of the total channel length. Based on the above, according to the invention of application Ser. No. 07/318,153 a separate gate may be provided at the drain end of the channel in a Fermi-FET, whose potential is always at the full "on" value. In particular, the potential is the power supply voltage, $V_{dd}$, for N-channel devices and is at ground for P-channel devices. This gate is called an accelerator electrode and is illustrated in FIG. 15, at 23a. The polysilicon gate contact is illustrated at 18a.

The threshold voltage for the remaining gate or gates located along the channel of a Fermi-FET device, is reduced substantially by use of the accelerator gate technique. Turn on delay is thereby minimized. Variance in threshold voltage of series connected transistors adds delay to the response time of the circuit and depends on the rise time of each of the gate input functions of a conventional CMOS configuration. The current capabilities of the series transistor configuration is diminished by factor N from the current conduction capability of a single transistor. It may be shown that switching frequency depends inversely on the square of the channel length and therefore on $N^2$, where N is the number of transistors connected in series. Therefore, response time varies directly with the square of the CMOS Fan-in factor, i.e. $N^2$. Part of the voltage drop along conventional FET transistors, includes differences in the depletion potential at both ends of the channel due to diffusions contacting the substrate. The Fermi-FET device completely eliminates this source of potential drop and therefore is better suited for CMOS than conventional FET devices.

Figure 16:
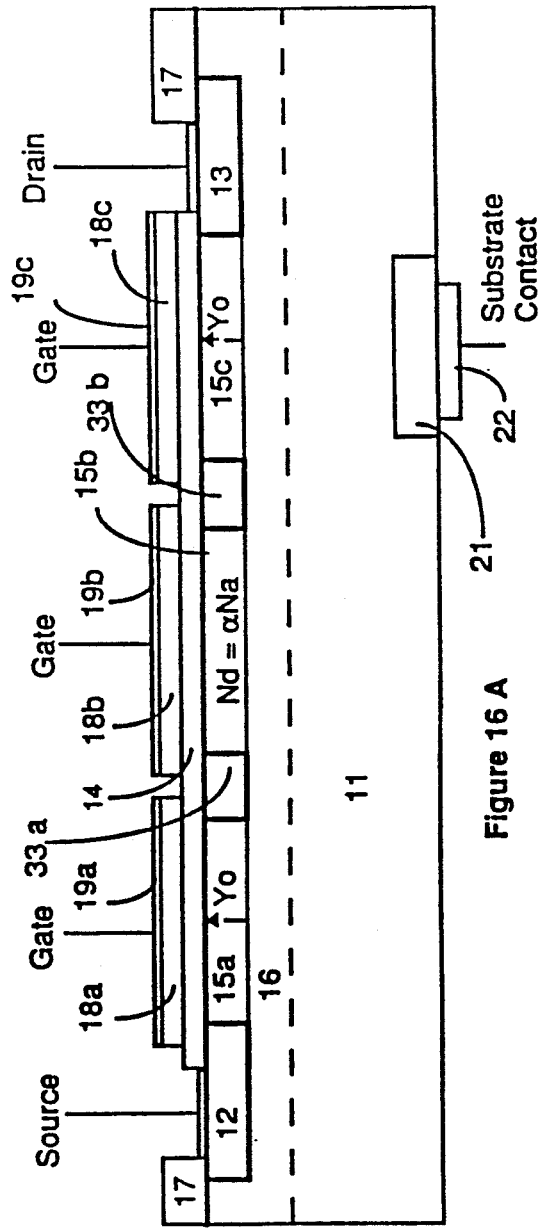
FIGS. 16A-16B illustrate cross-sectional views of multiple gate Fermi-FET's according to the invention of application Ser. No. 07/318,153 now U.S. Pat. No. 4,990,974.
Figure 16:
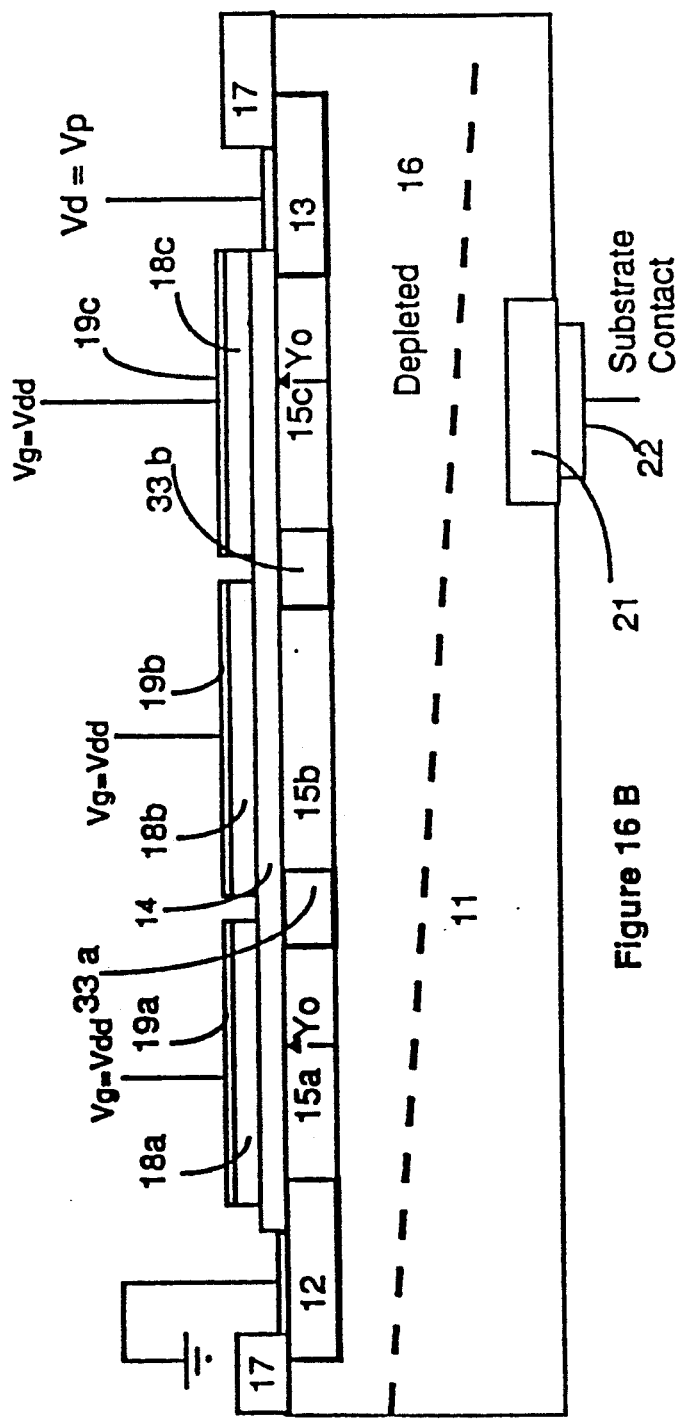

The non-inversion mechanism of filling the self depleted implant channel of the Fermi-FET with conduction carriers, permits construction of the multi-gate FET design shown in FIG. 16A. FIG. 16B illustrates the multi-gate structure operating at pinch-off.

This plural gate structure is ideal for use in logic circuits or other applications requiring transistors connected in series, such as CMOS. The multi-gate structure has diffusion rails 33a, 33b that separate one transistor channel region from another. These diffusion rails need not have contact metal as needed by individual transistors connected in series. The depth of the diffusion rails are the same as the source and drain regions and nominally have the same depth $Y_o$ as the implemented channel. The resistance of 200 Ω per square. Alternatively, the source drain and rails may be deeper than the channel, for example, up to twice as deep. The diffusion rail design lowers diffusion capacity and eliminates one diffusion per transistor region thus minimizing space occupied by the circuit. The ends of each poly gate region overlap the rails of width W and length L to ensure proper gate induced channel filling with conduction carriers. FIG. 16A does not illustrate a minimum geometry configuration. In that case, rail width W would be the same as channel length L.

The SOI FET

Figure 17:
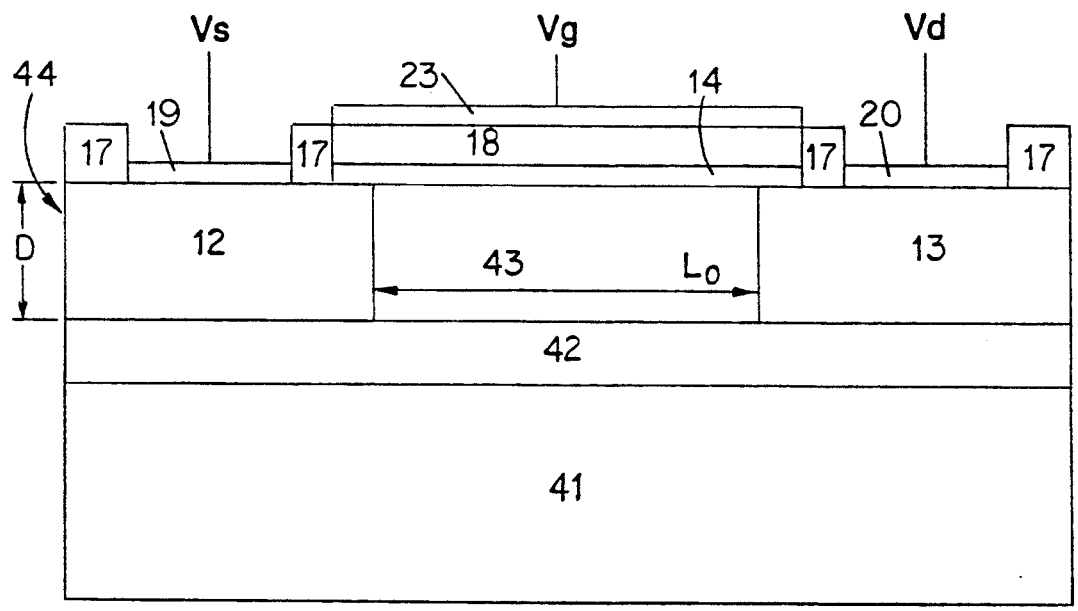
FIG. 17 illustrates a cross-sectional view of a Silicon-on-Insulator (SOI) FET according to the present invention.

Referring now to FIG. 17, a semiconductor (or silicon)-on-insulator (SOI) field effect transistor (FET) having a critical relationship among the source and drain depth and the channel substrate doping density according to the present invention will now be described. SOI FET 41 is formed on a thin insulating layer 42 which is formed on a substrate 41. Typically the substrate 41 is a silicon wafer and the insulating layer 42 is a thin layer of silicon dioxide ($SiO_2$) on the order of 3500 Å thick, which is formed on substrate 41. However, it will be understood by those having skill in the art that other substrates and/or insulating layers 41 and 42 respectively, may be used.

SOI FET 40 is formed in a thin monocrystalline semiconductor layer 44 having a thickness D. It will be understood by those having skill in the art that semiconductor layer 44 is typically silicon, although other semiconductor materials may also be used. Preferably silicon layer 44 is grown with near intrinsic properties.

To form the SOI FET, source and drain regions 12 and 13 respectively, are formed in the silicon layer 44. The source and drain regions are of a first conductivity type, for example N'+ conductivity with a doping concentration of approximately $1E20 cm^{-3}$. A source electrode 19 and drain electrode 20 form external contacts for these regions. A substrate channel 43 of length $L_o$ having the opposite conductivity type from the source and drain regions, for example P type conductivity with a dopant concentration of approximately $5E16 cm^{-3}$, is formed between the source and drain regions 12 and 13. A thin gate insulating (typically oxide) layer 14 is formed on the first surface of the silicon layer 44 opposite the second surface of the silicon layer 44 adjacent insulating layer 42. A gate contact is formed on the gate oxide 14.

According to the present invention the gate contact comprises a polysilicon gate contact 18 and a metal gate electrode 23 for the reasons already described above in connection with the Fermi-FET. In particular, the polysilicon gate contact 18 for the P-channel SOI FET is N-type, and P-type for the N-channel SOI FET. The polysilicon gate contact produces a symmetric threshold voltage for both P and N-channel devices. Finally, field oxide regions 17 isolate the contacts from one another. It will be understood by those skilled in the art that the doping concentration examples described above apply to an N-channel device. A P-channel device may be formed by exchanging N for P and P for N. However, for the sake of simplicity, the present description will continue to describe N doped source and drain regions and a P-channel substrate 43.

SOI-FET 40 may be fabricated using well known SOI fabrication techniques which need not be described further herein. It will also be understood by those having skill in the art that after forming the SOI-FET 40, insulating layer 42 and/or substrate 41 may be removed or detached to form a freestanding thin film FET.

In order to prevent punchthrough between the source and drain at a chosen drain to source voltage, the dopant (acceptor) concentration within the P-channel substrate 43 must be above a certain value. This value $N_a$ is given by Equation 74 as follows:

$$N_a \geq \frac{N_d}{2} \left[ \sqrt{1 + \frac{8 e_s V_o}{q L_o^2 N_d} \left( \sqrt{1 + \frac{V_{dd}}{V_o}} + 1 \right)^2} - 1 \right]. \tag{74}$$

If $N_d$ is much greater than $N_a$, Equation (74) reduces to the following simplified equation:

$$N_a \geq \frac{2e_s V_o}{qL_o^2}\left[\sqrt{1 + \frac{V_{dd}}{V_o}} + 1\right]^2. \tag{75}$$

In both Equations (74) and (75);
$V_o = KT/q \ln(N_d N_a/N_i^2)$,
$e_s$ = capacitive constant for silicon (1E-12F/cm),
$L_o$ = Channel length in microns,
$N_d$ = Diffusion impurity doping (e.g. 1E20cm$^{-3}$)
$N_a$ = Channel substrate doping cm$^{-3}$
$V_{dd}$ = Supply voltage According to the invention, for proper operation of the SOI-FET the silicon depth D must satisfy the following relationship;

$$D \geq \frac{\sqrt{2e_s V_{dd}}}{qN_a}. \tag{76}$$

Equation (76) is obtained by solving Poisson's equation to compute the surface potential of a depleting channel substrate region at the drain end during channel conduction. According to the invention, the channel substrate 43 must not be completely depleted in the depth direction during carrier conduction when the drain is close to supply voltage $V_{dd}$. In other words, the channel substrate 43 must not be fully depleted at pinch-off. If the channel substrate 43 is completely depleted, the pinch off mechanism will be impaired. Pinch off is the result of a unique threshold voltage condition that normally occurs at the drain end of a conducting channel.

This relationship between D and $N_a$ (Equation 76) to ensure the channel substrate 43 is not completely depleted, is directly contrary to the teachings of the art, such as the aforementioned Shahidi et al. publication which states the channel should be fully depleted, i.e. the SOI thickness should be less than the depletion width.

Figure 29:
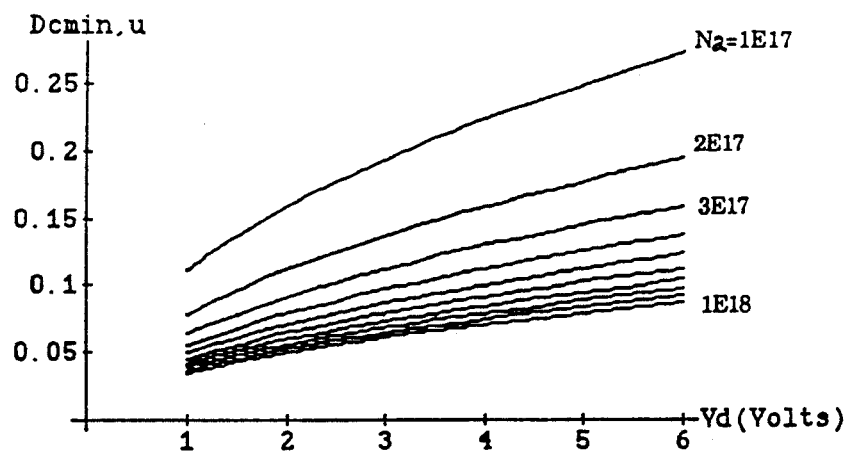
FIG. 29 graphically illustrates SOI FET channel substrate depth versus channel substrate doping and maximum drain voltage according to the present invention.

Equation (76) is plotted in FIG. 29 as a function of drain voltage $V_d$ and channel substrate doping $N_a$, per cubic cm. For example, if the silicon film is 0.1 $\mu$ in depth and drain voltage is above 3 V, then $N_a$ must be greater than 1E17cm$^{-3}$. This high dopant concentration reduces carrier mobility within the inverted channel region.

Accordingly, when the above described relation between D and $N_a$ is maintained, a sufficient dopant concentration in the substrate channel 43 may be produced to avoid punchthrough effects while allowing thicker silicon films to be grown without experiencing a "kinking" in the voltage/current characteristics of the SOI FET.

Fermi SOI FET

Figure 18:
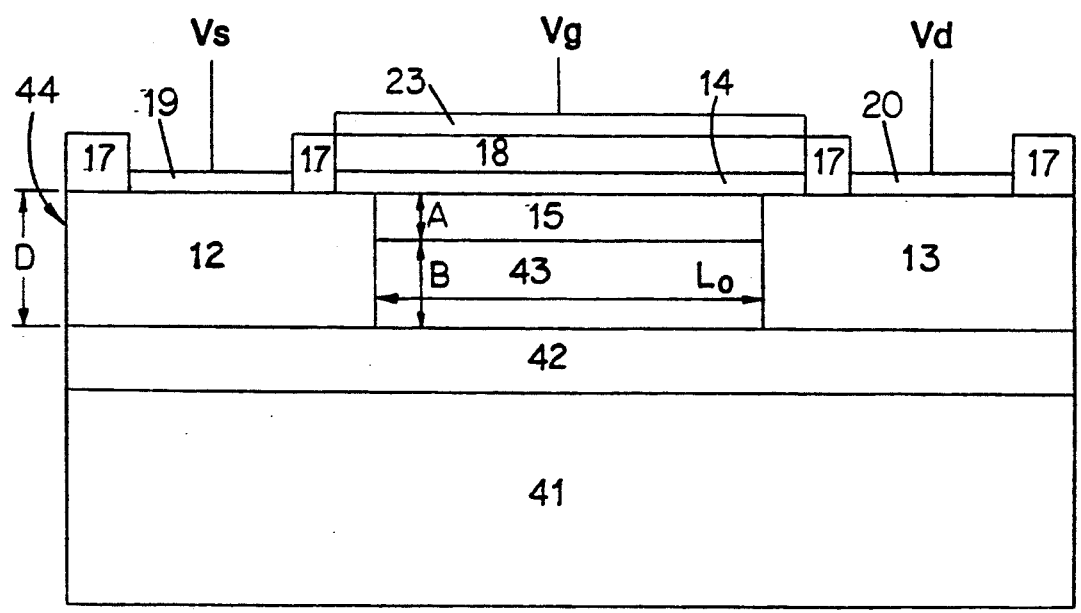
FIG. 18 illustrates a cross-sectional view of a Fermi SOI FET according to the present invention.

Referring now to FIG. 18 a Fermi SOI FET according to the present invention is illustrated. The structure of the Fermi SOI FET 50 corresponds to the structure of SOI FET 40 except that a contra doped channel region 15 is formed. For example, if channel substrate region 43 is doped P-type, then channel 15 is doped N-type with N-type donors such as arsenic and/or phosphorous. The depth of the channel region 15 is labelled A in FIG. 24. A is the requisite depth to satisfy the Fermi-FET criteria described above in connection with the Fermi-FET. In particular, for the SOI Fermi-FET the proper Fermi depth is given by equation 77 below:

$$A = \sqrt{\frac{2e_s \phi_s}{qN_a\alpha(1 + \alpha)}}. \tag{77}$$

Where
$\phi_s = (2KT/q)\ln(N_a/N_i)$
$\alpha = N_{dc}/N_a$
$N_{dc}$ = Donor concentration in the Fermi Channel
$N_a$ = Channel substrate doping concentration
q = electron charge The depth B of the remaining channel substrate region 43 has the same requirements stated in Equation (76) for the SOI FET. That is, B must be sufficiently thick to ensure that channel substrate 43 is not completely depleted during carrier conduction when the drain is close to supply voltage $V_{dd}$. Thus, the total depth D of the silicon layer 44 for the Fermi SOI FET is at least:

$$D = \sqrt{\frac{2e_s}{qN_a}}\left[\sqrt{\frac{\phi_s}{\alpha(1 + \alpha)}} + \sqrt{V_{dd}}\right]. \tag{78}$$

Figure 19:
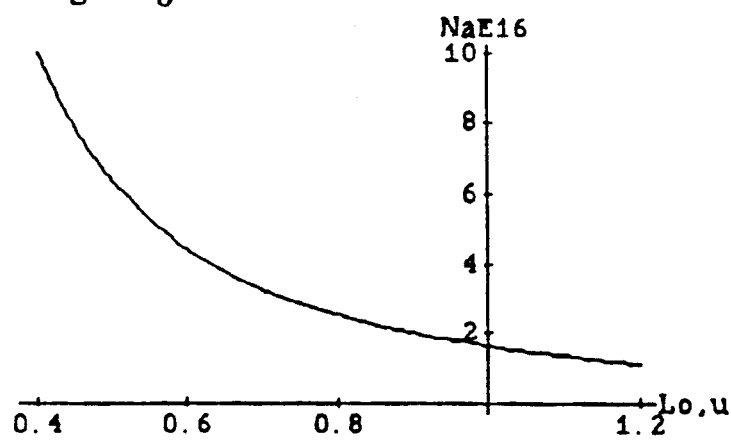
FIG. 19 is a graphical representation of the minimum channel substrate doping concentration as a function of the channel length according to the present invention.

FIG. 19 is a plot of Equation (74) that defines a required minimum channel substrate doping concentration $N_a$ plotted as a function of the channel length $L_o$ in microns. For example, a 0.6 $\mu$ Fermi SOI FET device requires doping the channel substrate region with 4.31E16cm$^{-3}$ donor or acceptor ions in order to prevent punchthrough with six volts on the drain.

Figure 20:
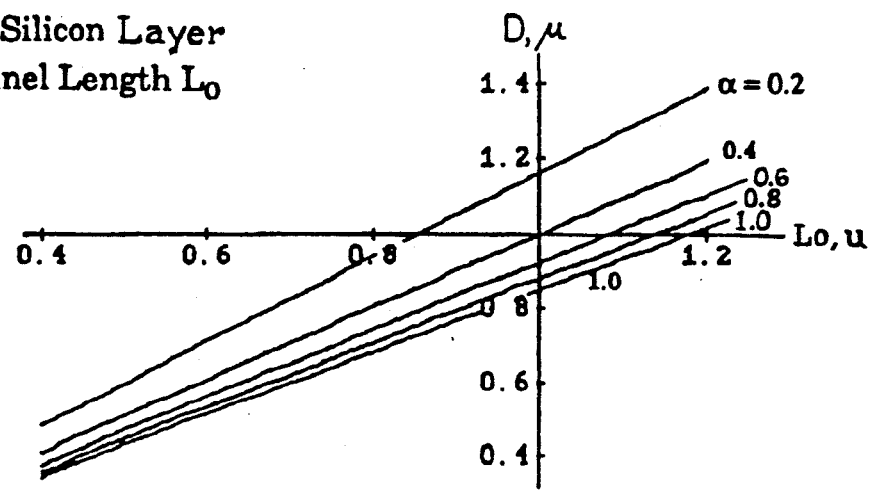
FIG. 20 graphically illustrates the minimum depth of the silicon layer as a function of channel length and Fermi FET channel factor $\alpha$ according to the present invention.
Figure 21:
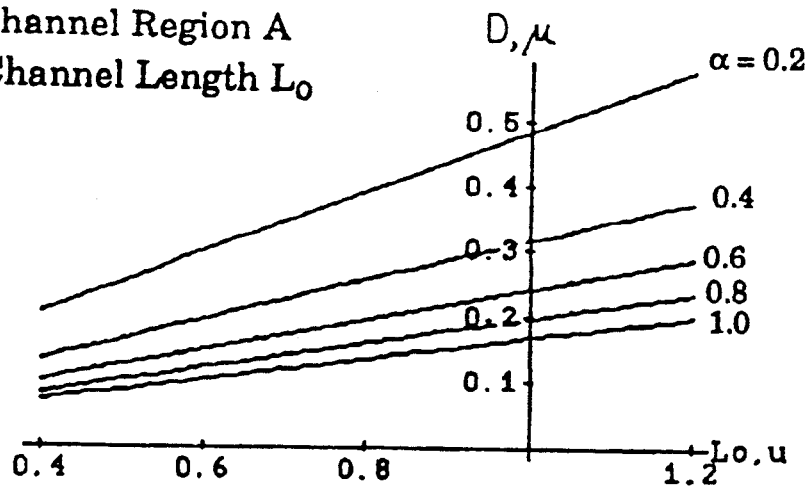
FIG. 21 graphically illustrates the nominal depth of the Fermi channel as a function of channel length and Fermi FET channel factor $\alpha$ according to the present invention.

FIG. 20 is a plot of Equation (78) that defines the minimum depth D of the silicon layer 44 as a function of channel length $L_o$ and Fermi channel factor $\alpha$ as a running parameter. FIG. 21 is a plot of Equation (77), the nominal depth of the Fermi channel 15, as a function of channel length $L_o$ and the Fermi FET channel factor $\alpha$ as a running parameter.

Figure 22:
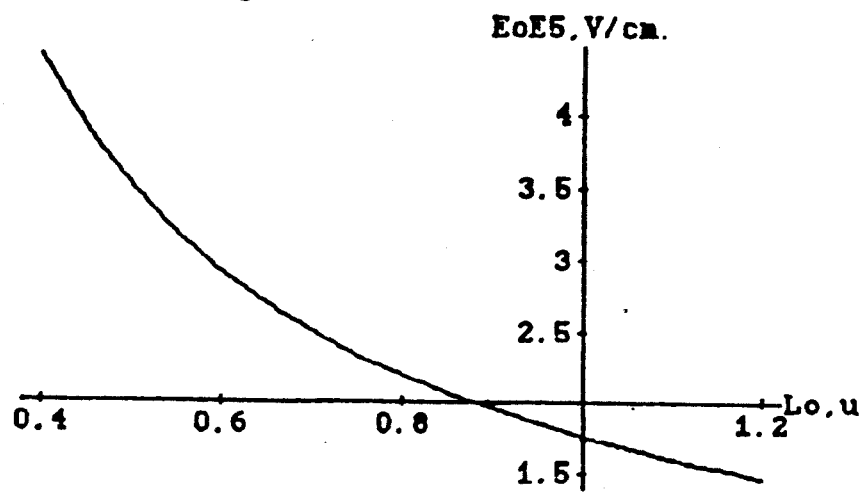
FIG. 22 graphically illustrates a nominal value of the vertical electric field function of channel length according to the present invention.

FIG. 22 is a graph of the nominal value of the vertical electric field that occurs at the junction between the bottom of the Fermi channel 15 and the channel substrate region 43. This electric field is plotted as a function of the channel length $L_o$. For channel lengths as short as 0.4 $\mu$, the junction field remains below the impact ionization value for silicon for the dopant concentration value used. This contrasts sharply with conventional SOI FETs, for example as described in the aforementioned Shahidi et al. publication wherein much higher vertical electric field is present at the gate oxide-channel substrate interface. This high vertical field in conventional SOI FET devices partially accounts for the reduced hole mobility characteristic of this technology.

Figure 23:
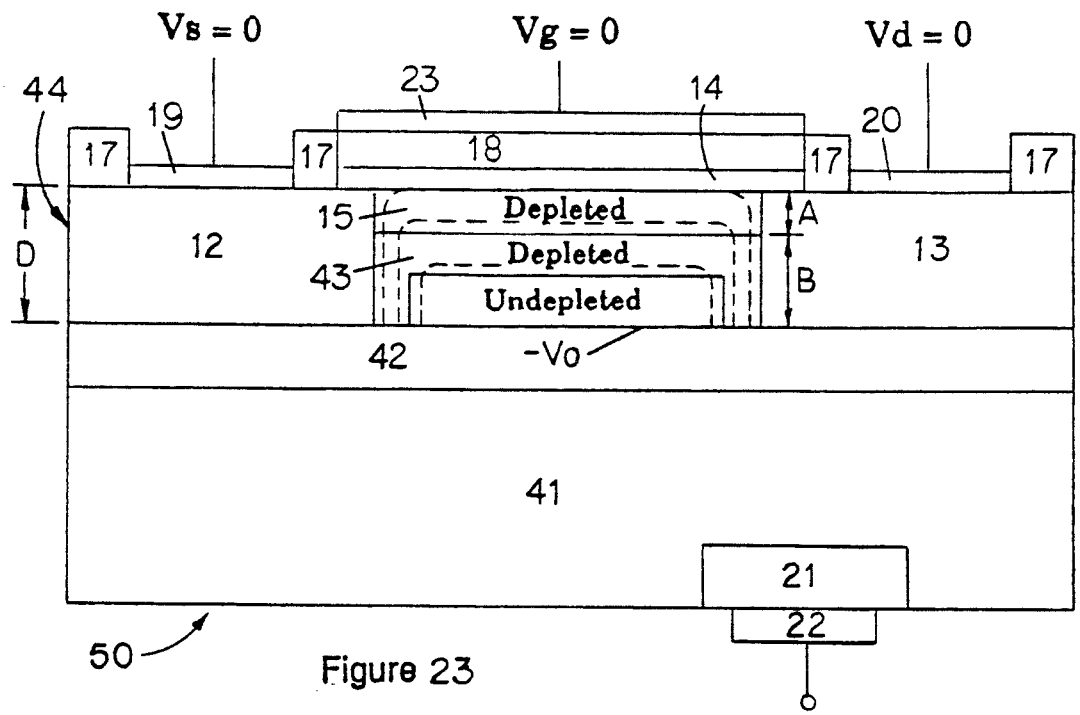
FIGS. 23-26 illustrate cross-sectional views of the Fermi SOI FET of the present invention under various operating conditions.
Figure 24:
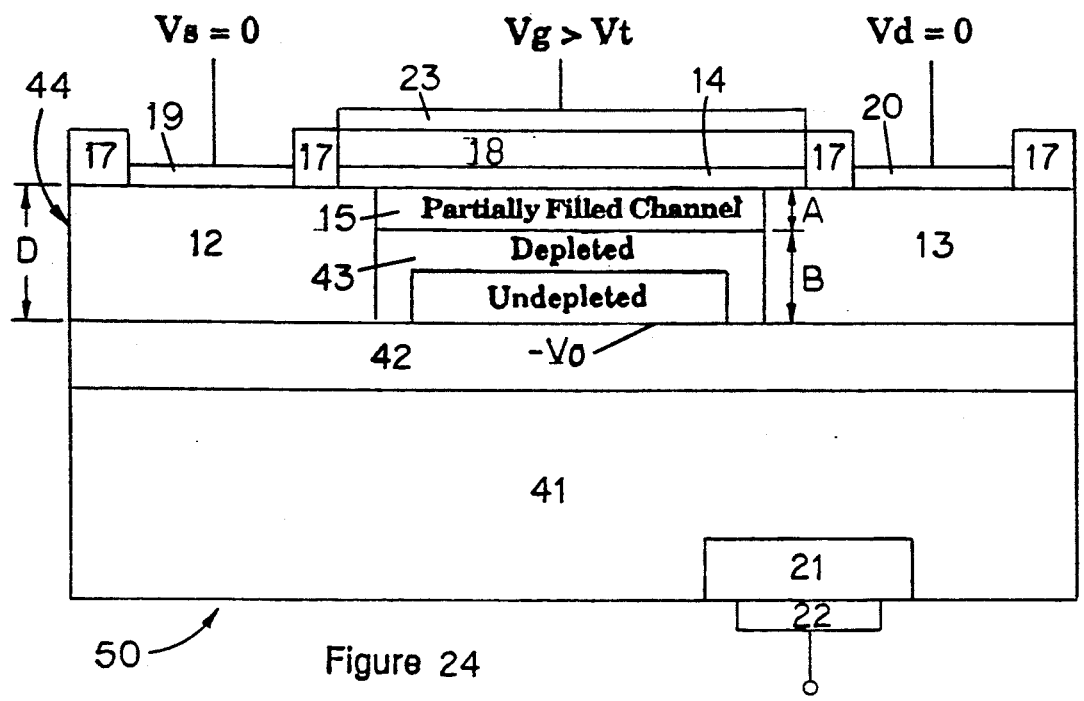

FIG. 23 illustrates the depleted and undepleted portions of the channel substrate region 43 given zero volts on the gate, source and drain. The Fermi channel 15 is shown completely depleted of mobile carriers for gate voltage below threshold. The channel substrate region 43 is only partially depleted. This illustrates the basic Fermi condition that the vertical electric field is zero at the junction of the gate oxide 14 and the Fermi channel 15. Equipotential lines are shown by dotted lines. FIG. 24 illustrates depletion conditions in the Fermi channel 15 and channel substrate region where the gate voltage is above threshold and drain and source voltage are at ground potential. Specifically, the Fermi channel is partially filled with conduction electrons. A substrate voltage compensating region 21, and a substrate contact 22 as already described above for the Fermi FET is also illustrated.

Figure 25:
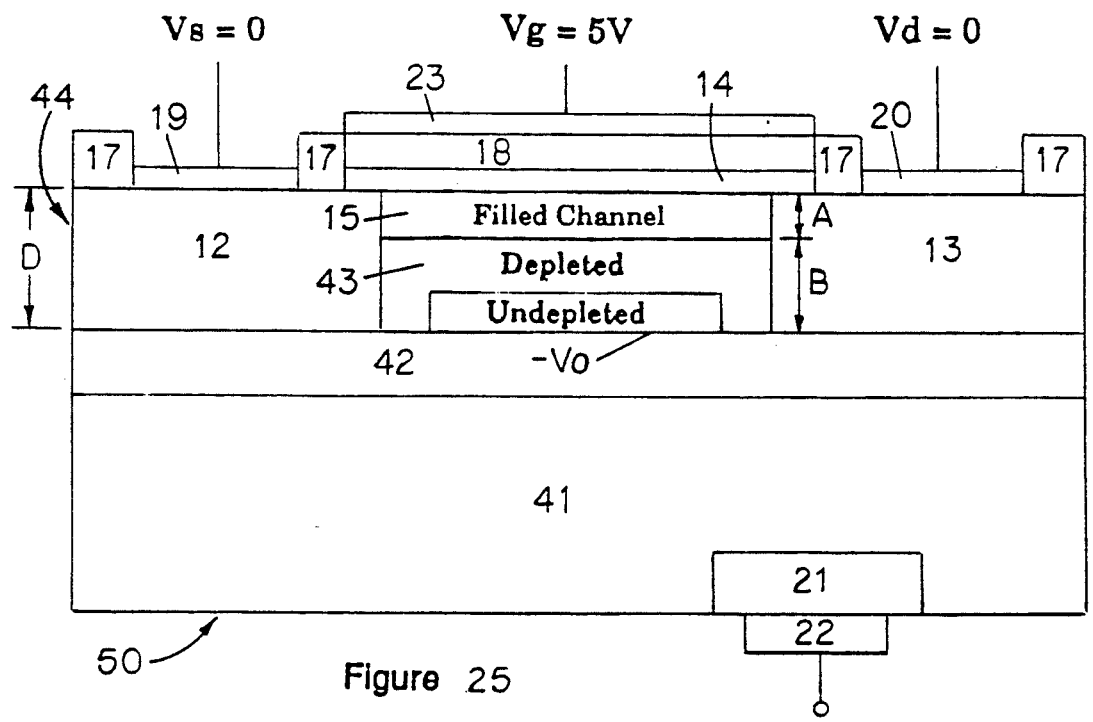
Figure 26:
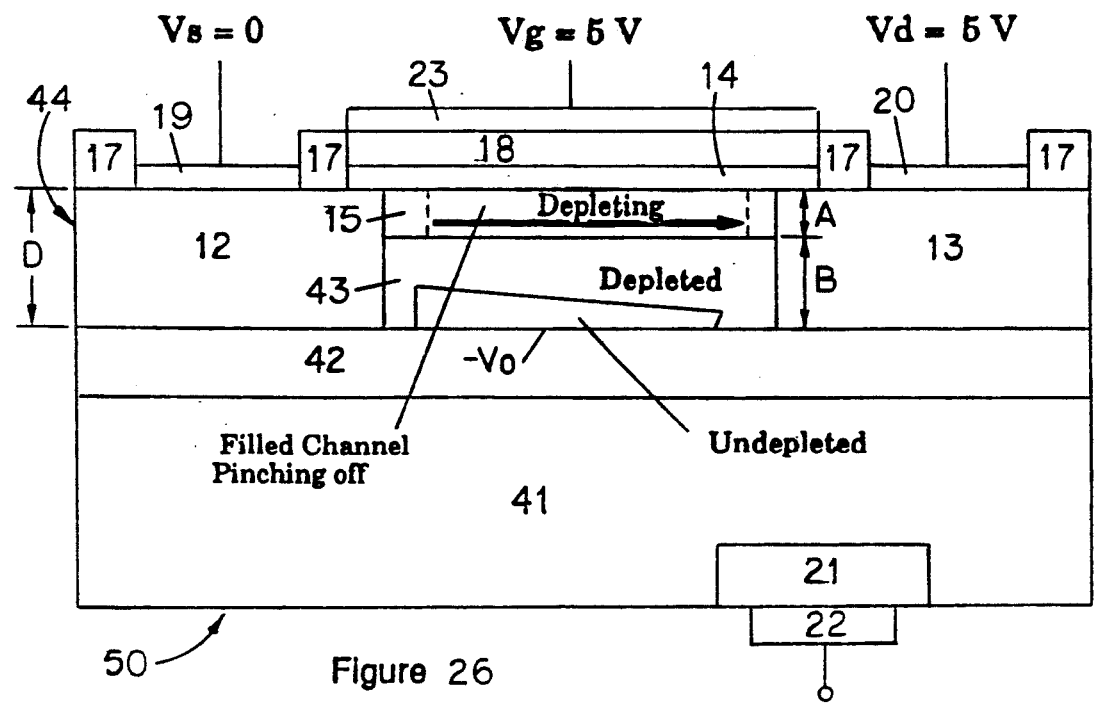

FIG. 25 illustrates the same drain and source conditions as FIG. 29 with the gate voltage equal to supply voltage $V_{dd}$. In this case, the Fermi channel 15 contains the maximum density of conduction electrons, i.e. it is filled. FIG. 26 illustrates the pinch off mechanism that occurs in the Fermi SOI FET. In FIG. 26, depletion in the channel substrate 43 increases towards the drain 13 and carrier concentration in the Fermi channel depletes toward the drain and pinches off at the drain. If the minimum depth of the silicon on the insulator and dopant concentrations given above (Equation (78)) are not obeyed, proper pinch off will not occur and kinking will be evident.

Figure 27A:
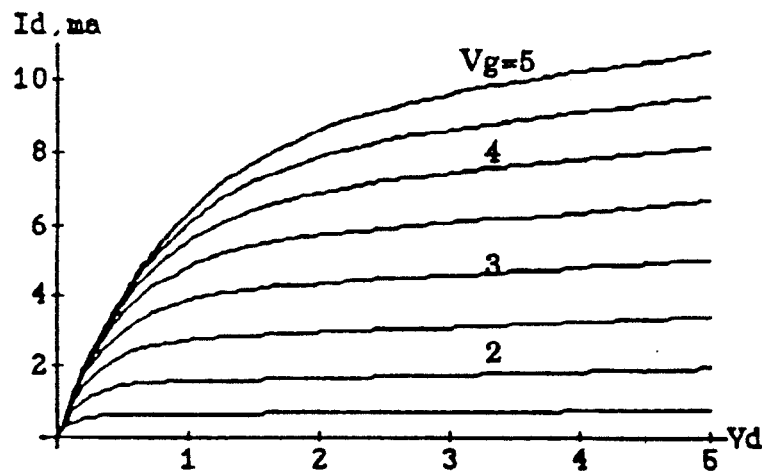
FIGS. 27A-27C illustrate the drain current properties of an N-channel Fermi FET, Fermi SOI FET and a MOSFET respectively.
Figure 27B:
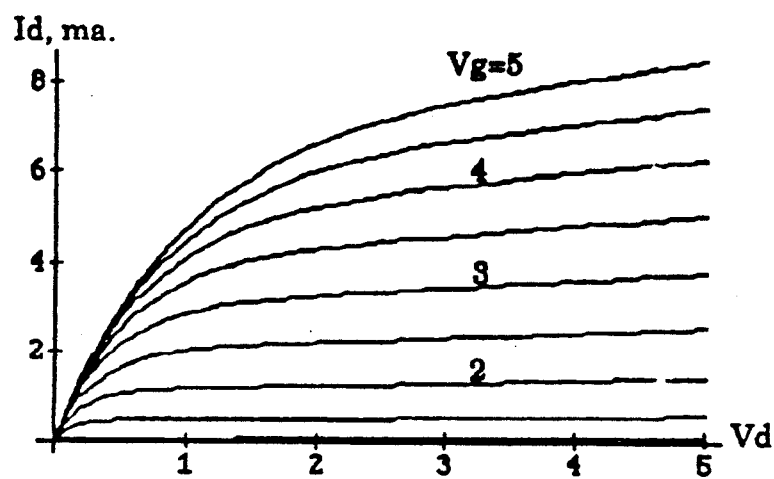
Figure 27C:
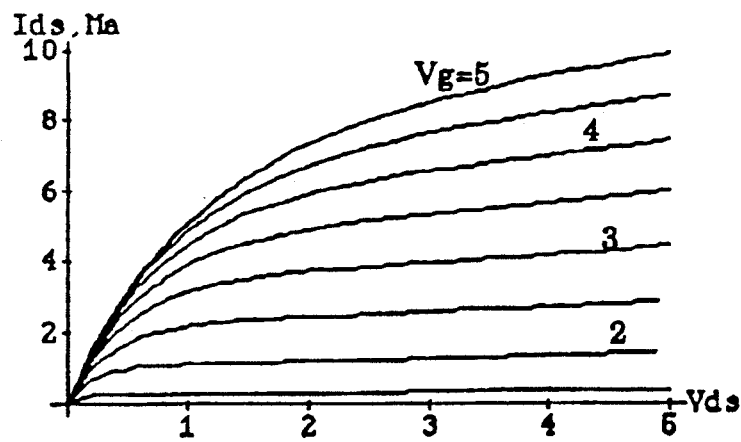
Figure 28A:
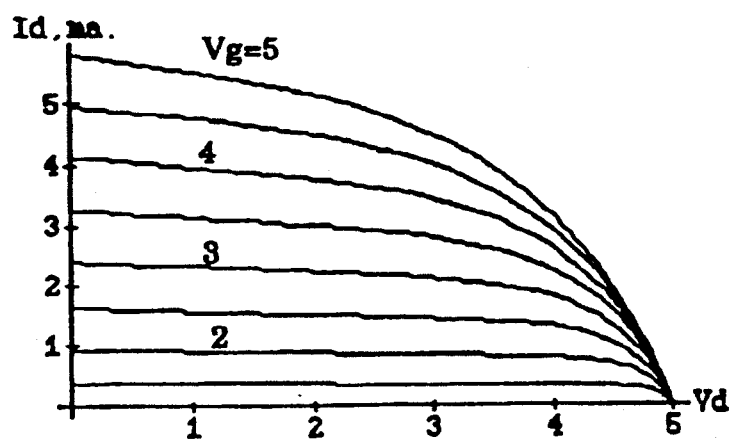
FIGS. 28A-28C illustrate the drain current properties of a P-channel Fermi FET, Fermi SOI FET and MOSFET respectively.
Figure 28B:
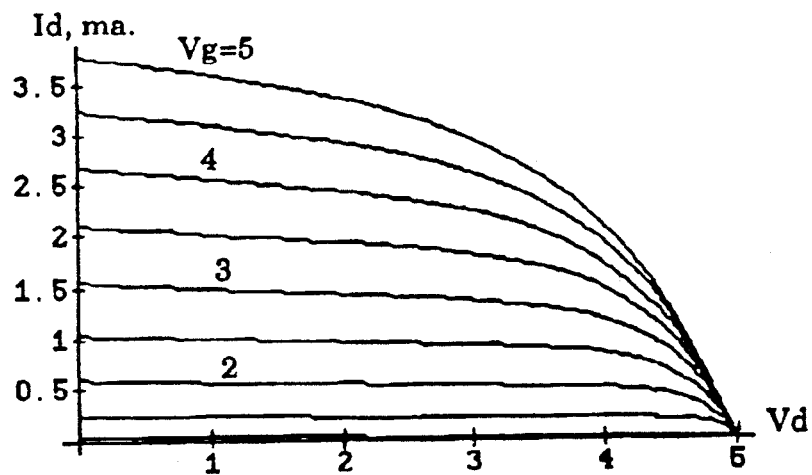
Figure 28C:
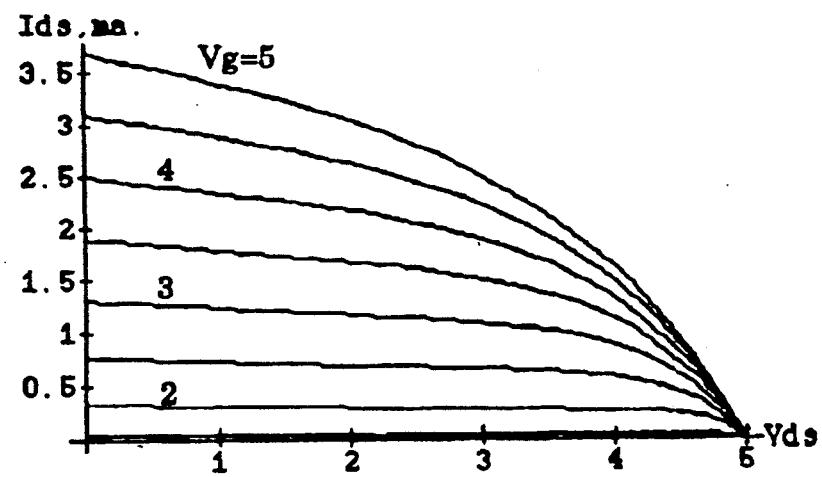

FIGS. 27A–27C illustrate the drain current properties of an N-channel Fermi FET, Fermi SOI FET and a MOS FET respectively that all use the substrate or channel substrate 43 doping level of $5E16cm^{-3}$, a thin oxide layer 14 165 Å thick, a channel length of 0.6 $\mu$ and a channel width of 20 $\mu$. Finally, FIGS. 28A–28C compare drain current properties of P-channel devices given the same technologies.

The initial drain conductance of the Fermi FET devices is far greater than the MOS device and gate capacity for the Fermi FET is less than 30% of MOS devices. In other words, gate capacitance is reduced by a factor of three. Gate capacity of an MOS device in Fared's per centimeter square may be expressed as follows:

$$C_g^* = \frac{1}{\frac{d}{3e_s} + \frac{T_{ox}}{e_i}} \approx \frac{e_i}{T_{ox}} . \quad (79)$$

Fermi FET and Fermi SOI FET gate capacitance may be represented as follows:

$$C_g^* = \frac{1}{\frac{A}{2e_s} + \frac{T_{ox}}{e_i}} . \quad (80)$$

Where;
$C_g^*$ = effective gate capacitance per square centimeter,
d = depth of inversion layer in MOS or conventional SOI devices,
a = depth of Fermi Channel,
$T_{ox}$ = gate insulator (oxide thickness), and
$e_i$ = capacitive constant for the oxide, Farads/centimeter It will be understood by those having skill in the art that the Fermi SOI FET may be fabricated with multiple gates, as already described above for the bulk Fermi FET. In a multi-gate embodiment, the gates are separated from one another by rail regions, preferably of thickness D. The threshold voltage of the Fermi SOI FET may also be modified using the implant dose factor $G_i$, as already described above for the bulk Fermi FET.

The Fermi SOI FET and the Fermi FET are very fast devices primarily due to their low gate capacity and high effective carrier mobility. The drain current properties of the Fermi SOI FET closely match those of the bulk Fermi FET.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A field effect transistor comprising:
   a thin semiconductor layer having a first surface and a second surface opposite said first surface;
   source and drain regions of first conductivity type in said thin semiconductor layer;
   a channel substrate of second conductivity type, in said thin semiconductor layer at said second surface, between said source and drain regions;
   a channel of said first conductivity type in said thin semiconductor layer at said first surface, between said source and drain regions, said channel having a predetermined depth from said first surface;
   a gate insulating layer on said thin semiconductor layer at said first surface adjacent said channel, at least one of the source doping, source depth, drain doping, drain depth, channel substrate doping, channel substrate depth, channel doping and channel depth being selected to produce zero static electric field perpendicular to said first surface at said first surface between said channel and said gate insulating layer; and
   source, drain and gate contacts for electrically contacting said source and drain regions and said gate insulating layer, respectively.

2. The field effect transistor of claim 1 wherein said channel substrate is doped at a first dopant density, wherein said channel is doped at a second dopant density, and wherein at least one of said first and second dopant densities and said predetermined depth are selected to product zero static electric field perpendicular to said first surface at said first surface between said channel and said gate insulating layer.

3. The field effect transistor of claim 1 further comprising:
   an insulating layer on said thin semiconductor layer at said second surface; and
   a substrate on said insulating layer, to thereby produce a semiconductor-on-insulator field effect transistor.

4. The field effect transistor of claim 1 wherein said thin semiconductor layer, said source and said drain are all a first predetermined thickness, and wherein said channel substrate and said channel are, in combination, said first predetermined thickness.

5. The field effect transistor of claim 4 wherein said first predetermined thickness is sufficiently thick such that said channel substrate is not fully depleted at pinch-off.

6. The field effect transistor of claim 1 wherein said channel comprises a plurality of channels separated from one another by rail regions; and wherein said gate contact comprises a plurality of gate contacts, a respective one of which overlies a respective one of said plurality of channels.

7. The field effect transistor of claim 3 wherein said channel substrate comprises a first semiconductor material in monocrystalline form, and being doped at a first doping density;
   wherein said gate contact comprises said first semiconductor material of said second conductivity type and being doped at said first dopant density; and wherein said field effect transistor further comprises a substrate contact for electrically contacting said substrate.

8. The field effect transistor of claim 1 wherein said thin semiconductor layer comprises a thin layer of monocrystalline silicon.

9. A field effect transistor comprising:
a thin semiconductor layer having a first surface and a second surface opposite said first surface;
source and drain regions of first conductivity type in said thin semiconductor layer;
a channel substrate of second conductivity type, in said thin semiconductor layer at said second surface, between said source and drain regions;
a channel of said first conductivity type in said thin semiconductor layer at said first surface, between said source and drain regions, said channel having a predetermined depth from said first surface;
a gate insulating layer on said thin semiconductor layer at said first surface adjacent said channel, at least one of the source doping, source depth, drain doping, drain depth, channel substrate doing, channel substrate depth, channel doping and channel depth being selected to produce a threshold voltage for said field effect transistor which is twice the Fermi potential of said channel substrate; and
source, drain and gate contacts for electrically contacting said source and drain regions and said gate insulating layer, respectively.

10. The field effect transistor of claim 9 wherein said channel substrate is doped at a first dopant density, wherein said channel is doped at a second dopant density, and wherein at least one of said first and second dopant densities and said predetermined depth are selected to produce a threshold voltage for said field effect transistor which is twice the Fermi potential of said channel substrate.

11. The field effect transistor of claim 9 further comprising:
an insulating layer on said thin semiconductor layer at said second surface; and
a substrate on said insulating layer, to thereby produce a semiconductor-on-insulator field effect transistor.

12. The field effect transistor of claim 9 wherein said thin semiconductor layer, said source and said drain are all a first predetermined thickness, and wherein said channel substrate and said channel are, in combination, said first predetermined thickness.

13. The field effect transistor of claim 12 wherein said first predetermined thickness is sufficiently thick such that said channel substrate is not fully depleted at pinch-off.

14. The field effect transistor of claim 9 wherein said channel comprises a plurality of channels separated from one another by rail regions; and wherein said gate contact comprises a plurality of gate contacts, a respective one of which overlies a respective one of said plurality of channels.

15. The field effect transistor of claim 11 wherein said channel substrate comprises a first semiconductor material in monocrystalline form, and being doped at a first doping density;
wherein said gate contact comprises said first semiconductor material of said second conductivity type and being doped at said first dopant density; and wherein said field effect transistor further comprises a substrate contact for electrically contacting said substrate.

16. The field effect transistor of claim 9 wherein said thin semiconductor layer comprises a thin layer of monocrystalline silicon.

17. A field effect transistor comprising:
a thin semiconductor layer having a first surface and a second surface opposite said first surface;
source and drain regions of first conductivity type in said thin semiconductor layer;
a channel substrate of second conductivity type, in said thin semiconductor layer at said second surface, between said source and drain regions;
a channel of said first conductivity type in said thin semiconductor layer at said first surface, between said source and drain regions, said channel having a predetermined depth from said first surface and a predetermined length from said source to said drain;
a gate insulating layer on said thin semiconductor layer at said first surface adjacent said channel and having a predetermined thickness, at least one of the source doping, source depth, drain doping, drain depth, channel substrate doping, channel substrate depth, channel doping and channel depth being selected to produce a threshold voltage for said field effect transistor which is independent of said predetermined length and said predetermined thickness; and
source, drain and gate contacts for electrically contacting said source and drain regions and said gate insulating layer, respectively.

18. The field effect transistor of claim 17 wherein said channel substrate is doped at a first dopant density, wherein said channel is doped at a second dopant density, and wherein at least one of said first and second dopant densities and said predetermined depth are selected to produce a threshold voltage for said field effect transistor which is independent of said predetermined length and said predetermined thickness.

19. The field effect transistor of claim 17 further comprising:
an insulating layer on said thin semiconductor layer at said second surface; and
a substrate on said insulating layer, to thereby produce a semiconductor-on-insulator field effect transistor.

20. The field effect transistor of claim 19 wherein said channel substrate comprises a first semiconductor material in monocrystalline form, and being doped at a first doping density;
wherein said gate contact comprises said first semiconductor material of said second conductivity type and being doped at said first dopant density; and
wherein said field effect transistor further comprises a substrate contact for electrically contacting said substrate.

21. The field effect transistor of claim 17 wherein said thin semiconductor layer, said source and said drain are all a first predetermined thickness, and wherein said channel substrate and said channel are, in combination, said first predetermined thickness.

22. The field effect transistor of claim 21 wherein said first predetermined thickness is sufficiently thick such that said channel substrate is not fully depleted at pinch-off.

23. The field effect transistor of claim 17 wherein said channel comprises a plurality of channels separated from one another by rail regions; and wherein said gate contact comprises a plurality of gate contacts, a respective one of which overlies a respective one of said plurality of channels.

24. The field effect transistor of claim 17 wherein said thin semiconductor layer comprises a thin layer of monocrystalline silicon.

25. A field effect transistor comprising:

a thin semiconductor layer having a first surface and a second surface opposite said first surface, said thin semiconductor layer having an intrinsic carrier concentration $N_i$ at temperature T degrees Kelvin, and a dielectric constant $e_s$;

source and drain regions of first conductivity type in said thin semiconductor layer;

a channel substrate of second conductivity type, in said thin semiconductor layer at said second surface, between said source and drain regions, and being doped at a first dopant density $N_a$;

a channel of said first conductivity type in said thin semiconductor layer at said first surface between said source and drain regions, said channel being doped at a second dopant density which is a factor $\alpha$ times said first dopant density $N_a$, said channel having a predetermined depth A from said first surface, with A being $\sqrt{(2e_s\phi_s)/(qN_a\alpha(\alpha+1))}$, where $\phi_s$ is $(2KT/q)\ln(N_a/N_i)$, q is equal to $1.6\times 10^{-19}$ coulombs, and K is equal to $1.3\times 10^{-23}$ Joules/°Kelvin;

a gate insulating layer on said thin semiconductor layer at said first surface adjacent said channel; and source, drain and gate contacts for electrically contacting said source and drain regions and said gate insulating layer, respectively.

26. The field effect transistor of claim 25 further comprising:

an insulating layer on said thin semiconductor layer at said second surface; and a substrate on said insulating layer; to thereby produce a semiconductor-on-insulator field effect transistor.

27. The field effect transistor of claim 26 wherein said channel substrate comprises a first semiconductor material in monocrystalline form, and being doped at said first doping density;

wherein said gate contact comprises said first semiconductor material of said second conductivity type in polycrystalline form and being doped at said first dopant density; and wherein said field effect transistor further comprises a substrate contact for electrically contacting said substrate.

28. The field effect transistor of claim 25 wherein said thin semiconductor layer, said source and said drain are all a first predetermined thickness, and wherein said channel substrate and said channel are, in combination, said first predetermined thickness.

29. The field effect transistor of claim 28 wherein said first predetermined thickness is sufficiently thick such that said channel substrate is not fully depleted at pinch-off.

30. The field effect transistor of claim 29 wherein said first predetermined thickness is at least $$\frac{\sqrt{2e_s}}{qN_a}\left[\sqrt{\frac{\phi_s}{\alpha(1+\alpha)}} + \sqrt{V_{dd}}\right]$$

where $V_{dd}$ is the power supply voltage for said field effect transistor.

31. The field effect transistor of claim 25 wherein said channel comprises a plurality of channels separated from one another by rail regions; and wherein said gate contact comprises a plurality of gate contacts, a respective one of which overlies a respective one of said plurality of channels.

32. The field effect transistor of claim 25 wherein said thin semiconductor layer comprises a thin layer of monocrystalline silicon.

33. The field effect transistor of claim 25 wherein said channel substrate is doped by an additional dose factor $G_i$ of additional dopant of said second conductivity type at an energy which achieves said predetermined depth A, to thereby provide a depletion mode field effect transistor.

34. The field effect transistor of claim 33 wherein said additional dose factor $G_i$ is controlled to maintain a threshold voltage V, for said depletion mode field effect transistor which is greater than zero, where:

$$V_t = \phi_s - G_i\left[\frac{\phi_s}{(\alpha+1)} + \frac{1}{C_i}\sqrt{2qN_ae_s\left(\frac{\alpha}{\alpha+1}\right)\phi_s}\right]$$

$$\phi_s = 2\phi_f + \frac{KT}{q}\ln(\alpha)$$

$$\phi_f = \frac{KT}{q}\ln\left(\frac{N_a}{N_i}\right)$$

$$C_i = \frac{e_i}{T_{ox}}$$

and where $T_{ox}$ is the thickness of said gate insulating layer and $e_i$ is the dielectric constant of said gate insulating layer.

35. The field effect transistor of claim 33 wherein said additional dose factor $G_i$ has a value of $\alpha$.

36. The field effect transistor of claim 33 wherein said additional dose factor $G_i$ has a value equal to two times the length of said channel between said source and drain regions.

37. A field effect transistor comprising:

a thin seimconductor layer having a first surface and a second surface opposite said first surface;

source and drain regions of first conductivity type in said thin semiconductor layer;

a channel substrate of second conductivity type in said thin semiconductor layer at said second surface between said source and drain regions, at least one of the channel substrate thickness and channel substrate doping being selected such that said channel substrate is not fully depleted at pinch-off;

a gate insulating layer on said thin semiconductor layer at said first surface adjacent said channel; and source, drain and gate contacts for electrically contacting said source and drain regions ad said gate insulating layer respectively.

38. The field effect transistor of claim 37 wherein said thin semiconductor layer, said source, said drain and said channel substrate are all a first predetermined thickness, said first predetermined thickness being greater than $$\sqrt{2e_s V_{dd}/qN_a}$$

where $e_s$ is the dielectric constant of the thin semiconductor layer, $V_{dd}$ is the power supply voltage for said field effect transistor, q is equal to $1.6 \times 10^{-19}$ coulombs and $N_a$ is the dopant density of said channel substrate.

39. The field effect transistor of claim 37 further comprising:
an insulating layer on said thin semiconductor layer at said second surface; and
a substrate on said insulating layer, to thereby produce a semiconductor-on-insulator field effect transistor.

* * * * *

UNITED STATES PATENT AND TRADEMARK OFFICE
CERTIFICATE OF CORRECTION

PATENT NO. : 5,151,759
DATED : September 29, 1992
INVENTOR(S) : Vinal

It is certified that error appears in the above-identified patent and that said Letters Patent is hereby corrected as shown below:

Column 4, line 18, "1,000 Å" should be --1,000Å--.

Column 4, line 24, "200 mV" should be --200mV--.

Column 4, line 58, "probably" should be --probability--.

Column 5, line 28, "$10^{19}$" should be --$10^{-19}$--.

Column 5, line 50, "insure" (both occurrences) should be --ensure--.

Column 6, line 15, delete "a".

Column 6, line 16, delete "lo".

Column 6, line 17, "effect" should be --affect--.

Column 7, line 1, "FIG." should be --FIGS.--.

Column 7, line 29, "Feri" should be --Fermi--.

Column 8, line 65, "Feri" should be --Fermi--.

Column 9, line 49, after "No." insert --07/--.

Column 10, line 34, "$N_d+$" should be --$N_d*$--.

Column 10, line 49, after "implanted" insert --channel 15 is completely self-depleted as shown in FIG. 1A. Complete channel self-depletion is the--.

UNITED STATES PATENT AND TRADEMARK OFFICE
CERTIFICATE OF CORRECTION

PATENT NO. : 5,151,759
DATED : September 29, 1992
INVENTOR(S) : Vinal

It is certified that error appears in the above-identified patent and that said Letters Patent is hereby corrected as shown below:

Column 10, line 63, "$N_o$" should be --$N_c$--.

Column 12, line 33, "$V_{ox} = (qN_sY_oT_{ox})e_i$" should be -- $V_{ox} = (qN_sY_oT_{ox})/e_i$. --.

Column 12, line 58, delete Equation (7A)

$$Y_{ex} = \frac{qN_d^* Y_o}{C_i} \qquad \text{Voltage Across Oxide Layer} \qquad (7A)$$

and insert Equation (7A) as follows:

$$Y_{ox} = \frac{qN_d^* Y_o}{C_i} \qquad \text{Voltage Across Oxide Layer} \qquad (7A)$$

Column 13, line 36, delete Equation (8F)

$$Y_{nc} = Y_o \qquad (8F)$$

and insert Equation (8F) as follows:

$$Y_{no} = Y_o \qquad (8F)$$

UNITED STATES PATENT AND TRADEMARK OFFICE
CERTIFICATE OF CORRECTION

PATENT NO. : 5,151,759
DATED : September 29, 1992
INVENTOR(S) : Vinal

It is certified that error appears in the above-identified patent and that said Letters Patent is hereby corrected as shown below:

Column 14, line 51, delete "where" (first occurrence.

Column 15, line 4, "$N_1 = 1.5 \times 10^{10}$ cm$^{-3}$" should be --$N_i = 1.5 \times 10^{10}$ cm$^{-3}$--.

Column 15, line 7, "residues" should be --resides--.

Column 15, line 27, "1 it may be seen that $V_g$" should be --it may be seen that $V_g$--.

Column 15, line 65, delete Equation (13D)

$$V_t^+ = 2\phi_f - \left( \frac{F}{C_1} \sqrt{2e_s q N_a \phi_f} + \phi_f F^2 \right) \quad \begin{matrix} Deep\ Fermi\text{-}FET \\ Y + Y_o(1+F) \end{matrix} \quad (13D)$$

and insert Equation (13D) as follows:

$$V_t^+ = 2\phi_f - \left( \frac{F}{C_1} \sqrt{2e_s q N_a \phi_f} + \phi_f F^2 \right) \quad \begin{matrix} Deep\ Fermi\text{-}FET \\ Y = Y_o(1+F) \end{matrix} \quad (13D)$$

Column 16, line 14, "4A. A" should be --4A, a--.

Column 17, line 44, "N type" should be --N+ type--.

Column 18, line 54, "$\mu_{pp}$" should be --$\mu_{oo}$--.

UNITED STATES PATENT AND TRADEMARK OFFICE
CERTIFICATE OF CORRECTION

PATENT NO. : 5,151,759

DATED : September 29, 1992

INVENTOR(S) : Vinal

It is certified that error appears in the above-identified patent and that said Letters Patent is hereby corrected as shown below:

Column 18, line 55, "o" should be --a--.

Column 18, line 59, "$N_c/N_s<2$. i.e., Drain" should be --$N_c/N_s<2$, i.e., drain--.

Column 19, line 15, "In" should be --in--.

Column 19, line 18, delete Equation (18)

$$\phi_s = \phi_o + 1/2 Y_n E_o \qquad (18)$$

and insert Equation (18) as follows:

$$\phi_s = \phi_o + 1/2 Y_n E_o. \qquad (18)$$

Column 20, line 9, delete Equation (29)

$$\frac{1}{Y_n'} \int_0^{Y_n} N_d(y)\, dy = N_d^{*'} \qquad (29)$$

UNITED STATES PATENT AND TRADEMARK OFFICE
CERTIFICATE OF CORRECTION

PATENT NO. : 5,151,759
DATED : September 29, 1992
INVENTOR(S) : Vinal

It is certified that error appears in the above-identified patent and that said Letters Patent is hereby corrected as shown below:

and insert Equation (29) as follows:

$$\frac{1}{Y'_n} \int_0^{Y'_n} N_d(y)\, dy = N_d^{*'} \qquad (29)$$

Column 20, line 33, "$N_s$" should be --$N_a$--.

Column 21, line 23, "break-down" should be --breakdown--.

Column 21, line 50, "break-down" should be --breakdown--.

Column 21, line 51, "break down" should be --breakdown--.

Column 21, line 62, "break-down" should be --breakdown--.

Column 21, line 63, "Diffusion" should be --diffusion--.

Column 22, line 36, "FIG." should be --FIGS.--.

Column 22, line 63, after "lowest" insert --is--.

UNITED STATES PATENT AND TRADEMARK OFFICE
CERTIFICATE OF CORRECTION

PATENT NO. : 5,151,759

DATED : September 29, 1992

INVENTOR(S) : Vinal

It is certified that error appears in the above-identified patent and that said Letters Patent is hereby corrected as shown below:

Column 22, line 67, "break-down" should be --breakdown--.

Column 23, line 46, "p++" should be --P++--.

Column 23, line 61, "N" should be --N^--.

Column 24, line 19, "KT/q ln(N /$N_d$)," should be --KT/q ln(N^/$N_d$),--.

Column 24, line 50, "and -substrate" should be --and substrate--.

Column 24, line 51, "diffusion substrate" should be --diffusion - substrate--.

Column 24, line 64, after "contact" insert --,--.

Column 26, line 11, "Ohmio" should be --Ohmic--.

Column 26, line 21, "Equation" should be --Equations--.

Column 27, line 43, after "devices" insert --.--.

Column 28, line 1, delete "MS".

Column 28, line 2, after "gate" insert --.--.

Column 28, line 23, after "gates" insert --.--.

UNITED STATES PATENT AND TRADEMARK OFFICE
CERTIFICATE OF CORRECTION

PATENT NO. : 5,151,759
DATED : September 29, 1992
INVENTOR(S) : Vinal

It is certified that error appears in the above-identified patent and that said Letters Patent is hereby corrected as shown below:

Column 28, line 59, delete Equation (52)

$$V_{td} = \phi_s \left[ 1 - \frac{G_i}{\alpha+1} \right] - \frac{G_i}{C_i} \sqrt{2qNaE_s \left( \frac{a}{\alpha+1} \right) \phi_s} \quad (52)$$

and insert Equation (52) as follows:

$$V_{td} = \phi_s \left[ 1 - \frac{G_i}{\alpha+1} \right] - \frac{G_i}{C_i} \sqrt{2qNae_s \left( \frac{a}{\alpha+1} \right) \phi_s} \quad (52)$$

Column 30, line 15, after "15" insert --.--.

Column 31, line 13, "THus" should be --Thus--.

Column 31, line 30, "$N_p^* = n_d$" should be --$N_p^* = N_d$--.

Column 31, line 45, "and or" should be --and/or--.

Column 31, line 69, Equation (69)

$$L^* = L - (S_{d[} + S_s), \quad (69)$$

UNITED STATES PATENT AND TRADEMARK OFFICE
CERTIFICATE OF CORRECTION

PATENT NO. : 5,151,759

DATED : September 29, 1992

INVENTOR(S) : Vinal

It is certified that error appears in the above-identified patent and that said Letters Patent is hereby corrected as shown below:

and insert Equation (69) as follows:

$$L^* = L - (S_d + S_s), \qquad (69)$$

Column 32, line 9, "THus" should be --Thus--.

Column 33, line 50, after "of" insert --the source, drain and rail regions should be less than--.

Column 33, line 68, "41" should be --40--.

Column 34, line 18, "N'+" should be --N++--.

Column 36, line 14, "B" should be --D--.

Column 37, line 47, "convention al" should be --conventional--.

Column 41, line 31, "1.3 x $10^{-23}$" should be --1.38 x $10^{-23}$--.

Column 42, line 25, "V," should be --$V_t$--.

UNITED STATES PATENT AND TRADEMARK OFFICE
CERTIFICATE OF CORRECTION

PATENT NO. : 5,151,759

DATED : September 29, 1992

INVENTOR(S) : Vinal

It is certified that error appears in the above-identified patent and that said Letters Patent is hereby corrected as shown below:

Column 42, line 65, "ad" should be --and--.

Signed and Sealed this

Sixteenth Day of November, 1993

Attest:

BRUCE LEHMAN

*Attesting Officer*     Commissioner of Patents and Trademarks